(12) United States Patent
Chacon et al.

(10) Patent No.: US 10,197,259 B2
(45) Date of Patent: Feb. 5, 2019

(54) STANDALONE CAPACITANCE SENSOR FOR FURNITURE

(71) Applicant: L&P Property Management Company, South Gate, CA (US)

(72) Inventors: Ryan Edward Chacon, Carthage, MO (US); Avinash Madadi, Carl Junction, MO (US); William Robert Rohr, Joplin, MO (US); Jason B. Turner, Joplin, MO (US); Caleb Browning, Carthage, MO (US)

(73) Assignee: L&P Property Management Company, South Gate, CA (US)

( * ) Notice: Subject to any disclaimer, the term of this patent is extended or adjusted under 35 U.S.C. 154(b) by 313 days.

(21) Appl. No.: 14/955,859

(22) Filed: Dec. 1, 2015

(65) Prior Publication Data

US 2016/0084487 A1     Mar. 24, 2016

Related U.S. Application Data

(63) Continuation-in-part of application No. 14/810,355, filed on Jul. 27, 2015, now Pat. No. 10,048,662.
(Continued)

(51) Int. Cl.
*F21V 23/04* (2006.01)
*H05B 37/02* (2006.01)
(Continued)

(52) U.S. Cl.
CPC ........ *F21V 23/0485* (2013.01); *A47C 20/041* (2013.01); *A47C 21/00* (2013.01);
(Continued)

(58) Field of Classification Search
CPC ... F21V 23/0485; H03K 17/955; G01V 3/088
See application file for complete search history.

(56) References Cited

U.S. PATENT DOCUMENTS 3,372,319 A    3/1968  Rhodes
3,971,371 A    7/1976  Bloom
(Continued)

FOREIGN PATENT DOCUMENTS

DE    102007018694 A1    11/2008
EP        1275328 A1      1/2003
(Continued)

OTHER PUBLICATIONS

Ex Parte Quayle Office Action dated May 26, 2016 in U.S. Appl. No. 13/749,120, 7 pages.
(Continued)

*Primary Examiner* — Laura Menz
(74) *Attorney, Agent, or Firm* — Shook, Hardy & Bacon L.L.P.

(57) ABSTRACT

A system and method for incorporating occupancy-detecting technology into furniture is provided. More particularly, the invention relates to detecting occupancy by a standalone capacitance detection device. The standalone capacitance detection device is configured for integration with any number of furniture items. Further, the detected capacitance may be used to determine commands for controlling a variety of devices associated with the standalone capacitance detection device. Additionally, methods for determining occupancy of a furniture item and a system for monitoring occupancy are described herein.

17 Claims, 28 Drawing Sheets

Related U.S. Application Data which is a continuation-in-part of application No. 13/854,720, filed on Apr. 1, 2013, now Pat. No. 9,089,223, which is a continuation-in-part of application No. 13/346,386, filed on Jan. 9, 2012, now Pat. No. 9,337,831.

(51) Int. Cl.
| | |
|---|---|
| *F21V 33/00* | (2006.01) |
| *A47C 20/04* | (2006.01) |
| *A47C 21/00* | (2006.01) |
| *G01V 3/08* | (2006.01) |
| *H03K 17/955* | (2006.01) |
| *F21W 131/301* | (2006.01) |
| *H03K 17/96* | (2006.01) |

(52) U.S. Cl.
CPC .......... *F21V 33/0012* (2013.01); *G01V 3/088* (2013.01); *H03K 17/955* (2013.01); *H05B 37/0227* (2013.01); *F21W 2131/301* (2013.01); *H03K 2017/9602* (2013.01); *H03K 2217/96078* (2013.01)

(56) References Cited

U.S. PATENT DOCUMENTS

| | | | |
|---|---|---|---|
| 3,991,746 A | 11/1976 | Hanna et al. | |
| 5,235,319 A | 8/1993 | Hill et al. | |
| 5,260,666 A | 11/1993 | Dishman et al. | |
| 5,481,769 A | 1/1996 | Schneider et al. | |
| 6,025,782 A | 2/2000 | Newham | |
| 6,067,019 A | 5/2000 | Scott | |
| 6,283,504 B1 | 9/2001 | Stanley et al. | |
| 6,297,738 B1* | 10/2001 | Newham | A61B 5/1115 128/886 |
| 6,768,420 B2 | 7/2004 | McCarthy et al. | |
| 6,946,853 B2 | 9/2005 | Gifford et al. | |
| 7,135,983 B2* | 11/2006 | Filippov | B60N 2/002 340/667 |
| 7,190,277 B2 | 3/2007 | Fultz et al. | |
| 8,143,567 B2* | 3/2012 | Williams | G01J 1/04 250/214 AL |
| 8,344,665 B2* | 1/2013 | Verfuerth | H05B 37/0272 315/315 |
| 8,397,324 B2 | 3/2013 | Hayes et al. | |
| 8,427,450 B2 | 4/2013 | Lin | |
| 8,461,510 B2* | 6/2013 | Williams | G01J 1/04 250/214 AL |
| 8,796,610 B2* | 8/2014 | Williams | G01J 1/04 250/214 AL |
| 8,957,689 B2 | 2/2015 | Virnich et al. | |
| 9,089,223 B2* | 7/2015 | Chacon | G01V 3/088 |
| 9,131,783 B2* | 9/2015 | Chacon | A47C 7/72 |
| 9,337,831 B2 | 5/2016 | Rohr et al. | |
| 9,351,381 B2* | 5/2016 | Verfuerth | H05B 37/0272 |
| 9,482,707 B2* | 11/2016 | Chacon | G01R 27/2605 |
| 9,488,746 B2* | 11/2016 | Chacon | G01R 27/2605 |
| 9,504,133 B2* | 11/2016 | Verfuerth | H05B 37/0272 |
| 9,615,433 B1* | 4/2017 | O'Neil | H05B 37/0227 |
| 10,048,662 B2* | 8/2018 | Chacon | A47C 21/00 |
| 2002/0070866 A1* | 6/2002 | Newham | A61B 5/1115 340/573.1 |
| 2003/0011225 A1 | 1/2003 | Barcesat | |
| 2003/0222588 A1* | 12/2003 | Myron | H05B 37/0227 315/159 |
| 2005/0088264 A1 | 4/2005 | Iwasaki | |
| 2005/0231379 A1 | 10/2005 | Sprecher et al. | |
| 2005/0236906 A1* | 10/2005 | Morgan | H03K 17/941 307/117 |
| 2006/0164254 A1 | 7/2006 | Kamizono et al. | |
| 2006/0196281 A1 | 9/2006 | Koors | |
| 2006/0261769 A1 | 11/2006 | Rees | |
| 2007/0040676 A1 | 2/2007 | Bandringa et al. | |
| 2008/0071200 A1 | 3/2008 | Rawls-Meehan | |
| 2008/0146359 A1 | 6/2008 | Godiska | |
| 2008/0186034 A1 | 8/2008 | Scheckenbach et al. | |
| 2008/0262657 A1* | 10/2008 | Howell | A47C 20/041 700/275 |
| 2009/0072604 A1 | 3/2009 | Browne et al. | |
| 2009/0119841 A1 | 5/2009 | Takashima | |
| 2009/0211818 A1 | 8/2009 | Kondo et al. | |
| 2009/0243517 A1* | 10/2009 | Verfuerth | H05B 37/0272 315/315 |
| 2010/0039269 A1* | 2/2010 | Newham | A61B 5/1115 340/573.4 |
| 2010/0096899 A1 | 4/2010 | Kato et al. | |
| 2010/0294915 A1* | 11/2010 | Williams | G01J 1/04 250/206.1 |
| 2011/0068928 A1 | 3/2011 | Riley et al. | |
| 2011/0083271 A1 | 4/2011 | Bhai | |
| 2011/0209287 A1 | 9/2011 | Call et al. | |
| 2011/0221459 A1 | 9/2011 | Uno et al. | |
| 2011/0279276 A1* | 11/2011 | Newham | A61B 5/1115 340/573.4 |
| 2012/0025991 A1 | 2/2012 | O'Keefe et al. | |
| 2012/0151678 A1 | 6/2012 | Richards | |
| 2012/0169242 A1* | 7/2012 | Olson | H05B 37/0227 315/159 |
| 2012/0200524 A1 | 8/2012 | Vallis et al. | |
| 2012/0211296 A1 | 8/2012 | Morishita et al. | |
| 2012/0313588 A1* | 12/2012 | Carberry | H05B 37/0227 320/134 |
| 2013/0033183 A1* | 2/2013 | Verfuerth | H05B 37/0272 315/154 |
| 2013/0106164 A1* | 5/2013 | Chacon | A47C 31/008 297/463.1 |
| 2013/0131882 A1* | 5/2013 | Verfuerth | H05B 37/0272 700/295 |
| 2013/0174343 A1 | 7/2013 | Chacon et al. | |
| 2013/0176040 A1 | 7/2013 | Rohr et al. | |
| 2013/0247302 A1 | 9/2013 | Chacon et al. | |
| 2013/0271011 A1* | 10/2013 | Williams | G01J 1/04 315/151 |
| 2014/0246892 A1* | 9/2014 | Samain | B60N 2/66 297/463.1 |
| 2014/0302795 A1* | 10/2014 | Chacon | G08C 17/02 455/41.3 |
| 2015/0327687 A1* | 11/2015 | Chacon | A47C 21/00 700/275 |
| 2016/0084487 A1* | 3/2016 | Chacon | A47C 20/041 315/297 |
| 2016/0312986 A1* | 10/2016 | Maros | H05B 37/0254 |
| 2016/0345746 A1* | 12/2016 | Myers | A47C 31/123 |
| 2017/0042340 A1* | 2/2017 | Chacon | A61G 5/14 |
| 2017/0071050 A1* | 3/2017 | Potts | H05B 37/0272 |
| 2017/0253330 A1* | 9/2017 | Saigh | B64C 39/024 |

FOREIGN PATENT DOCUMENTS

| | | |
|---|---|---|
| GB | 2368176 A | 4/2002 |
| GB | 2401974 A | 11/2004 |
| SE | 519289 C2 | 2/2003 |
| WO | 9944179 A1 | 9/1999 |
| WO | 2002011585 A1 | 2/2002 |
| WO | 2016123339 A1 | 8/2016 |

OTHER PUBLICATIONS

Final Office Action dated May 31, 2016 in U.S. Appl. No. 14/608,170, 14 pages.
Notice of Allowance dated Jun. 15, 2016 in U.S. Appl. No. 4/608,173, 9 pages.
International Search Report with Written Opinion dated Jun. 10, 2016 in PCT Application No. PCT/US2016/015358, 14 pages.
Notice of Allowance dated Jul. 21, 2016 in U.S. Appl. No. 14/608,170, 5 pages.
European Search Report dated Aug. 9, 2016 in Application No. 14743295.9, 7 pages.

(56) References Cited

OTHER PUBLICATIONS

Notice of Allowance dated Aug. 12, 2016 in U.S. Appl. No. 13/749,120, 8 pages.
European Search Report dated Oct. 14, 2016 in European Patent Application No. 14779641.1, 8 pages.
International Search Report with Written Opinion dated Oct. 19, 2016 in PCT Application No. PCT/US2016/42900, 11 pages.
International Preliminary Report on Patentability dated Aug. 10, 2017 in Application PCT/US2016/015358, 8 pages.
Non-Final Office Action dated Sep. 1, 2017 in U.S. Appl. No. 15/018,862, 11 pages.
Non-Final Office Action dated Sep. 13, 2017 in U.S. Appl. No. 15/149,684, 19 pages.
Non-Final Office Action dated Sep. 21, 2017 in U.S. Appl. No. 14/810,355, 11 pages.
International Search Report with Written Opinion dated Apr. 3, 2017 in PCT Application No. PCT/US2017/12949, 10 pages.
Non-Final Office Action dated Jan. 14, 2016 in U.S. Appl. No. 14/608,170, 13 pages.
Notice of Allowance dated Jan. 8, 2016 in U.S. Appl. No. 13/346,386, 10 pages.
Final Office Action dated Mar. 21, 2018 in U.S. Appl. No. 15/018,862, 15 pages.
Final Office Action dated Mar. 1, 2018 in U.S. Appl. No. 15/149,684, 18 pages.
Notice of Allowance dated Apr. 11, 2018 in U.S. Appl. No. 14/810,355, 5 pages.
International Preliminary Report on Patentability dated Feb. 8, 2018 in Application No. PCT/US2016/042900, 6 pages.
Office Action dated Feb. 24, 2018 in Chinese Patent Application No. 201480019546X, 4 pages. English translation attached, 5 pages.
Liyang, X. Capacitance sensor. (Sep. 2012). In Fundamentals of Electric and Electronic Engineering. pp. 274-277. China Machine Press. Chinese Language Excerpt Only.
Search Report and Written Opinion dated Mar. 26, 2018 in European Patent Application No. 1719864.7, 7 pages.
Non-Final Office Action dated Aug. 31, 2018 in U.S. Appl. No. 15/149,684, 13 pages.
Notice of Allowance dated Sep. 18, 2018 in U.S. Appl. No. 15/018,862, 9 pages.
Extended Search Report and Written Opinion dated Jul. 26, 2018 in European Patent Application No. 16744103.9, 7 pages.
International Preliminary Report on Patentability dated Aug. 23, 2018 in International Patent Application No. PCT/US2017/012949, 8 pages.
Non-Final Office Action dated Oct. 25, 2018 in U.S. Appl. No. 15/339,927, 8 pages.

\* cited by examiner

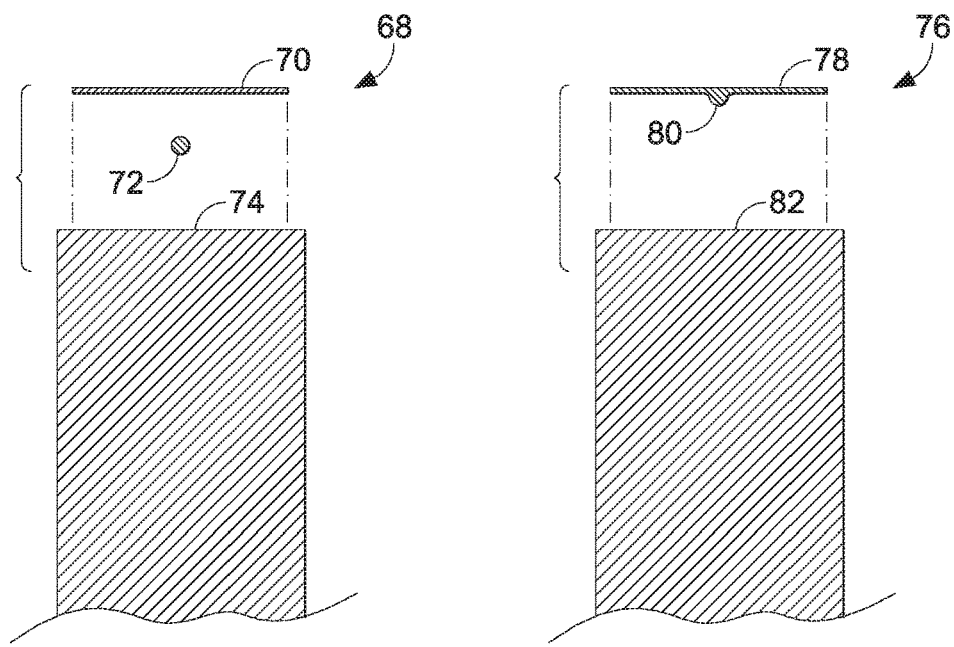
FIG. 11.
FIG. 12.
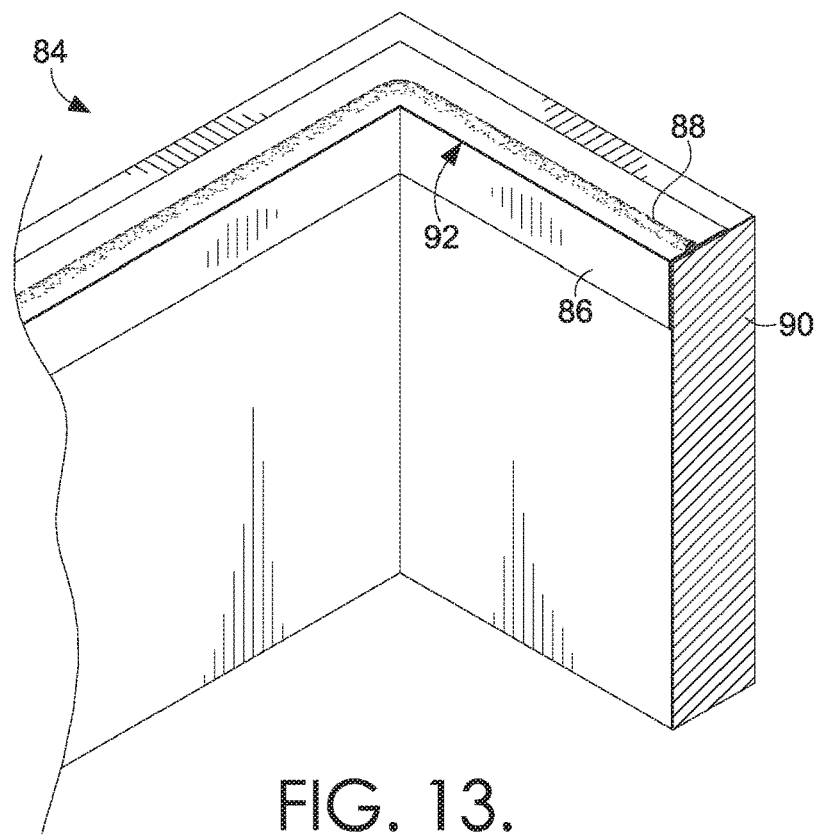
FIG. 13.

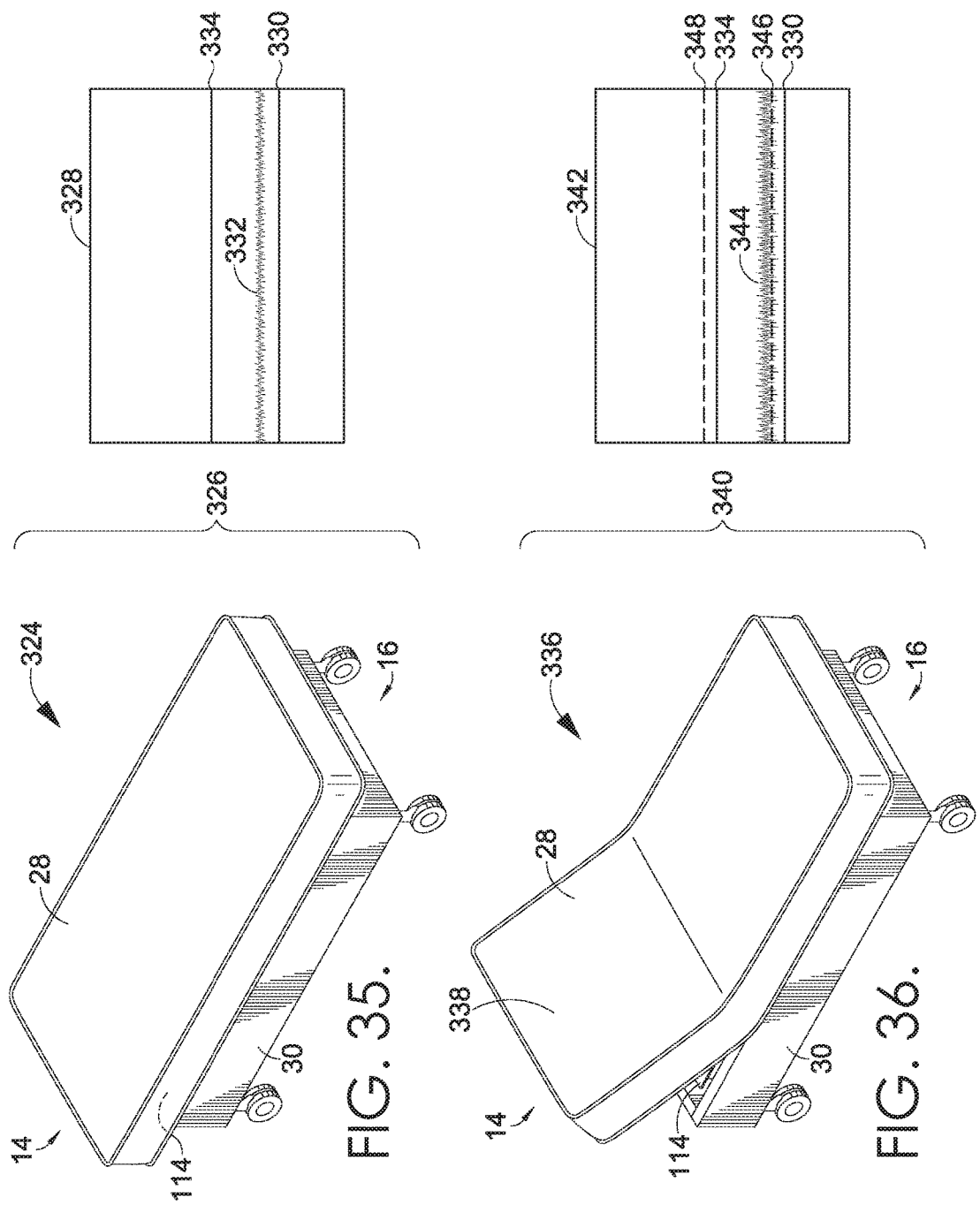

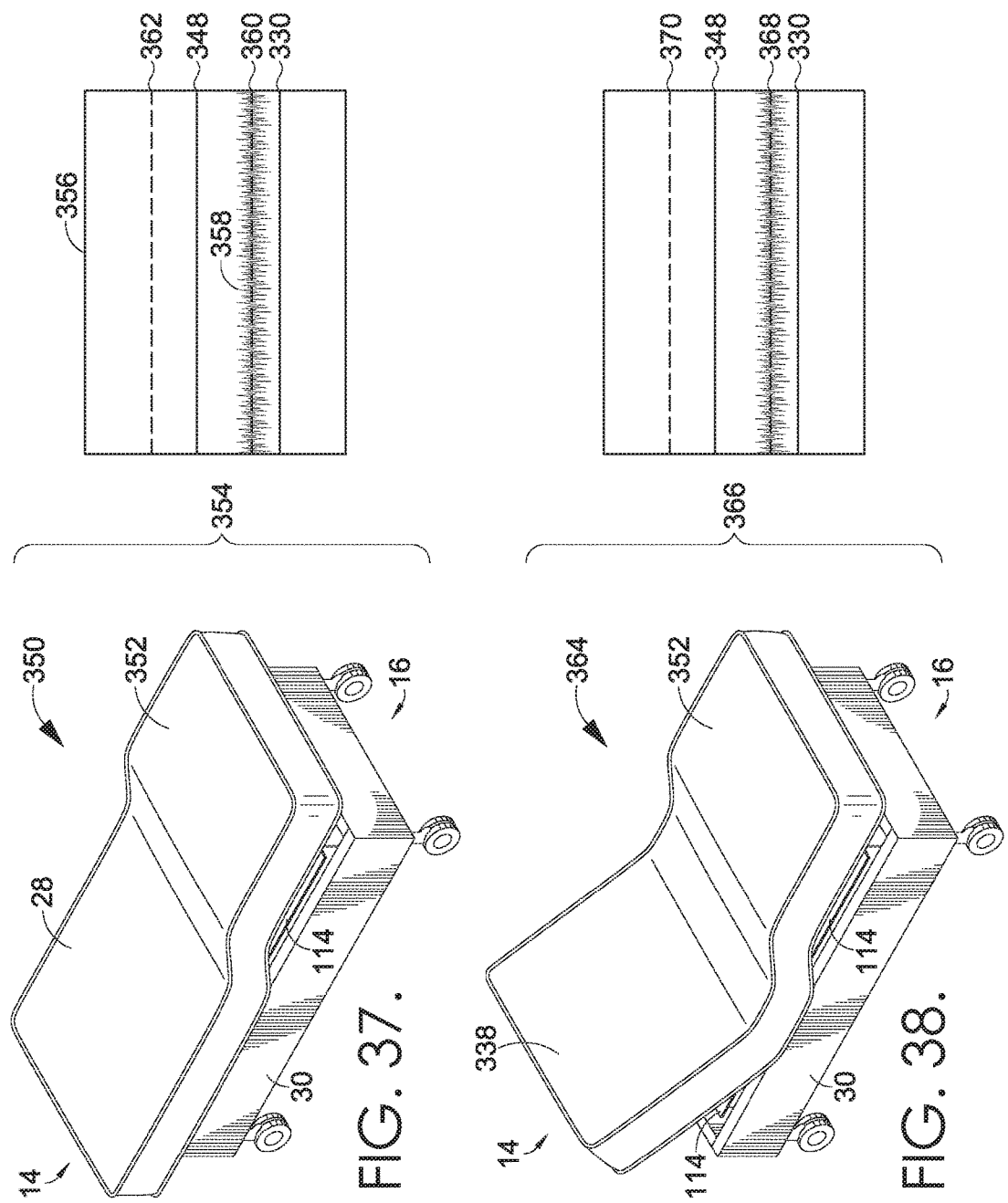

STANDALONE CAPACITANCE SENSOR FOR FURNITURE

CROSS-REFERENCE TO RELATED APPLICATIONS

This application is a continuation-in-part of U.S. Nonprovisional patent application Ser. No. 14/810,355, filed Jul. 27, 2015, entitled "Characterization and Calibration for Automated Furniture," which is a continuation-in-part of U.S. Nonprovisional patent application Ser. No. 13/854,720, filed Apr. 1, 2013, entitled "Occupancy Detection for Furniture," now U.S. Pat. No. 9,089,223 (issued Jul. 28, 2015), which is a continuation-in-part of U.S. Nonprovisional patent application Ser. No. 13/749,120, filed Jan. 24, 2013, entitled "Capacitive Wire Sensing for Furniture," which is a continuation-in-part of U.S. Nonprovisional patent application Ser. No. 13/346,386, filed Jan. 9, 2012, entitled "Capacitive Wire Sensing for Furniture," the entire contents of each of which are hereby incorporated by reference.

STATEMENT REGARDING FEDERALLY SPONSORED RESEARCH OR DEVELOPMENT

Not applicable.

TECHNICAL FIELD

The present invention generally relates to occupancy-detecting technology incorporated into furniture. More particularly, the invention relates to a standalone capacitance detection device, a method for detecting occupancy, and a system for monitoring occupancy.

BACKGROUND OF THE INVENTION

Some prior occupancy detection and automatic lighting solutions have used passive infrared sensors to detect motion. However, any motion within the room or near the furniture can activate such sensors, thereby falsely indicating occupancy. For example, a dropped pillow, or an arm dangling off the bed, can trigger a false indication of presence and/or cause a light to turn on in response to detection. Further, pets moving about the space may also cause similar problems. Additionally, a lack of motion within the room can cause prior systems to indicate a lack of occupancy in a room, when in fact, the room is occupied.

BRIEF SUMMARY OF THE INVENTION

The present invention generally relates to a system and method for occupancy detection in a variety of furniture environments. It should be understood that the invention contemplates incorporating a standalone capacitance detection device and/or system into a variety of furniture items, both bedding and otherwise, and that the invention is not limited to the specific item for which occupancy detection is provided.

In one embodiment, a standalone capacitance detection device is provided. The standalone capacitance detection device may include a capacitance detection sensor for detecting and/or sensing capacitance measurements and a control component for generating and communicating various commands. In some aspects, the standalone capacitance detection device may additionally include one or more light sources and/or a manual control device. The control component may, for example, operate to generate commands based on the detected capacitance, which may cause the one or more light sources to change lighting states.

Another exemplary embodiments of the invention relates to a method for determining occupancy of a furniture item based on capacitive detection. The method may include receiving, by a standalone capacitance detection device, a first indication of an occupancy state, wherein the first indication of an occupancy state corresponds to a first change in capacitance detected by the standalone capacitance detection device. The method may also include receiving, by the standalone capacitance detection device, a second indication of an occupancy state, wherein the second indication of an occupancy state corresponds to a second change in capacitance detected by the standalone capacitance detection device. Further, the method may include communicating, by the standalone capacitance detection device, the second indication of an occupancy state. The communicated occupancy state may be used, for example, to change a lighting state of one or more light sources associated with the standalone capacitance detection device.

In another illustrative aspect, an occupancy monitoring system for monitoring use and/or occupancy of furniture items based on capacitance detection is provided. The system may include, for example, a standalone capacitance detection device coupled to a furniture item and an occupancy monitoring service. The system may generally operate to detect frequency and/or duration of use of a furniture item in any number of settings. For example, the system may be implemented by a hotel, a hospital, or an individual consumer to monitor how and when various furniture items are used.

Additional objects, advantages, and novel features of the invention will be set forth in part in the description which follows, and in part will become apparent to those skilled in the art upon examination of the following, or may be learned by practice of the invention.

BRIEF DESCRIPTION OF SEVERAL VIEWS OF THE DRAWING

The present invention is described in detail below with reference to the attached drawing figures, wherein:

FIG. 11 is a side view of foil tape and capacitive wire for application to a substrate, in accordance with embodiments of the invention;

FIG. 12 is a side view of foil tape having an embedded capacitive wire for application to a substrate; in accordance with embodiments of the invention;

FIG. 13 is a perspective view of a foil tape having an embedded capacitive wire, applied to an edge of a substrate, in accordance with embodiments of the invention;

FIG. 35 is a perspective view of a position profile characterization for an automated furniture item in a first position, in accordance with embodiments of the invention;

FIG. 36 is a perspective view of a position profile characterization for an automated furniture item in a second position, in accordance with embodiments of the invention;

FIG. 37 is a perspective view of a position profile characterization for an automated furniture item in a third position, in accordance with embodiments of the invention;

FIG. 38 is a perspective view of a position profile characterization for an automated furniture item in a fourth position, in accordance with embodiments of the invention;

DETAILED DESCRIPTION OF THE INVENTION

Figure 1:
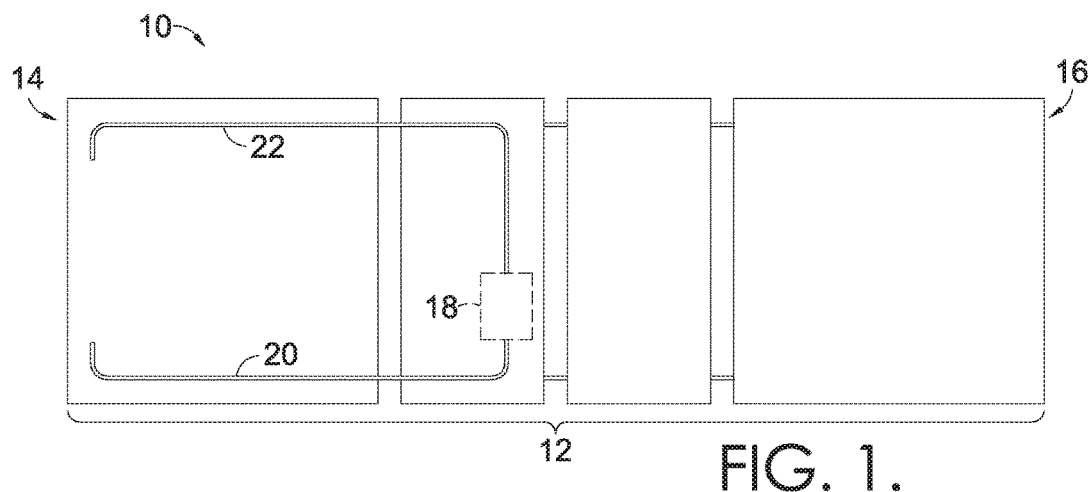
FIG. 1 is a top view of a capacitive wire coupled to the panels of an automated bed platform, in accordance with embodiments of the invention.

An embodiment of an automated bedding system 10 with capacitive wire sensing is seen in FIGS. 1-6. Referring first to FIG. 1, a top view of the platform of the automated bedding system 10 includes a plurality of panels 12 having a first end 14 and a second end 16, a control enclosure 18 (mounted below the panels 12), a first segment 20 of a capacitive wire, and a second segment 22 of a capacitive wire. In some embodiments, the first end 14 may be referred to as the "head" of the bed, while the second end 16 may be referred to as the "foot" of the bed.

When viewed from the top in FIG. 1, capacitive wiring is generally arranged near the first end 14 of the automated bedding system 10. A capacitive component, such as a capacitive wire, is adapted to have a voltage based on proximity of an object to the capacitive component. In some embodiments, the capacitive wire segments are standard conductive copper wires. The capacitance measured across such wires may be monitored by a processor that uses software to generate a determination of presence detection. In one embodiment, the Microchip® brand capacitive sensor may be used to determine when presence is detected. As such, while presence detection relies on the juxtaposition of a person or body with respect to the capacitive wiring, a determination of the level of detection or the measurement of presence is conducted digitally, in software associated with the processor.

As shown in FIG. 1, the capacitive wiring first and second segments 20 and 22 are coupled to the control enclosure 18, which is mounted below the panels 12 of the bedding system 10. In some embodiments, first and second segments 20 and 22 are made from a single capacitive wire, while in other embodiments, two separate capacitive wire segments 20 and 22 are coupled to the control enclosure 18. As will be understood, additional capacitive components, such as capacitive wire segments, may be coupled to the control enclosure 18, and arranged on the top of the plurality of panels 12. For example, additional capacitive wires arranged perpendicular to each other may be coupled to the control enclosure 18. In further embodiments, first and second segments 20 and 22 are made from a capacitive material other than wire.

Capacitive wire segments 20 and 22 may be used to detect presence or absence of a person or other being on top of the automated bedding system 10. For example, as arranged near first end 14 of the automated bedding system 10, the torso of a person positioned on the top of the automated bedding system 10 may be detected by capacitive wire segments 20 and 22. In embodiments, capacitive wire segments 20 and 22 create a defined sensing area on the top half of the head of the bedding system 10, and are less susceptible to noise interference from articulation of the rest of the automated bedding system 10.

Figure 2:
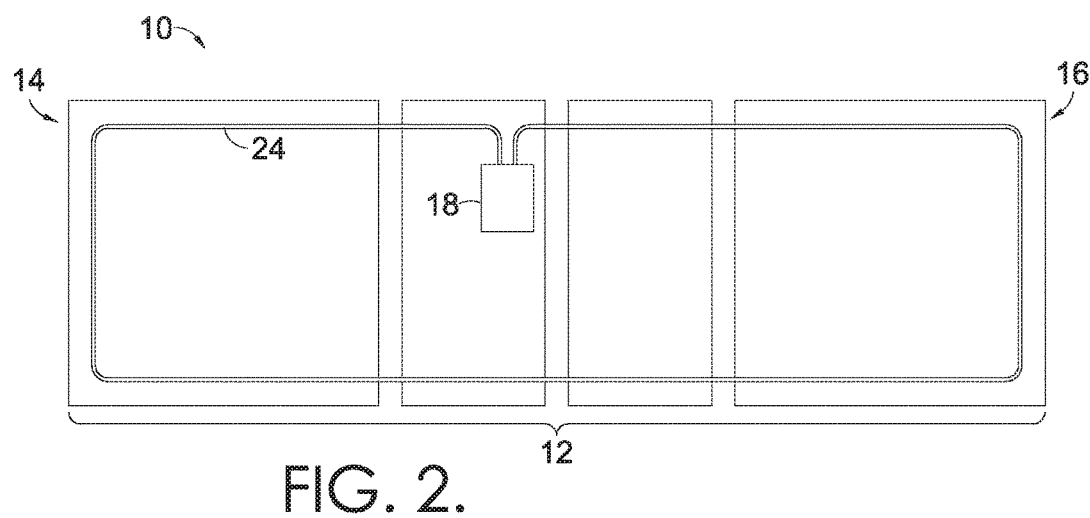
FIG. 2 is a bottom view of the automated bed platform of FIG. 1, with a capacitive wire and a control enclosure coupled to the panels, in accordance with embodiments of the invention.

Referring next to FIG. 2, a bottom view of the platform of the automated bedding system 10 includes the plurality of panels 12 having a first end 14 and a second end 16, a control enclosure 18, and a third segment 24 of capacitive wire. As shown in FIG. 2, the capacitive wiring third segment 24 is coupled to the control enclosure 18, which is mounted below the panels 12. In further embodiments, the control enclosure may be mounted in a different location on the bedding system 10, or may be external to the bedding system 10.

In some embodiments, third segment 24 is made from a single capacitive wire, while in other embodiments, multiple capacitive wire segments are coupled to the control enclosure 18. As will be understood, additional capacitive components, such as capacitive wire segments, may be coupled to the control enclosure 18, and arranged on the bottom of the plurality of panels 12. For example, additional capacitive wires arranged perpendicular to each other may be coupled to the control enclosure 18. In further embodiments, third segment 24 is made from a capacitive material other than wire.

Capacitive wire segment 24 may be used to detect presence or absence of a person or other being below the automated bedding system 10. For example, as arranged around the perimeter of the bed at both the first and second ends 14 and 16, a person or other body underneath the automated bedding system 10 may be detected by capacitive wire segment 24. In embodiments, based on detecting presence underneath the bedding system 10, bed articulation may be stopped. As viewed from the side in FIG. 3, the first and second segments 20 and 22 (hidden from view) create a defined sensing area on the top of the platform, near the first end 14, while the third segment 24 creates a defined sensing area on the bottom of the platform of the bedding system 10.

Figure 3:
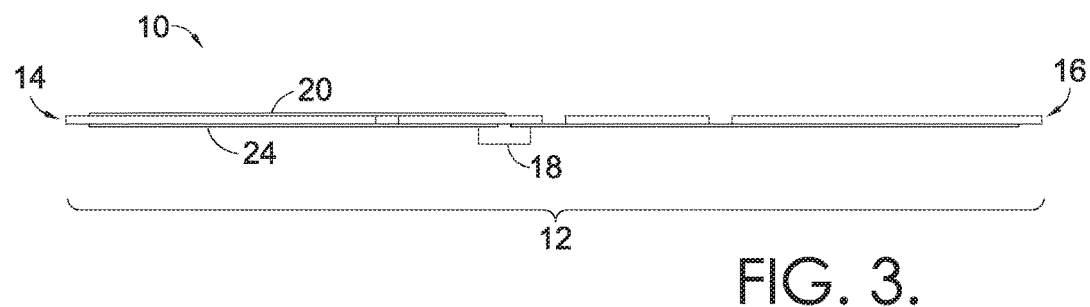
FIG. 3 is a side view of the automated bed platform of FIG. 1, with a capacitive wire coupled to the top and bottom of the platform, and the control enclosure coupled to the bottom of the platform, in accordance with embodiments of the invention.
Figure 4:
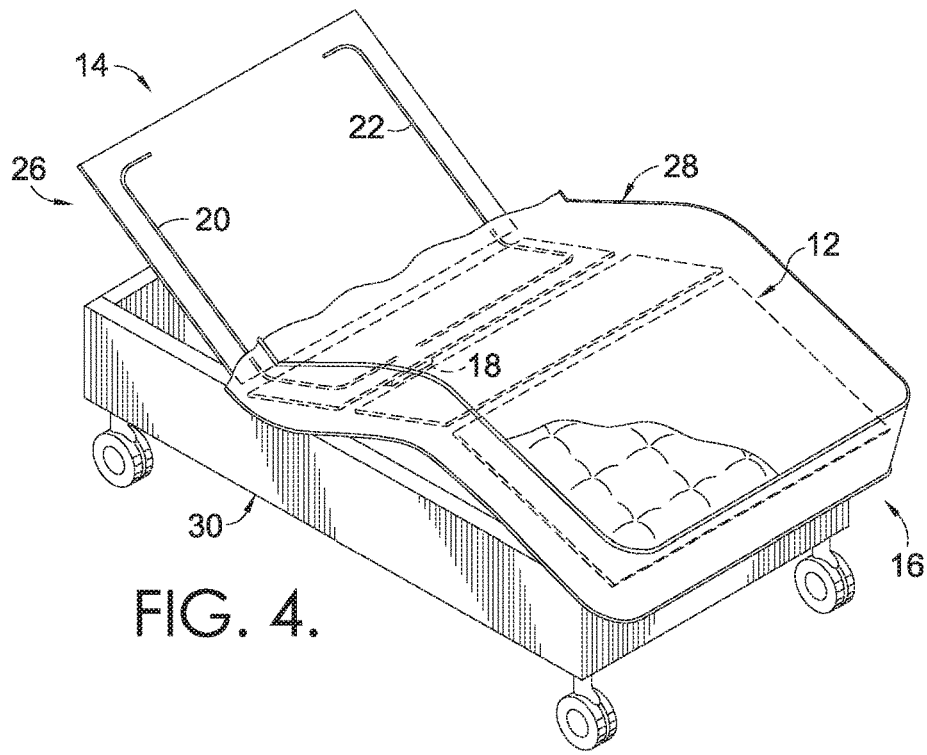
FIG. 4 is a perspective view of an automated bed with a portion of the mattress cut away to reveal the capacitive wire coupled to the top of the platform, in accordance with embodiments of the invention.

Referring next to FIG. 4, an adjustable bed 26 incorporates the automated bedding system 10 described with respect to FIGS. 1-3. The adjustable bed 26 includes a mattress 28 and a frame 30. A top portion of the mattress is cut away to reveal the first end 14 of the automated bedding system 10 platform, with the head of the bed partially raised. As described with reference to FIG. 1, capacitive wire segments 20 and 22 provide a defined sensing area near the first end 14, which detects a change in capacitance above the bed, such as the capacitance detected from a person resting on the bed.

Figure 5:
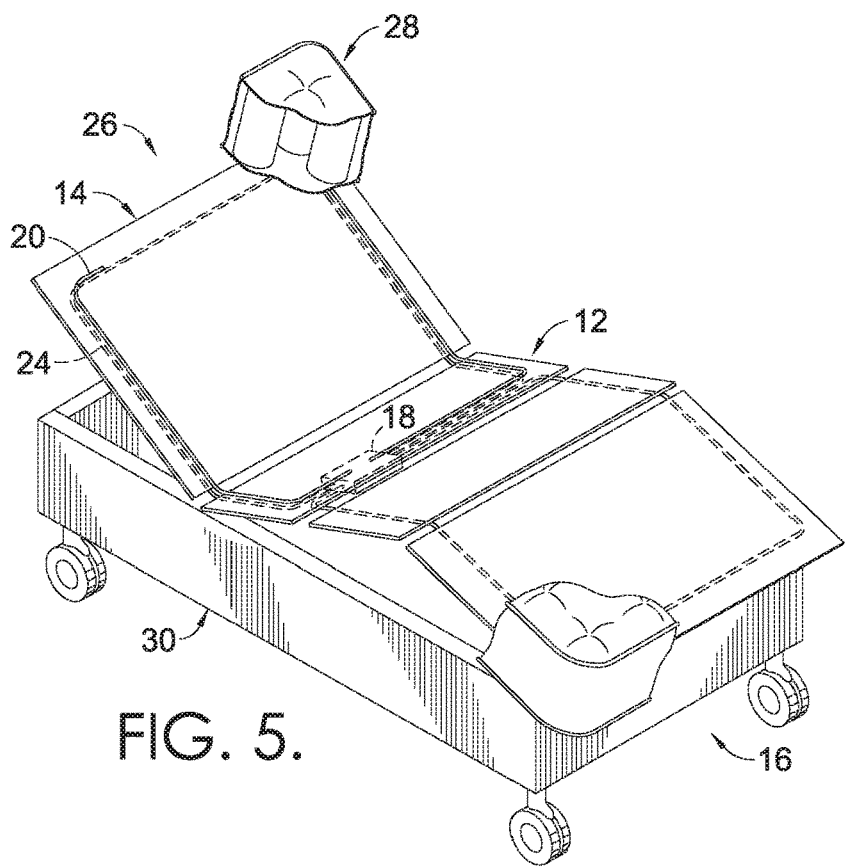
FIG. 5 is a perspective view of the automated bed of FIG. 4, with the mattress cut away to reveal the capacitive wire coupled to the top of the platform, and hidden lines indicating the capacitive wire and control enclosure coupled to the bottom of the platform, in accordance with embodiments of the invention.
Figure 6:
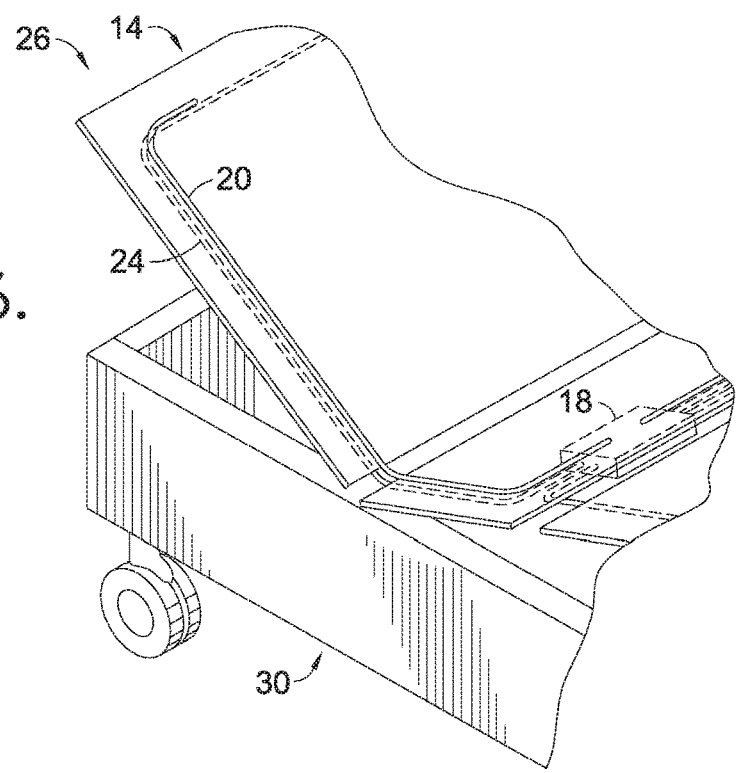
FIG. 6 is an enlarged, perspective view of the automated bed of FIG. 5, with a capacitive wire coupled to the top of the platform and hidden lines indicating the capacitive wire and control enclosure coupled to the bottom of the platform, in accordance with embodiments of the invention.

FIG. 5 depicts the adjustable bed 26 from FIG. 4, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 5 is shown in FIG. 6, with hidden lines depicting capacitive wires 20 and 24 coupled to the control enclosure 18, which is mounted beneath the panels 12.

In some embodiments, in alternative or in addition to positioning of capacitive wiring around the perimeter of the panels 12 that support an adjustable mattress, conductive wire is attached around the perimeter of the mattress itself. As shown in the adjustable bed 32 of FIG. 7, conductive wire may be incorporated into the tape edge surrounding the mattress 28. As such, the attached conductive wire may work as a sensor to detect presence of a person or other body near the perimeter of the mattress 28. For example, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection.

The capacitive wire may be routed through some or all of the tape edge around the perimeter of a mattress 28. Additionally, a tape edge may be applied to both the top and bottom edges of the mattress 28, and both the top and bottom tape edges 34 and 36 may include a capacitive wire. Accordingly, the sensitivity of the capacitive wire in the top tape edge 34 may be adjusted independently from the tape edge 36 surrounding the perimeter of the bottom of the mattress. For example, a small change in voltage detected by the capacitive wires in the top tape edge 34 of the mattress may indicate that a user has moved on the surface of the mattress, but is still on the bed. By contrast, a small change in voltage detected by the capacitive wires in the bottom tape edge 36 of the mattress may indicate that a person, or other being, is below the bed. In either case, different features associated with the automated bedding system 10 may be activated based on whether presence is detected above the bed (via capacitive wires in the top tape edge 34) or below the bed (via capacitive wires in the bottom tape edge 36).

Figure 7:
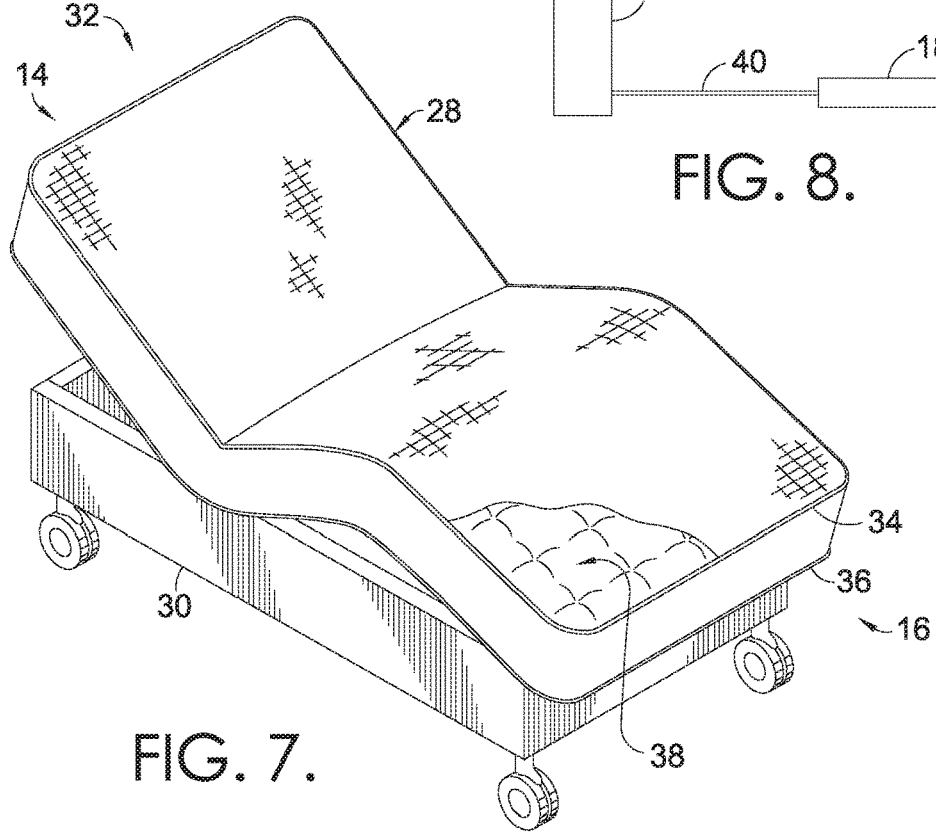
FIG. 7 is a perspective view of an automated bed with a capacitive wire incorporated into the tape edge of the mattress cover, in accordance with embodiments of the invention.

In further embodiments, a capacitive component may be incorporated into the mattress covering 38 of a mattress 28, as shown in FIG. 7. In particular, a capacitive thread may be sewn into the ticking on top of the mattress covering 38, as part of a sewn pattern. During manufacturing, a particular needle threaded with capacitive thread may be activated automatically and independently to incorporate the capacitive wire into a particular configuration on the surface of the mattress covering 38. For example, the capacitive thread may be sewn around a perimeter of the top surface of the mattress 28. In another example, the capacitive wire may be sewn in a pattern that creates perpendicular runs for capacitive detection. In one embodiment, capacitive thread sewn into the surface of a mattress covering 38 may terminate at a particular point and attach to a control enclosure 18. For example, an attachment may be used to crimp the mattress covering 38 material during sewing, to provide an attachment point for connecting the capacitive thread to a processor.

In some embodiments, a capacitive component may be incorporated into a platform-style bed. For example, a lower portion of a bed that does not articulate, such as a box spring or a mattress frame 30, may include a capacitive component that detects presence from above. In one embodiment, a capacitive wire is attached in a loop around the perimeter of the top of the frame 30, in FIG. 7. When a person or body is detected on top of the platform and/or frame 30, the articulating mattress 28 may discontinue lowering into contact with the frame 30. In one embodiment, a capacitive wire may be incorporated into the upholstery of a decorative surround (immovable frame). The sensitivity of the capacitive wire may be decreased so that direct contact is required with the edge of the surround before presence may be detected, in order to prevent false readings from a body approaching the frame and/or surround. In one embodiment, a decorative surround may include a conductive, metalized tape, such as an aluminum tape, that serves as a capacitive component for detecting presence with respect to the decorative surround. For example, a conductive metalized tape may be adhered to a perimeter of the decorative surround of an adjustable bed to determine presence near and/or on the bed, based on a change in capacitance detected by the metalized tape.

Figure 8:
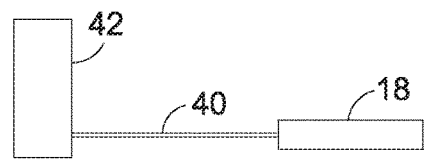
FIG. 8 is a side view of a capacitive wire coupled to a control enclosure and an inner spring of a mattress, in accordance with embodiments of the invention.

Presence may also be detected using a loop of capacitive wire incorporated inside a mattress. For example, as shown in FIG. 8, a fourth segment 40 of capacitive wire may be incorporated inside an inner spring 42, and coupled to the control enclosure 18. While only one inner spring 42 is shown, it should be understood that capacitive wire could be incorporated into one or more of the many innersprings that make up a traditional mattress. As such, the loop of capacitive wire can detect a person or object in proximity to the loop, such as a person on the mattress, above the loop of capacitive wire.

A defined sensing area is created by routing of a capacitive wire around a perimeter of a furniture item, in a variety of configurations such as those described above. For example, a capacitive wire routed around the perimeter of a mattress, such as in the tape edge around a perimeter of the top surface of a mattress, creates a defined sensing area on the area of the mattress surrounded by the sensing perimeter. As such, a person's presence within the sensing area may be detected by the capacitive wire, which a processor may use to determine when a person exits or enters a bed. A processor coupled to the capacitive component may be housed in a control enclosure, such as control enclosure 18. In one embodiment, the control enclosure 18 is mounted below the platform of an automated bedding system 10. In further embodiments, the control enclosure 18 is mounted generally beneath the mattress 28.

In embodiments, capacitive wire incorporated into the perimeter of a mattress is used to monitor a change in capacitance over a specified amount of time. The capacitive component (capacitive wire) is adapted to have a voltage based on proximity of an object to the capacitive component. Such voltage information is collected via the capacitive component and received by the processor, which determines when a change in voltage satisfies a threshold. Once a particular change in capacitance satisfies a threshold, a corresponding function associated with the automated bed may be initiated. In embodiments, a threshold for initiating a corresponding function includes a particular amount of change in voltage within a particular amount of time. For example, when using capacitance information to turn lights on/off, a particular amount of change in voltage may be required during a particular amount of time before satisfying the threshold indicating that a person has exited the bed (and before the lights may be turned on). Similarly, a particular threshold value of voltage change may be required by the processor, over a particular amount of time, before making a determination that a person has re-entered the bed (and before the lights can be turned off again). In embodiments, a processor continuously receives capacitance monitoring information, and monitors how quickly a change in capacitance occurs (how quickly the delta changes) to determine if a big enough change has occurred in a certain amount of time to satisfy a threshold, and trigger the corresponding function.

Based on satisfying a particular threshold, various features associated with the automated bedding system 10 may be activated and/or enabled. For example, an alarm clock may only be triggered if a person's presence is detected in the bed (i.e. if a threshold amount of change in voltage is detected during capacitance monitoring over a particular amount of time). In another example, additional bedding features may be activated based on presence detection by capacitive wires. Such additional integrated bedding features include having a massage motor activated to wake up a user. If a user is not present in the bed, and therefore not detected using the capacitive wires, the lack of presence detection will prevent the massage motor from running at a particular scheduled time.

A variety of other functions of the automated bedding system 10 may be controlled based on detection with a capacitive wire. In other words, a processor coupled to the capacitive wire may initiate a variety of functions based on received data indicating presence or lack of presence, as determined using capacitance information. Different functions may be controlled, such as stopping a bed from articulating when presence is detected beneath the bed, turning on/off lights based on a person exiting/entering a bed, and controlling other accessories or electrical/household appliances through internal circuitry associated with the processor. In one example, after presence is no longer detected in the bed (thereby indicating that a person has exited the bed) lights may be turned on. Additionally, when the person returns to the bed, the lights may turn off.

A variety of communication protocols may be used to control the variety of functions described above. For example, a two-way controller using ZigBee® wireless communication protocol may be used. In some embodiments, a two-way communication protocol intended for use in automation (similar to Bluetooth®) may be utilized. One embodiment of the invention may be controlled by an external sensor only, with all of the components necessary for the sensor that plug into an existing motor. In another embodiment, two separate microcontrollers may be used: one dedicated primarily for sensing purposes that, when it detects something, sends a signal to a secondary device/microcontroller that is programmed to initiate the corresponding response.

Figure 9:
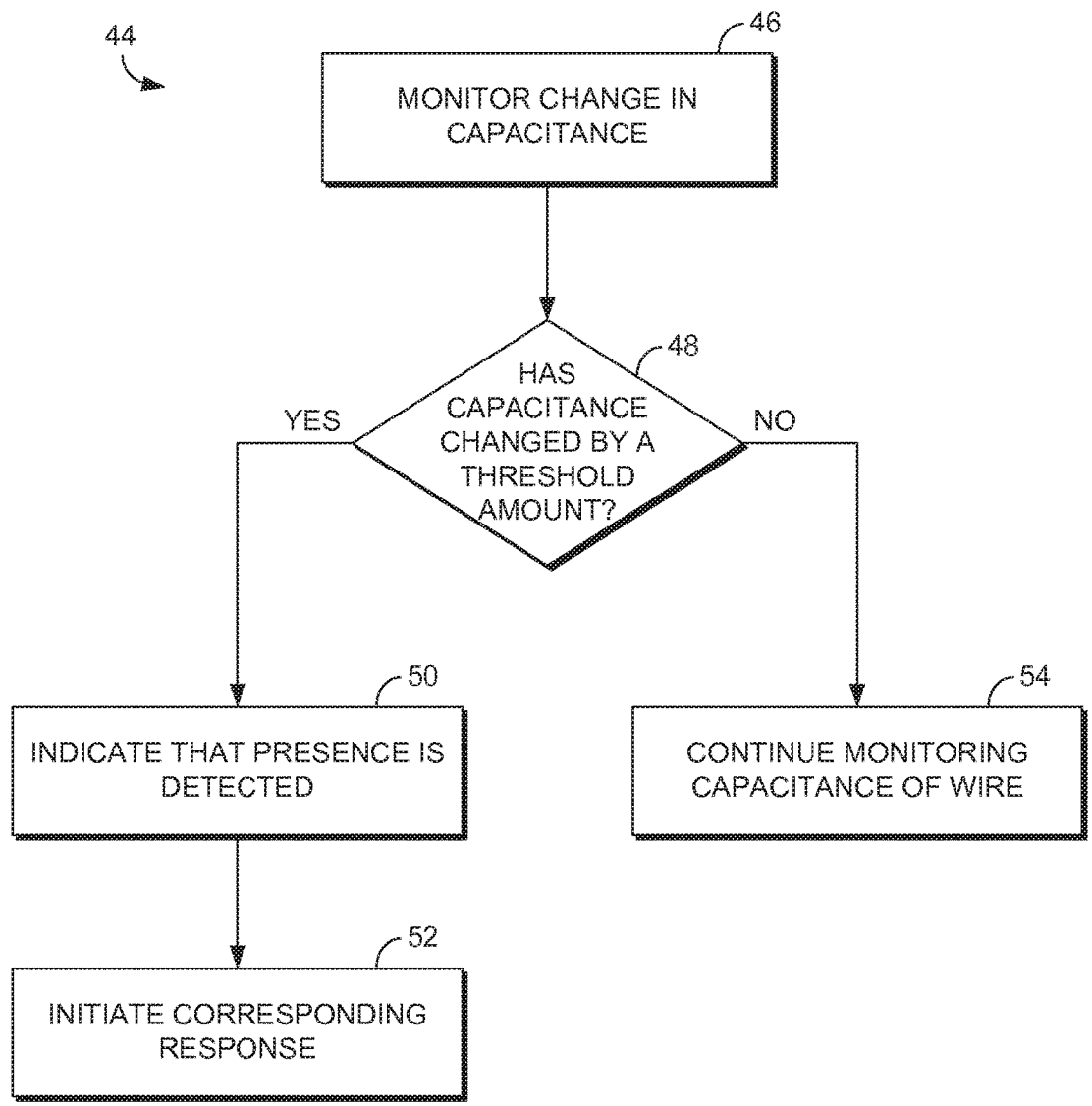
FIG. 9 is a flow diagram of an exemplary method of detecting presence with respect to a bed, in accordance with embodiments of the invention.

Turning now to FIG. 9, an exemplary flow diagram 44 depicts monitoring capacitance and making a determination of presence with respect to a furniture item. At block 46, an average change in capacitance is monitored using a capacitive wire. As discussed above, the change in capacitance indicates a change in voltage over a particular amount of time. At block 48, a determination is made regarding whether the capacitance has changed by a threshold amount. If a determination is made that the capacitance has changed by a threshold amount (i.e. a particular amount of change in voltage has occurred within a particular window of time), then an indication is made that presence has been detected at block 50, and the corresponding response is initiated at block 52. As will be understood, blocks 50 and 52 may, in some embodiments, be combined into a single step of initiation of the corresponding response based on a determination of presence detection. At block 54, if capacitance has not changed by a threshold amount, capacitance monitoring continues.

Figure 10:
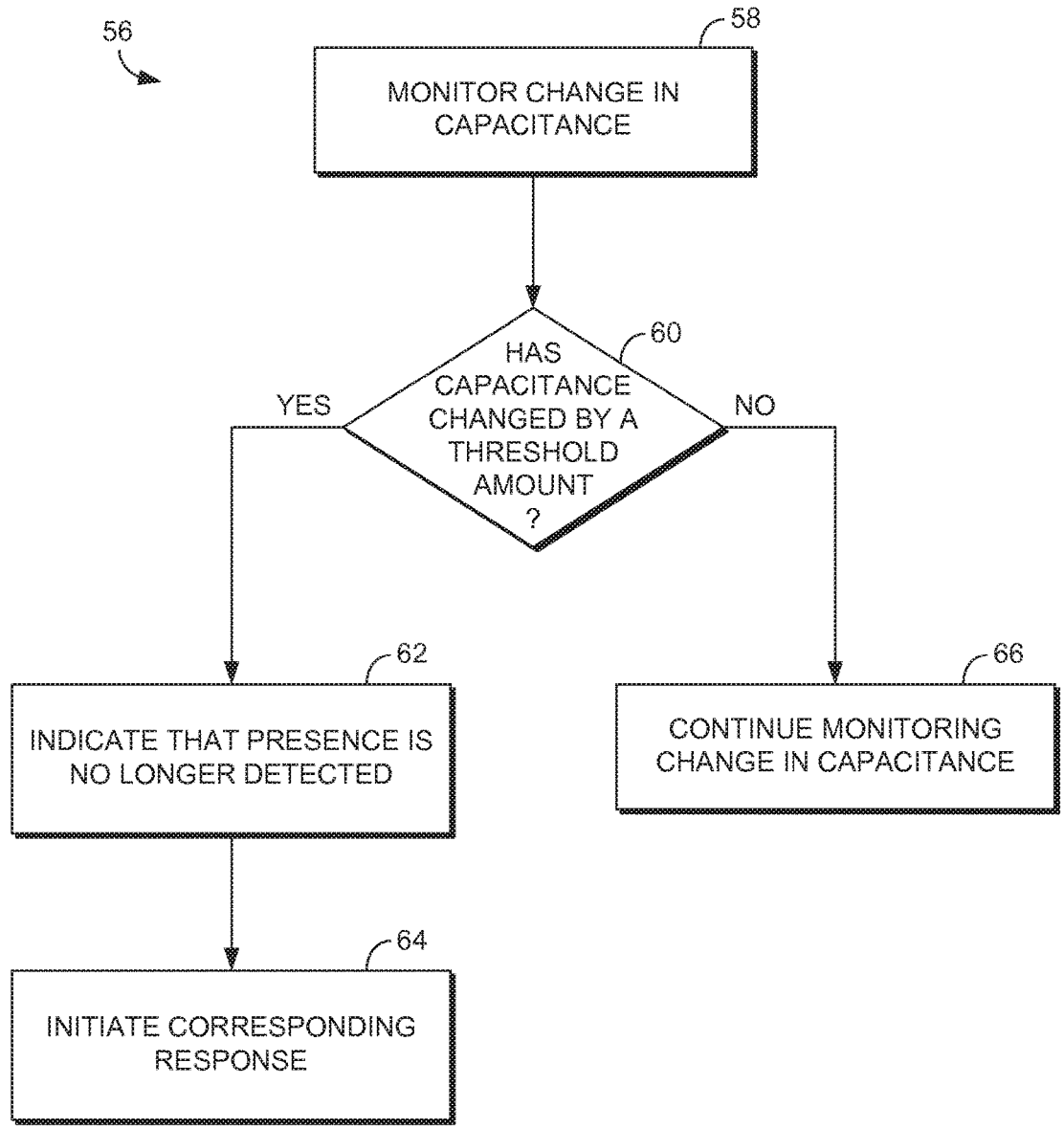
FIG. 10 is a flow diagram of an exemplary method of detecting presence with respect to a bed, in accordance with embodiments of the invention.

With reference next to FIG. 10, an exemplary flow diagram 56 depicts monitoring capacitance and making a determination that presence is no longer detected with respect to a furniture item. At block 58, an average change in capacitance is monitored using a capacitive wire. At block 60, a determination is made whether capacitance has changed by a threshold amount. At block 62, if capacitance has changed by a threshold amount, an indication that presence is no longer detected is made at block 62, and a corresponding response is initiated at block 64. At block 66, if it is determined that the threshold amount has not been satisfied, capacitance monitoring continues.

Referring now to FIG. 11, an exemplary capacitive sensing system 68 includes a thin-gauge foil tape 70, a thin-gauge capacitive wire 72, and a substrate 74. In embodiments, foil tape 70 attaches capacitive wire 72 to a substrate 74, such as a perimeter of an item of motion furniture or an adjustable bed. FIG. 12 depicts another exemplary capacitive sensing system 76, with a thin-gauge foil tape 78 having a thin-gauge, capacitive embedded wire 80, for attaching to a substrate 82. For example, a thin-gauge foil tape 78 embedded with a capacitive embedded wire 80 may be held to a substrate 82, such as an adjustable bed. In embodiments, capacitive wire 72 and/or capacitive embedded wire 80 may be coupled to substrates 74 and 82 using an adhesive portion of foil tape 70 and 78. Additionally, foil tapes 70 and 78 may be pressure sensitive adhesive (PSA) foil tapes, for attaching to substrates 74 and 82. In further embodiments, thin-gauge foil tape 70 and 78 are used to attach capacitive wire 72 and/or capacitive embedded wire 80, to a substrate. In addition or in alternative to attaching capacitive wire 72 or capacitive embedded wire 80 using foil tape, such capacitive wiring systems may be coupled to a substrate using staples, glue, adhesive, or otherwise fastened to a number of surfaces to create a capacitive circuit on the adjustable bed or motion furniture item.

In the example of FIG. 13, a capacitive sensing system 84 includes a thin-gauge foil tape 86 with an embedded wire 88 coupled to a substrate 90. In particular, the foil tape 86 is applied to an inner edge 92 of substrate 90, such as an inner edge of an adjustable bed frame. In embodiments, foil tape 86 is a PSA tape that is adapted to adhere to a surface of substrate 90, while permitting the foil tape 86 (and the embedded wire 88) to maintain a charge during monitoring of capacitance. For example, foil tape 86 may be coupled to a controller and monitored using a software application that analyzes changes in capacitance, as detected via the foil tape 86 and the embedded wire 88. For example, foil tape 86 may be coupled to a controller (such as a microcontroller) associated with a software application, and used to capacitively detect mammalian touch in components such as doors, windows, furniture, or other items of moveable furniture, such as an adjustable bed. In embodiments, foil tape 86 is capacitive, and is coupled to the embedded wire 88 that is electrically coupled to the microcontroller.

Figure 14:
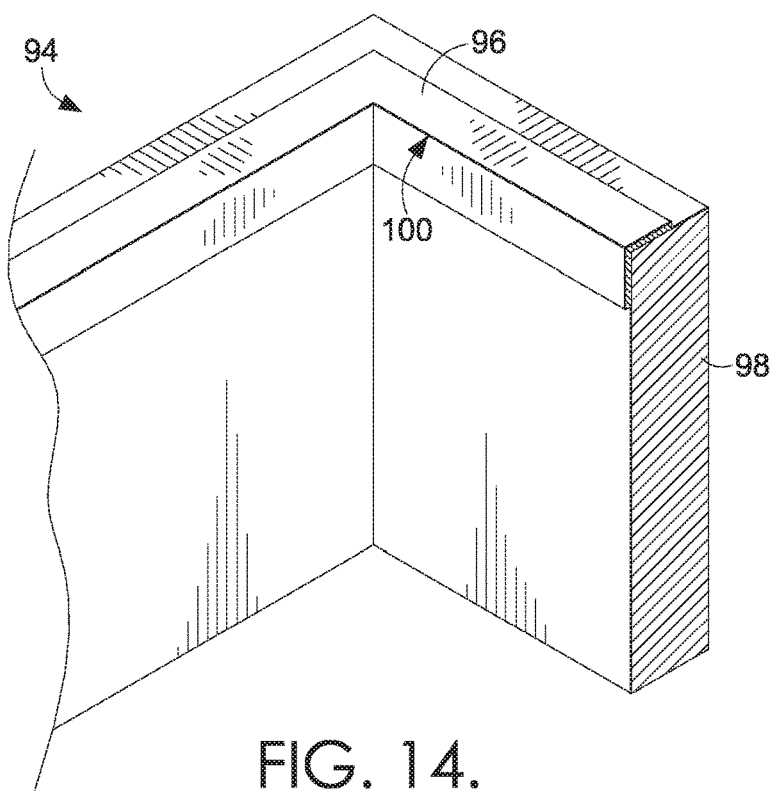
FIG. 14 is a perspective view of a foil tape applied to an edge of a substrate, in accordance with embodiments of the invention.
Figure 15:
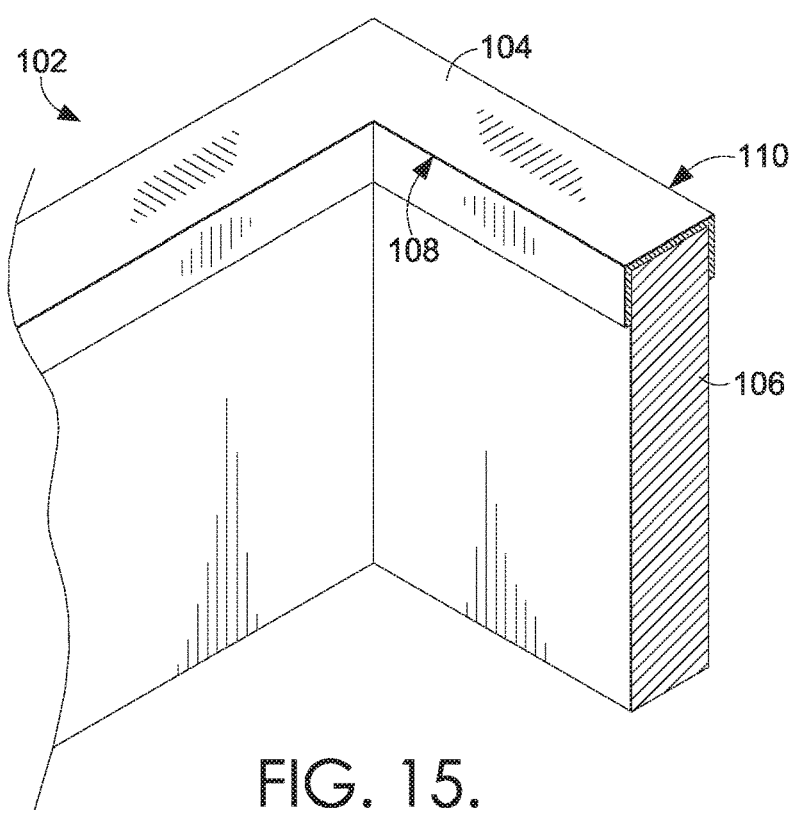
FIG. 15 is a perspective view of a foil tape applied to multiple edges of a substrate, in accordance with embodiments of the invention.

In FIG. 14, a capacitive sensing system 94 includes a capacitive cap 96 coupled to a substrate 98 along an inner edge 100. In embodiments, substrate 98 may be a frame and/or base of an adjustable bed, with an inner edge 100, on which capacitive cap 96 is applied and used for capacitive detection. In one embodiment, capacitive cap 96 is a sensing material, such as a metalized tape, that is able to detect changes in capacitance, and can be placed under or on top of fabrics. Similarly, with reference to FIG. 15, capacitive sensing system 102 depicts a capacitive cap 104 coupled to the top of substrate 106. In particular, capacitive cap 104 is applied along inner edge 108 and outer edge 110. In one embodiment, capacitive cap 104 is a foil and/or metalized tape that can detect a change in capacitance. In further embodiments, substrate 106 may be a frame and/or base of an adjustable bed, with the inner edge 108 and outer edge 110, on which capacitive cap 104 may be used to detect presence based on a change in capacitance detected by the capacitive cap 104. In some embodiments, capacitive cap 96 and/or capacitive cap 104 may be a metallic coated plastic trim that can be used as a sensing material, in addition to or in alternative to a conductive wire and/or foil tape. In further embodiments, capacitive caps 96 and 104 may be made from other ferrous or metallic shapes, such as angles, zees, tees, caps, etc. As such, in embodiments using foil tape for capacitive detection, additional metallic materials could be used to provide capacitive detection of presence with respect to an adjustable bed.

In embodiments, a thin-gauge perimeter wire may be installed around a perimeter of an adjustable bed and/or frame of an adjustable bed. In embodiments, the thin-gauge perimeter wire may be coupled to the base of an adjustable bed using tape; adhesives; fasteners; staples; or may be embedded or extruded through foam; covered in a thin foil tape; or attached via one or more additional/alternative hardware mechanisms. In one embodiment, the perimeter wire may be embedded in foil tape prior to application to the bedding device, as in the example of FIGS. 12-13. In a further embodiment, the perimeter wire may be connected to a coaxial cable using sockets, such as using an RCA jack and socket, or a mechanism such as a Molex® or an Amp connector.

In embodiments, the foil tape and the perimeter wire are capacitively coupled and sensitive to touch. That is, similar to the capacitive wire segments used to detect presence or absence of a person or other being on top of an automated bedding system, foil tape and a perimeter wire coupled to a frame or base of an adjustable bed may also be capacitively coupled and able to detect presence or absence based on a detected change in capacitance. Further, such capacitance detection may be adjusted to a required amount of sensitivity for presence detection, such as "fine tuning" the microcontroller and/or software for detection using thicker upholstery.

In a further embodiment of the invention, ports, grommets, and/or sockets are added to an automated bedding mattress construction to allow connection of a capacitive wire to spring an assembly, thereby creating a capacitive array internal to the mattress. As discussed with reference to FIG. 8, capacitive wire may be incorporated into one or more inner springs of a mattress. Further, in one example, a perimeter wire coupled to an automated bed frame may also be coupled to the inner spring of a mattress assembly to create a capacitive array that detects presence with relation to both the mattress and the frame. In some embodiments, a wire mesh, such as netting and/or a screen, may be capacitively connected to a capacitive sensing system for detection associated with the same perimeter wire.

In some embodiments, body capacitance can be used to operate different types of switches as a capacitive touch sensor will respond to close-proximity detection of a change in capacitance. Accordingly, the tip of a finger may be detected by a capacitive sensor, with a minimal amount of pressure (i.e., triggered without forceful touching), and the capacitive sensing system of an automated furniture item may detect minimal amounts of bodily contact.

Figure 16:
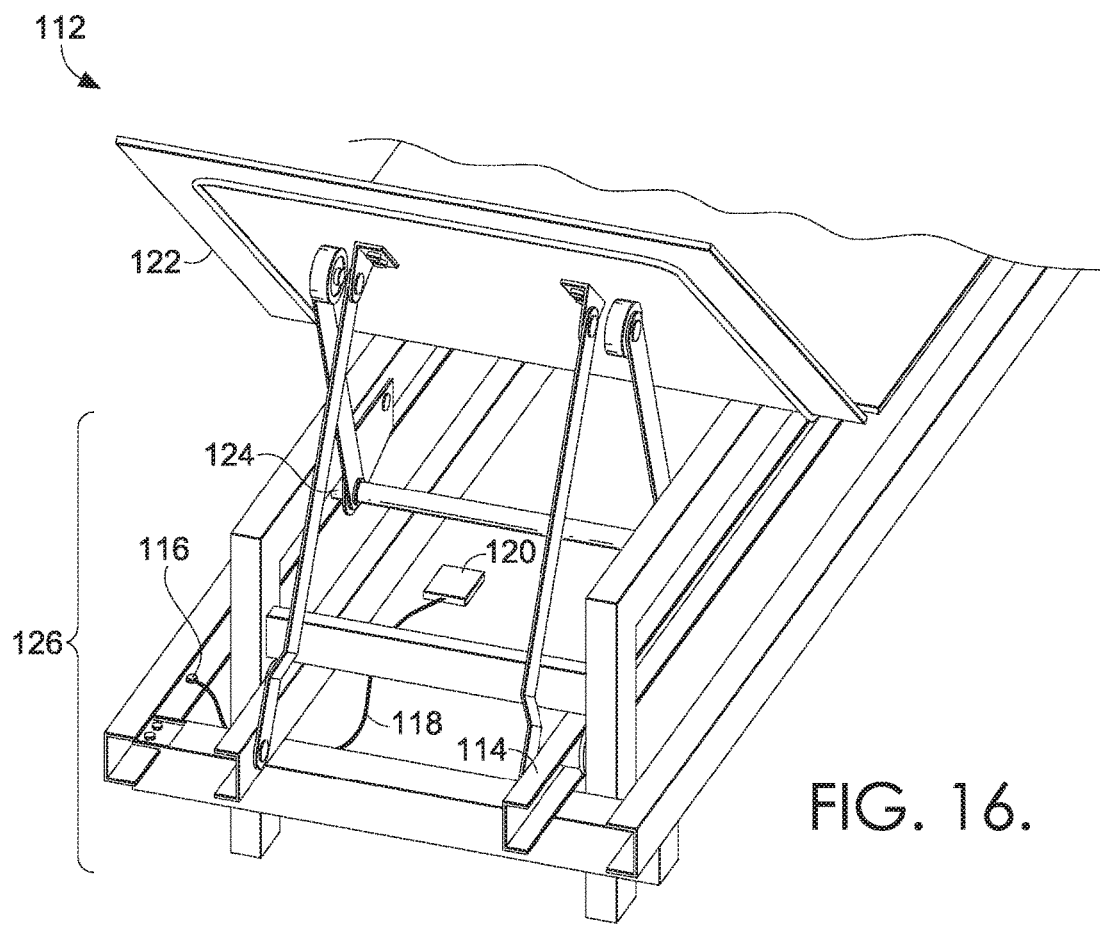
FIG. 16 is a rear perspective view of an adjustable bed, in accordance with embodiments of the invention.

Turning next to FIG. 16, a rear-perspective view of an adjustable bed 112 includes a metal, adjustable bed frame 114 coupled at a contact point 116 to a coaxial cable (coax) 118 and a controller 120. As a portion of the adjustable bed 122 is in motion, presence near the frame 114 of the adjustable bed 122 may be detected by the controller 120, based on the capacitance monitored via bed frame 114. Accordingly, the metal, adjustable bed frame 114 is used as a sensor, with the metal being a conductive material adapted to carry a charge. In embodiments, multiple metal components 126 are coupled together to form the adjustable bed frame 114. Many of these parts are coupled together at joints 124 that are also adapted to carry a charge, which enables the controller 120 to detect presence with respect to contact with any conductive portion of the adjustable bed frame 114. As will be understood, embodiments discussed with reference to FIG. 16 may also be implemented in additional moveable furniture items, such as chairs.

In one embodiment, when a person contacts the adjustable bed frame 114, the frame's normal capacitance is increased. In response to the increase in capacitance by contact with the bed frame 114, the controller 120 measures the change in capacitance of the bed frame 114 against a known capacitance of the frame. In embodiments, controller 120 may be mounted to the bed frame 114 directly, with a separate microcontroller for a sensor, and a separate microcontroller for controlling the bed motion. Accordingly, a sensing microcontroller may use separate channels for wire detection of presence (discussed above) and frame detection of presence. In embodiments, the use of a coax 118 to directly connect the bed frame 114 to the controller 120 reduces the amount of interference caused during monitoring and/or detection, as the coax exits the controller 120 and will not detect any signals until it reaches the bed frame 114.

In one example, as connected to the bed frame 114 via coax 118, controller 120 measures capacitance by pulsing the bed frame 114 with a voltage, such as a low voltage having a minimal amount of current. In between pulses from the controller 120, the signal fed into the controller's analog to digital converter (ADC) is used to measure how much the voltage changes over time. In one embodiment, one microcontroller of the controller 120 may send out a charge, with the resulting charge being read by another microcontroller having a processor that monitors how quickly the detected charge decays. In one embodiment, when a body is in contact with the frame, the controller 120 monitors how quickly the change in capacitance rises, and how far the change in capacitance rises.

Based on detection of a change in capacitance by the controller 120, the actuator of the adjustable bed frame 114 may be disabled during a motion operation if it is determined that human contact is detected. In embodiments, the controller 120 may monitor the overall levels of capacitance of the bed frame 114 to determine what changes in capacitance do and do not satisfy a threshold for determining that contact has been made. For example, the rate of change and the amount of change may be monitored to determine whether a threshold for contact has been met, and whether the travel of the bed frame 114 should be altered. In embodiments, when triggered by a controller 120, the actuators of an adjustable bed 112 may be programmed to stop all motion (such as downward motion) when contact is detected by the conductive, metal bed frame 114. In such an example, when presence of a human is detected underneath a moving, adjustable bed 112, the detection by bed frame 114 may indicate to the controller 120 to discontinue travel of the bed frame 114. In another embodiment, in response to detection of a human underneath a moving, adjustable bed 114, the actuators may reverse and/or retract motion by a particular distance, such as backing up an inch if the bed frame 114 was lowering to a downward position when presence was detected.

Accordingly, to re-start travel once a condition has been met for stopping travel by the controller 120, a user may indicate to the adjustable bed 112 that 1) the condition that triggered the indication of presence has gone away, and/or 2) that the user has again selected motion of the adjustable bed frame 114 by providing an indication to the controller 120 (such as pushing a button on a controller of the adjustable bed 112). In further embodiments, controller 120 may track the usage of an adjustable bed 112, and the subsequent commands received after detecting presence near a moving bed frame 114. Such tracking may be used to designate specific actions required by the bed in response to presence detection, such as moving of a bed into a fully-upright position, or discontinuing motion of the bed prior to initiating a subsequent lowering once presence is no longer detected.

Figures 17A, 17B, 17C:
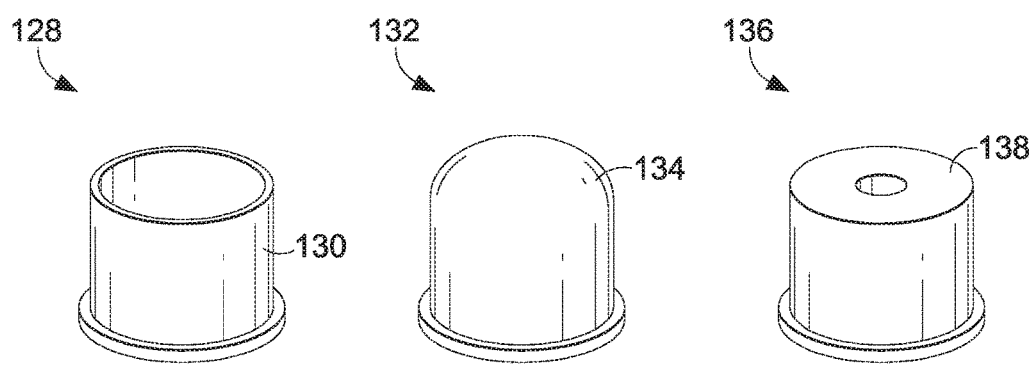
FIG. 17A is a conductive bushing, in accordance with embodiments of the invention.
FIG. 17B is a conductive encapsulating torque tube, in accordance with embodiments of the invention.
FIG. 17C is a conductive bushing, in accordance with embodiments of the invention.

With reference to FIG. 17A, an exemplary metallic bushing 128, such as conductive bushing 130, may be used to provide an acceptable transfer of energy within a metal assembly, such as the metal, adjustable bed frame 114 of FIG. 16. For example, one or more parts of an adjustable bed frame 114 may be coupled together at joints 124 that use conductive bushing 130 to carry a charge, thereby enabling a controller 120 to detect presence with respect to contact with any conductive portion of the adjustable bed frame 114. Additional embodiments of metallic bushings 132 and 136 are depicted in FIGS. 17B and 17C. FIG. 17B depicts an exemplary, conductive encapsulating torque tube 134, while FIG. 17C depicts an exemplary, conductive bushing 138 for use with capacitive detection associated with a metallic assembly. Accordingly, in some embodiments, conductive bushings are made using conductive materials to create "conductive" plastics, such as using stainless steel, carbon fibers, carbon black, carbon powder, graphite, and the like. In another embodiment, conductive bushings are made using chemical additives or coatings added to plastic bushings to increase the conductivity. In further embodiments, a metal coating on the outside of a bushing, or a metal coating encapsulated inside a plastic bushing, may be used to generate conductive bushings. As will be understood, a number of metallic, conductive, and/or chemical additives, treatments or materials may be used to create conductive bushings for use in a metallic assembly that carries a charge and is used to detect capacitance, such as a metallic, adjustable bed frame 114.

As will be understood, "traditional" bushings used in adjustable beds or motion furniture are often made with electrically-insulating acetals, which prevent the transfer of a charge during detection of capacitance. Accordingly, in some embodiments, parasitic capacitive coupling may be used to capacitively couple components of the adjustable bed or motion furniture metallic assemblies. In a further embodiment, jumper wires are used to connect components of an adjustable bed that are electrically isolated due to non-conductive bushings. For example, electrically-isolated parts of a metal, adjustable bed frame may be coupled to other conductive portions of the bed frame using jumper wires.

In embodiments, bushings and other washer materials being carbon-fiber filled acetal with moderate surface conductivity may be used. Such bushings and washers may assist in the transfer of energy throughout a metal, adjustable bed frame 114, its components, and related assemblies. In some embodiments, a metallic bed frame may be capacitively coupled to other assemblies in the adjustable base. Accordingly, the term "metallic assembly" may be used to refer to any of the frame, components of the frame, and assemblies of an adjustable furniture item, such as a bed.

In one embodiment, acetal carbon-fiber filled bushings are less than or equal to the surface resistivity of 1.0E+3 ohm and have a volume resistivity of 1.0E+3 ohm centimeter (using test methods per IEC 60093). The human body capacitance is the input to the metallic assembly, and the carbon-fiber filled bushings act as "jumper wires" to transmit energy between the metallic assemblies in adjustable beds and motion furniture. In one embodiment, electroceramics (ceramic materials specifically formulated for electrical properties) may be tailored for use as a highly-conductive bushing material, such as the electronically conductive ceramic consisting of Indium Tin Oxide (ITO), Lamthanum-doped strontium titanate (SLT), and yttrium-doped strontium titanate (SYT).

Figure 18:
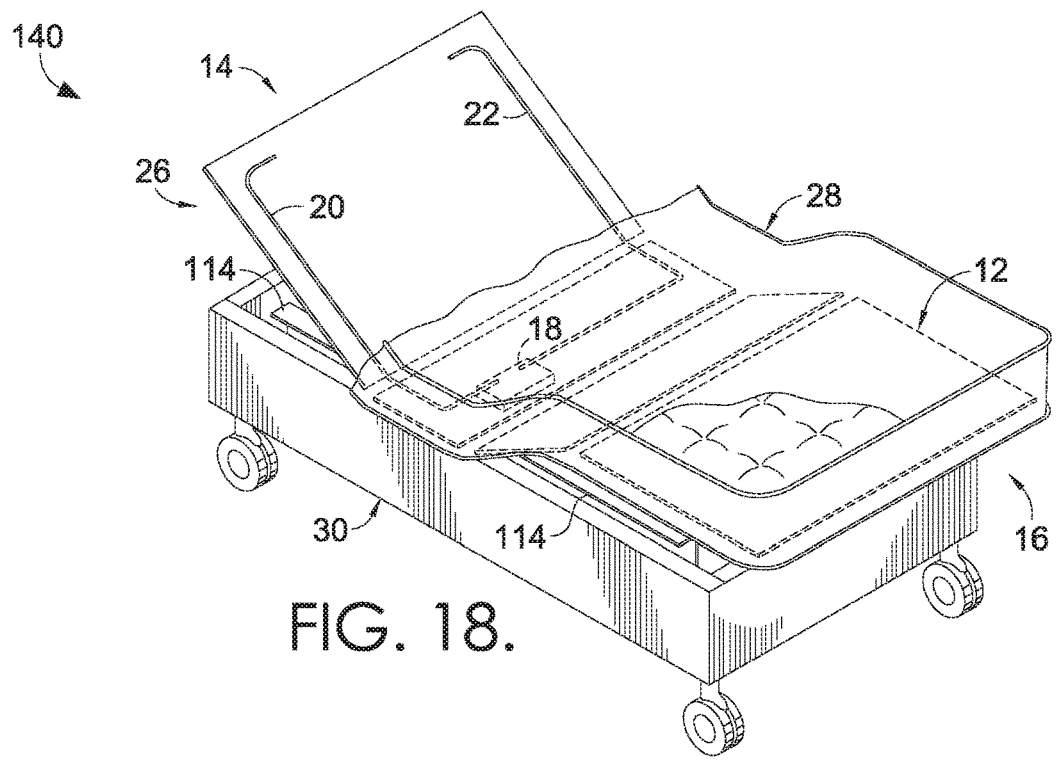
FIG. 18 is a perspective view of an automated bed with head and feet portions of the bed raised to partially reveal a metal, adjustable bed frame, and a portion of the mattress cut away to reveal capacitive wire coupled to the top of the platform, in accordance with embodiments of the invention.

Turning next to FIG. 18, an automated bedding system 140 includes an adjustable bed 26 having a plurality of panels 12 with a first end 14 and a second end 16, a control enclosure 18 (mounted below the plurality of panels 12), a first segment 20 of a capacitive wire, and a second segment 22 of a capacitive wire. In some embodiments, the first end 14 may be referred to as the "head" of the bed, while the second end 16 may be referred to as the "foot" of the bed. In FIG. 18, adjustable bed 26 is depicted in a raised position with the first end 14 raised and the second end 16 raised, to reveal a portion of the metal, adjustable bed frame 114 of the adjustable bed 26. In embodiments, the bed frame 114 is a conductive material used to carry a charge and monitor a change in capacitance, as discussed above. Accordingly, in an example where the first end 14 of the adjustable bed 26 is being lowered, detection of human contact with the bed frame 114 may trigger the bed to discontinue downward motion. In some embodiments, detection of contact with bed frame 114 may also trigger a retracting and/or raising of the first end 14. Similarly, in another embodiment, the lowering of second end 16 may be stopped based on detection of human presence by bed frame 114.

Figure 19:
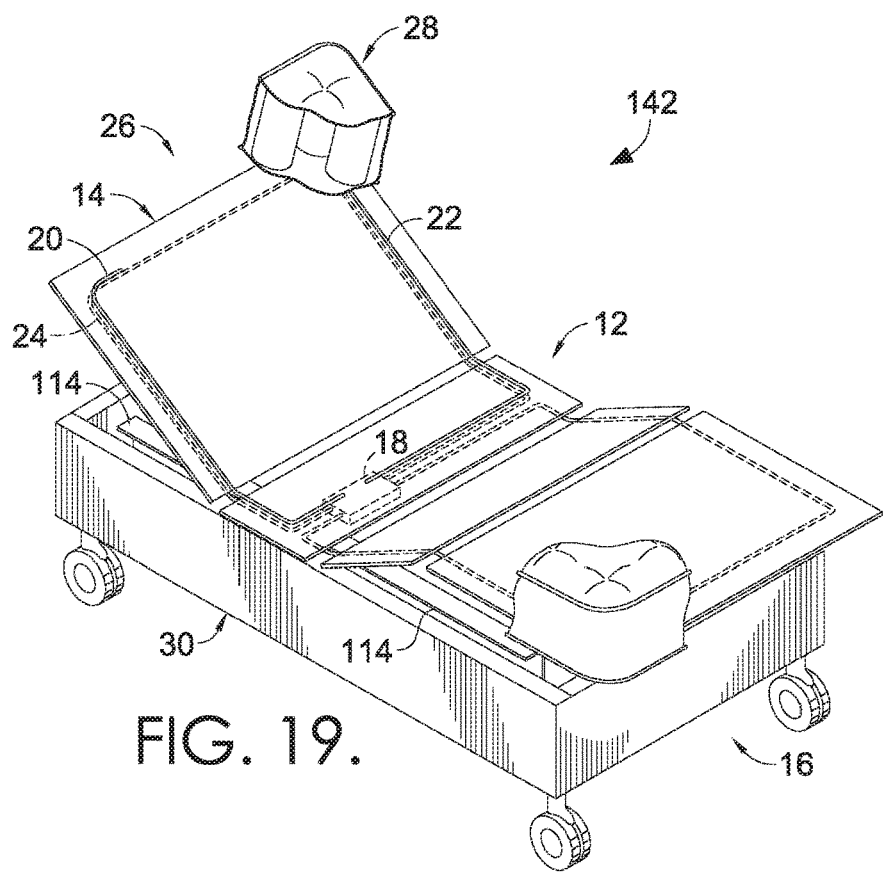
FIG. 19 is a perspective view of the automated bed of FIG. 18, with head and feet portions of the bed raised to partially reveal a metal, adjustable bed frame, and with the mattress cut away to reveal a capacitive wire coupled to the top of the platform and hidden lines indicating the capacitive wire and control enclosure coupled to the bottom of the platform, in accordance with embodiments of the invention.
Figure 20:
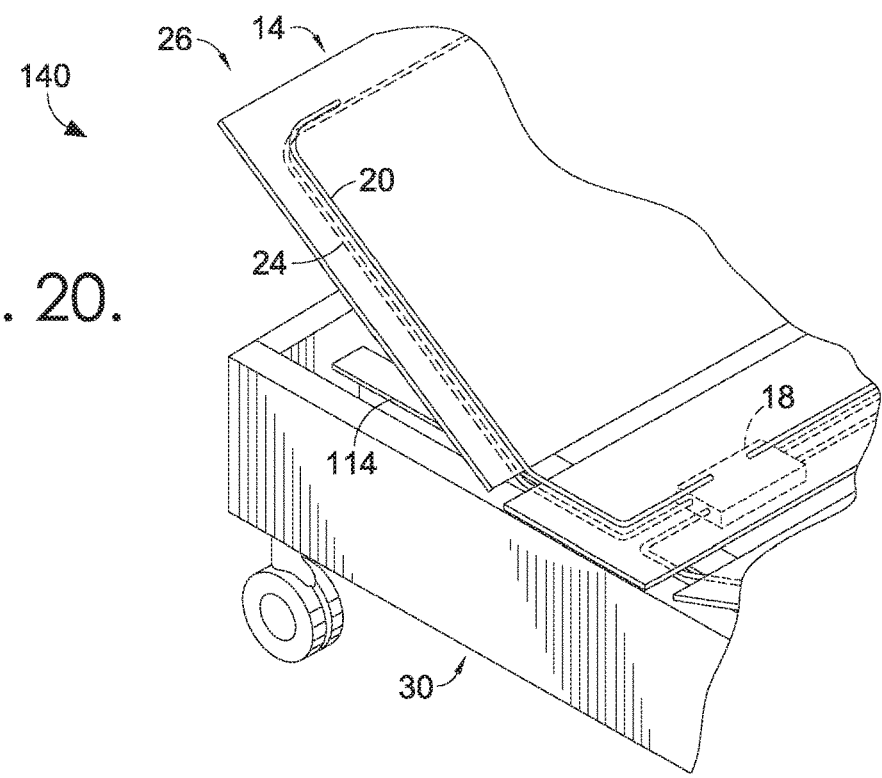
FIG. 20 is an enlarged, perspective view of the automated bed of FIG. 19, with head and feet portions of the bed raised to partially reveal a metal, adjustable bed frame, and with a capacitive wire coupled to the top of the platform and hidden lines indicating the capacitive wire and control enclosure coupled to the bottom of the platform, in accordance with embodiments of the invention.

As can be seen in FIG. 18, capacitive wiring around a perimeter of a platform may be used in addition or alternative to the capacitive detection using bed frame 114. Accordingly, FIG. 19 depicts the adjustable bed of FIG. 18, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 19 is shown in FIG. 20, with hidden lines depicting capacitive wires 20 and 24 coupled to the control enclosure 18, which is mounted beneath the panels 12. Further, the metal frame 114 is shown below the mattress 28, and can be used to detect presence, in addition or in alternative to the capacitive wire segments on the platform 12.

Figure 21:
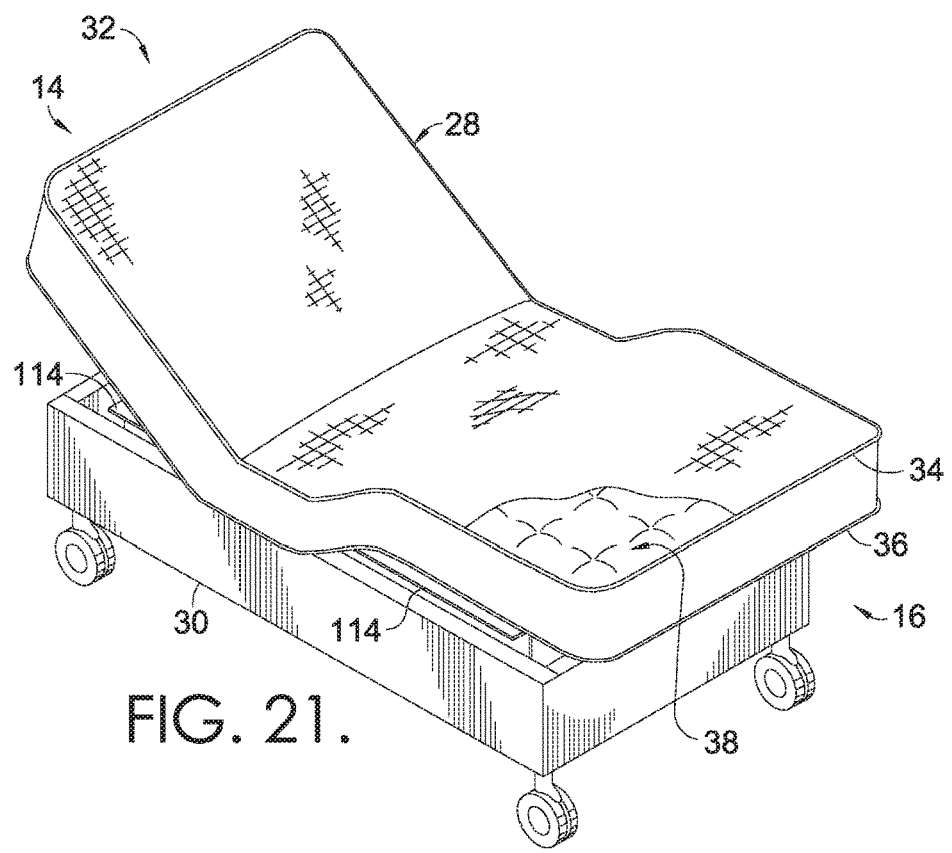
FIG. 21 is a perspective view of an automated bed with head and feet portions of the bed raised to partially reveal a metal, adjustable bed frame, and a tape edge surrounding a perimeter of the mattress cover, in accordance with embodiments of the invention.

With reference to FIG. 21, an enlarged, perspective view of the automated bed of FIG. 19, with head and feet portions of the bed raised to partially reveal a metal, adjustable bed frame 114 is shown. Additionally, in some embodiments, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection. Accordingly, in some embodiments, presence may be detected with respect to an adjustable bed using both wiring incorporated into the perimeter of the mattress, the metal, adjustable bed frame 114 itself being used as a capacitive sensor.

Figure 22:
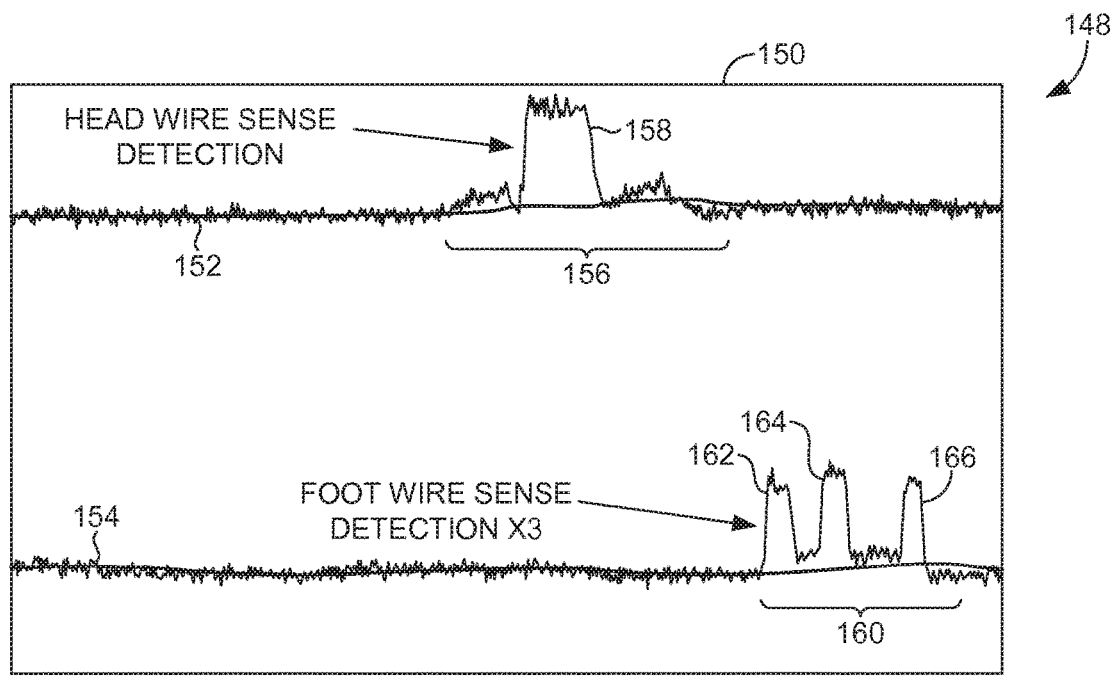
FIG. 22 is an exemplary graphical display of the measure of head wire sense detection and foot wire sense detection associated with an adjustable bed, using capacitance monitoring, in accordance with embodiments of the invention.
Figure 23:
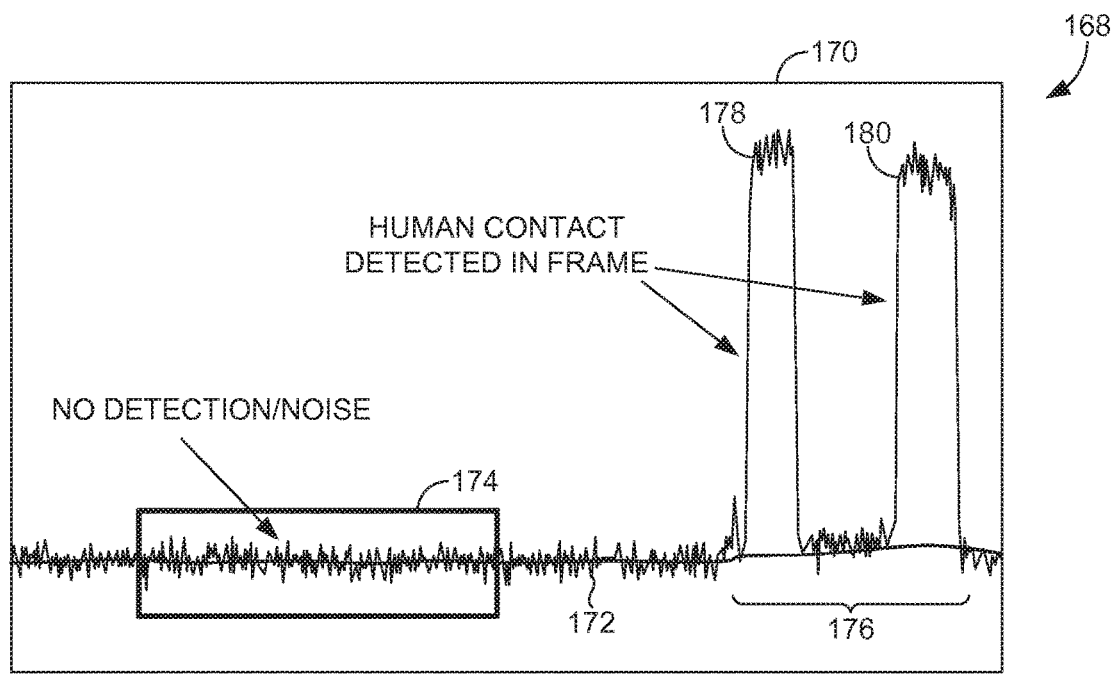
FIG. 23 is an exemplary graphical display of the measure of contact detection with a metal, adjustable bed frame using capacitance monitoring, in accordance with embodiments of the invention.
Figure 24:
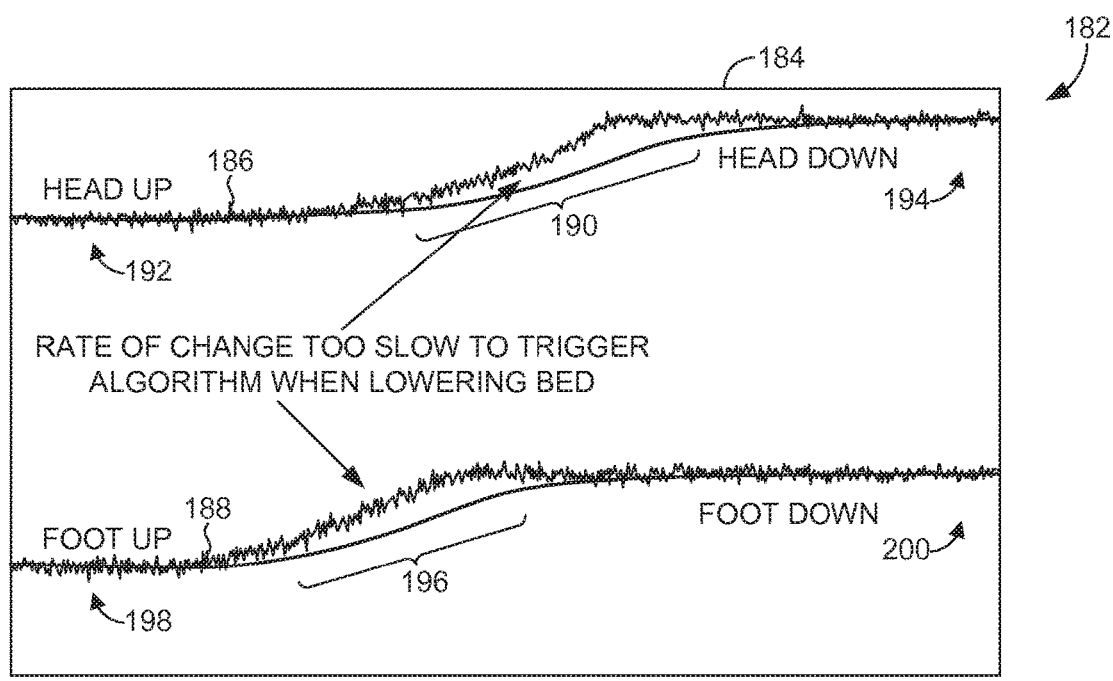
FIG. 24 is an exemplary graphical display of the measure of the rate of change of monitored capacitance during lowering of the head portion and foot portion of a metal, adjustable bed frame, in accordance with embodiments of the invention.

With reference to FIGS. 22-24, capacitive detection is monitored over time, noting changes in capacitance due to presence detection, noise interference, and movement of the automated bed. For example, in FIG. 22, capacitance detection 148 is shown on a display 150 that includes both head wire monitoring 152 and foot wire monitoring 154. As shown along the path of the head wire monitoring 152, head wire sense detection area 156 indicates a peak 158 of change in capacitance. Similarly, along the path of the foot wire sense monitoring 154, foot wire sense detection area 160 indicates three peaks 162, 164, and 166 that indicate changes in capacitance. Accordingly, in one embodiment, a capacitive wire near a first end 14 (head) of an adjustable bed may detect a change capacitance (such as peak 158) that triggers one or more features of the adjustable bed. In another embodiment, a capacitive wire near a second end 16 (foot) of an adjustable bed may detect a change in capacitance (such as one or more of the peaks 162, 164 and 166) and be used to trigger one or more features of an adjustable bed. In some embodiments, triggering a feature of an adjustable bed requires satisfying a threshold for detection. In other words, the monitoring system may detect changes in capacitance in relation to the head or foot portions of the bed, but the change in capacitance may not be great enough to satisfy a threshold for detection that triggers a feature. For example, minimal movement of a person on a mattress may indicate some level of change in capacitance to the monitoring system, without triggering any change in movement of the bed or activity of associated features. Meanwhile, complete removal of user from a bed, which alters the detected capacitance above a particular threshold may indeed trigger the threshold for an associated activity, such as lowering the foot of the bed and/or triggering lights to come on.

Turning next to FIG. 23, capacitance detection 168 is shown on a display 170 that includes monitoring of capacitance 172 of a metal, adjustable bed frame. Detection area 174 designates the indication of no presence being detected, and also provides an indication of the inherent level of noise that is detected by the system. Further, detection area 176 indicates peaks 178 and 180 of changes in capacitance, which exhibit that human contact with the bed frame has been detected. As discussed above, a threshold for detection may be determined, such that a minimal amount of contact, for a short period of time, may not trigger an indication of presence with respect to the bed frame. At the same time, contact with the bed frame for a longer period of time, as indicated by a large change in capacitance for a longer duration, may be associated with a determination of presence under and/or near the bed frame. In embodiments, detection of human contact with the frame, as indicated by peaks 178 and 180, may trigger a number of features associated with the adjustable bed, such as stopping of a lowering feature, alerting of an alarm feature, retracting of motion in an upward direction for a specified distance, or any combination of features programmed to activate in response to the appropriate trigger.

With reference to FIG. 24, capacitance detection 182 is shown on display 184 to demonstrate the amount of change in capacitance over time with respect to the frame of an adjustable bed, such as the adjustable bed frame monitored in FIG. 23. Display 184 includes the monitoring of a head portion 186 and a foot portion 188 of an adjustable bed. In embodiments, the rate of change area 190 is monitored as the capacitance changes from a first level of capacitance 192 to a second level of capacitance 194. Similarly, rate of change area 196 is monitored as the capacitance changes from a first level of capacitance 198 to a second level of capacitance 200. In embodiments, the rate of change in capacitance impacts whether the change itself triggers any feature of the automated bed. Accordingly, as indicated on the display 184, the rate of change area 190 and the rate of change area 196 indicate to a processor and/or controller that the rate of change in capacitance is occurring over too long of a time (i.e., is too slow) to trigger any of the features of the adjustable bed associated with lowering of the bed. For example, an algorithm that requires a minimum amount of change in capacitance before stopping lowering a bed (i.e. an algorithm that requires detection of the presence of human contact) may not be triggered by the change in capacitance caused by the movement of the bed itself, such as in FIG. 24.

As will be understood, a variety of filtering techniques may be used to adjust the determinations made (regarding whether presence is or is not detected) using software associated with the processor. For example, a variety of filters or transforms may be applied to the monitored capacitance signal to adjust/adapt the software for a particular application or user. For example, an automated bedding system could be adapted to adjust lighting or other functions based on particular amounts of change in capacitance over particular amounts of time, or trigger particular functions during particular times of day/night. As such, a processor may be trained to alter the sensitivity of a threshold based on previous use by a particular user of a corresponding feature. Additionally, a reaction time may be changed and a threshold may be adjusted for different users and different features of the automated bed.

Figure 25:
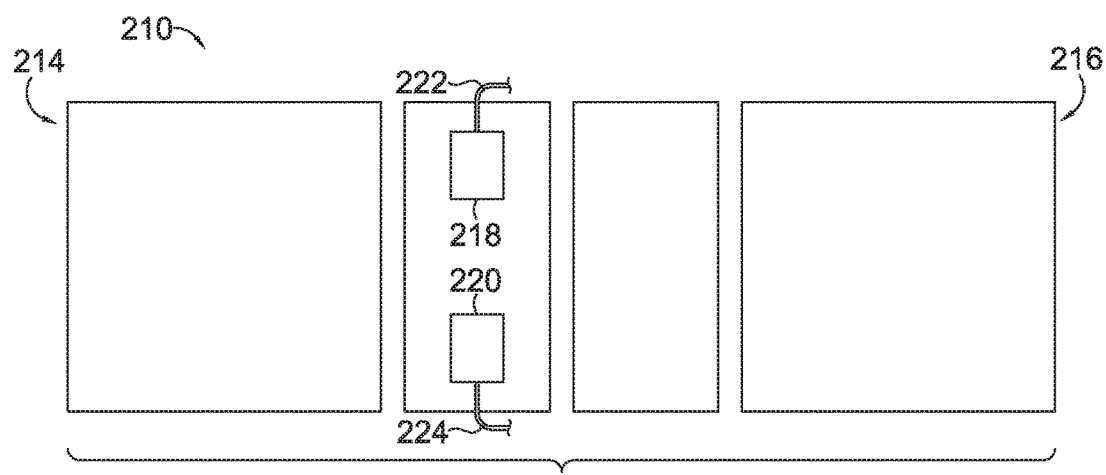
FIG. 25 is a top view of detection pads coupled to the panels of an automated bed platform, in accordance with embodiments of the invention.
Figure 26:
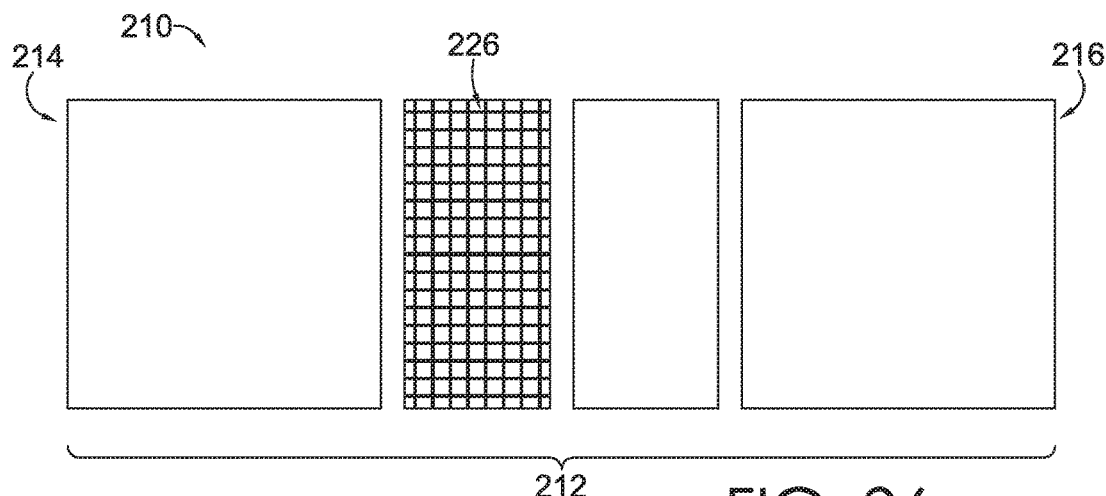
FIG. 26 is a top view of a detection grid coupled to the panels of an automated bed platform, in accordance with embodiments of the invention.
Figure 27:
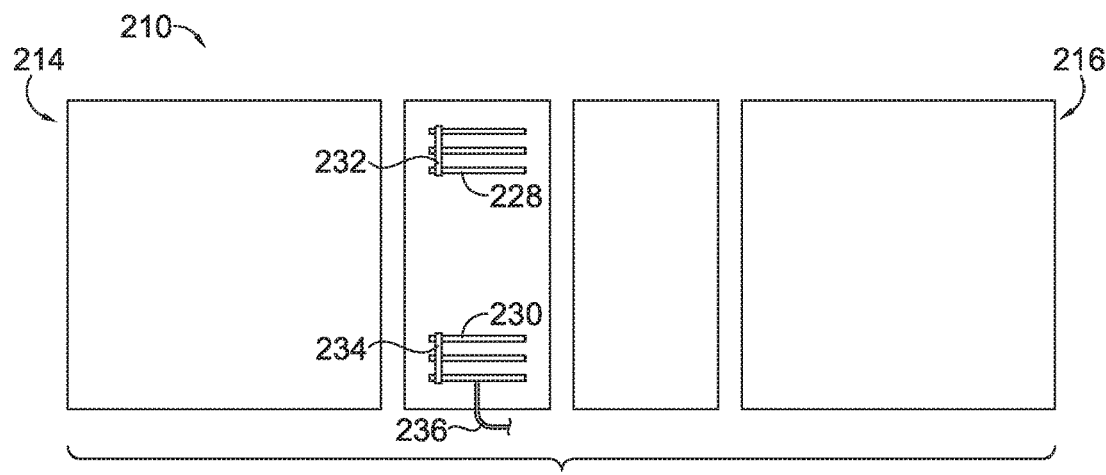
FIG. 27 is a top view of detection strips coupled to the panels of an automated bed platform, in accordance with embodiments of the invention.

An embodiment of an automated bedding system 210 with capacitive wire sensing is seen in FIGS. 25-27. Referring first to FIG. 25, a top view of the platform of the automated bedding system 210 includes a plurality of panels 212 having a first end 214 and a second end 216, detection pads 218 and 220 coupled to a surface of the plurality of panels 212, and cables 222 and 224 coupled to detection pads 218 and 220. In some embodiments, the first end 214 may be referred to as the "head" of the bed, while the second end 216 may be referred to as the "foot" of the bed.

When viewed from the top in FIG. 25, detection pads 218 and 220 are generally arranged near the first end 214 of the automated bedding system 210. In one embodiment, detection pads 218 and 220 are coupled to a stationary panel of the plurality of panels 212, which may be referred to as a "seatboard." As such, while the single panel supporting the head of the bed and the double panels supporting the foot of the bed may articulate up and down, the non-articulating seatboard may remain stationary. In one embodiment, while detection pads 218 and 220 are coupled to a static portion of an automated bedding system 210, an occupancy determination may be made with respect to one or more of the plurality of panels 212.

In some embodiments, detection pads 218 and 220 are a capacitive material, adapted to have a voltage based on proximity of an object to the detection pads 218 and 220. In further embodiments, the detection pads 218 and 220 are an aluminized polymer material with conductive properties. The aluminized polymer material of detection pads 218 and 220 may be conductive on one side only. In one embodiment, detection pads 218 and 220 are Mylar® pads. The capacitance measured across such conductive, aluminized polymer pads may be monitored by a processor that uses software to generate a determination of occupancy detection. In further embodiments, detection pads 218 and 220 may be aluminized Mylar®, aluminum sheets, metal screening, aluminum tape, a wire grid for a seat board, a metalized material or fabric, or any aluminized polymer material with conductive properties. In some embodiments, detection of occupancy the system activates one or more features and/or accessories via a control box and signal acting as a switch, using technologies such as Bluetooth, Wi-Fi, and Zigbee. In some embodiments, detection pads 218 and 220 have a single side that is conductive, and may be coupled to a bottom surface of an automated bedding system 210 platform, such as being sandwiched between stationary parts of an automated bedding system 210 during assembly.

In one embodiment, a Microchip® brand capacitive sensor may be used to determine when occupancy is detected. As such, while occupancy detection relies on the juxtaposition of a person or body with respect to one or both of the detection pads 218 and 220, a determination of the level of detection or the measurement of occupancy is conducted digitally, in software associated with the processor. In some embodiments, software associated with the occupancy detection system includes a software protocol that provides for seamless control of remote accessories associated with an automated bedding system.

As shown in FIG. 25, the capacitive detection pads 218 and 220 may be coupled to a control enclosure 218 coupled to the plurality of panels 212 of the automated bedding system 210. In some embodiments, cables 222 and 224 are coupled to the detection pads 218 and 220, and to a controlling device, such as a control enclosure/box. In embodiments, cables 222 and 224 are coaxial cables. As will be understood, additional capacitive components, such as additional detection pads, may be coupled to the plurality of panels 212. For example, while detection pads 218 and 220 may be coupled to a top surface of the plurality of panels 212, additional detection pads may be coupled to the bottom surface of the plurality of panels 212. Further, although depicted on a top surface of the plurality of panels 212, in some embodiments, detection pads 218 and 220 are coupled to any surface of the automated bedding system 210. For example, detection pads 218 and 220 may be coupled to a bottom surface of the plurality of panels 212 during assembly of an automated bedding system 210.

Detection pads 218 and 220 may be used to detect occupancy with respect to an automated bedding system 210. For example, as arranged near first end 214 of the automated bedding system 210, the torso of a person positioned on the top of the automated bedding system 210 may be detected by detection pads 218 and 220. In embodiments, detection pads 218 and 220 create a defined sensing area on the top half of the head of the bedding system 210, and are less susceptible to noise interference from articulation of the rest of the automated bedding system 210.

Referring next to FIG. 26, a top view of the platform of the automated bedding system 210 includes the plurality of panels 212 having a first end 214 and a second end 216, and a wire grid 226. Wire grid 226 may be coupled to a control enclosure/box for controlling the automated bedding system 210. In further embodiments, the wire grid 226 may be coupled to a controller that is external to the bedding system 210.

In some embodiments, wire grid 226 provides similar occupancy detection functionalities as the detection pads 218 and 220. Additionally, although depicted in FIG. 26 as being coupled to a particular portion of a top surface of the plurality of panels 212, in some embodiments, wire grid 226 may be coupled to any portion of the automated bedding system 210 for related detection purposes. In the embodiment of FIG. 26, wire grid 226 is made from a metallic detection material, such as an aluminized material or fabric, aluminized wire, or other metallic screen material. In one embodiment, the metallic screen material of wire grid 226 is interwoven to form a detection pad, such as detection pad 218 and 220 of FIG. 25.

Turning now to FIG. 27, a top view of the platform of the automated bedding system 210 includes a plurality of panels 212 having a first end 214 and a second end 216, a series of detection strips 228 and 230 coupled to the plurality of panels 212. The series of detection strips 228 and 230 are interconnected using connecting strips 232 and 234. In further embodiments, one or both of the series of detection strips 228 and 230 may be coupled to a control enclosure/box for controlling the automated bedding system 210, such as coupling detection strips 230 to a control enclosure using a cable 236. For example, cable 236 may be a coaxial cable coupling the series of detection strips 230 to a controller of the automated bedding system 210.

In some embodiments, a detection material associated with the automated bedding system 210 may be coupled to a top side of a plurality of panels 212 and/or a bottom side of the plurality of panels 212, and may be coupled directly to the deck of the automated bedding system 210 (i.e. to at least a portion of the plurality of panels 212). The detection materials depicted in FIGS. 25-27 as being coupled to the plurality of panels 212 may be arranged in any configuration for detection of occupancy. In some embodiments, non-conductive components of the automated bedding system 210 are in contact one or more of the sensors (i.e., detection strips 228 and 230, detection pads 218 and 220, and/or wire grid 226). In one example, a non-conductive control box may be coupled to one or more capacitive sensors.

Figure 28:
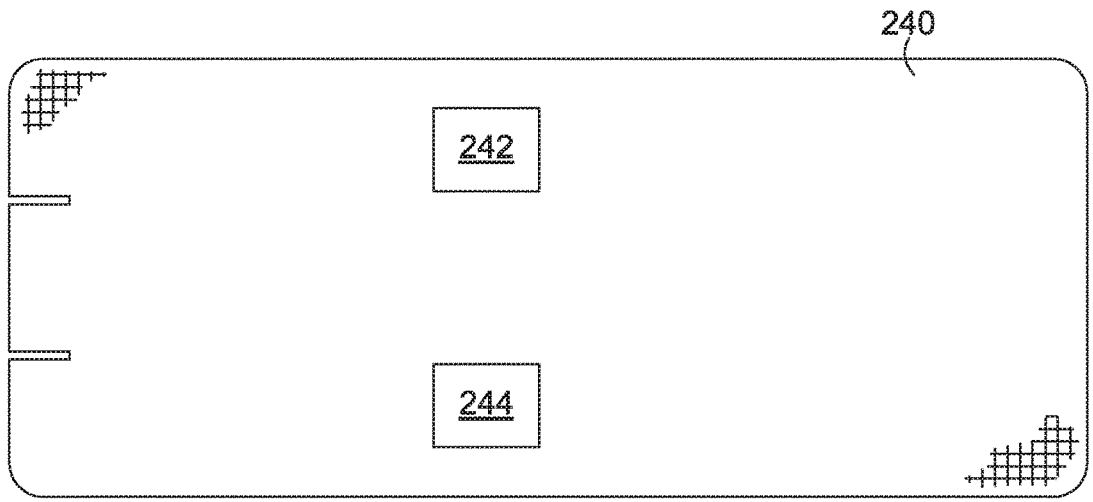
FIG. 28 is top view of detection pads coupled to a mattress topper material, in accordance with embodiments of the invention.
Figure 29:
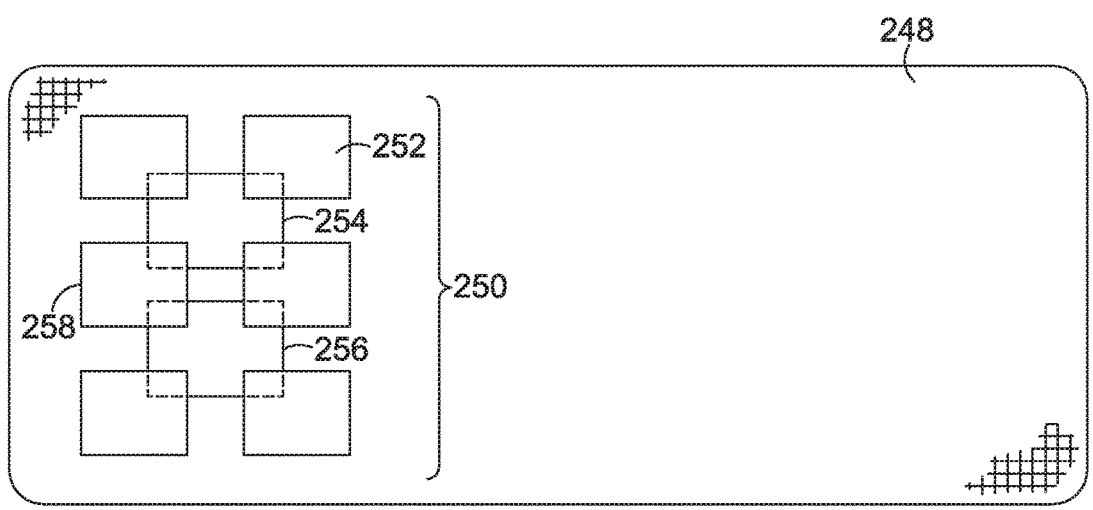
FIG. 29 is a top view of an array of detection pads coupled a mattress topper material, in accordance with embodiments of the invention.

With reference now to FIGS. 28 and 29, embodiments of an occupancy detection system include incorporating a detection material, such as one or more detection pads, into a mattress topper material of an automated mattress. In the example of FIG. 28, an automated bedding system 238 includes a mattress topper 240 having detection pads 242 and 244 incorporated into the material of the mattress topper 240. In one embodiment, the detection pads 242 and 244 are aluminized sections applied to the topper material of mattress topper 240. In further embodiments, mattress topper 240 is fused with a metallic material, and detection pads 242 and 244 are pre-applied, metalized areas on the surface of mattress topper 240.

As shown in the automated bedding system 246 of FIG. 29, and array 250 of multiple detection pads 252 may be coupled to a surface of a mattress topper 248. In embodiments, a detection pad 252 may be an aluminized polymer-material pad positioned on the mattress topper 248 with a conductive side facing upward, and arranged in a variety of positions. In further embodiments, detection pads 252 may be overlapped, arranged on left and/or right sides of a mattress topper 248, or otherwise configured to provide an area of detection with respect to the automated bedding system 246. In one embodiment, a plurality of detection pads 252 are arranged in an array 250 configuration such that a position of a single occupant of a bed can be located.

For example, detection pads 252 in FIG. 29 may be aluminized, polymer-material panels placed in an array 250 to determine an occupant's position, by overlapping with detection pads 254 and 256. In one example, a detection pad 258 is coupled to and/or overlaps with both detection pads 254 and 256, and is positioned in the middle of the array 250 to detect occupancy with respect to both sides of a mattress (e.g., a first occupant lying on a left side of a bed, and a second occupant lying on a right side of a bed, with the heads of each occupant hear the first end 214). In some embodiments, a non-conductive material may be used to arrange the array 250, and can be coupled directly or indirectly to the aluminized polymer material of detection pads 252, 254, 256, and 258.

In one embodiment of the invention, an aluminized, polymer detection material may be tied directly to a helical spring of an automated bedding system for detection. For example, a detection material may be coupled to an innerspring unit of an automated bedding system, to create a single sensor from the combined detection of each spring in the innerspring unit. In another embodiment, individual pocket coils of a mattress could become individual occupancy detectors as the coils are insulated from one another. As such, the pocket coils could serve as an array of individual sensors. In some embodiments of the invention, capacitive detectors such as aluminized polymer pads may be used with an automated bedding system mattress that includes pocket coils, memory foam, and/or air. For example, two or more aluminized polymer material sensors may be coupled to a platform of an automated bedding system to generate at least two distinct zones of detection with respect to be bed. In some embodiments, aluminized polymer material sensors and/or pocket coils could be used to identify multiple, individual areas and/or zones on a bed for detection of occupancy.

Various embodiments of the invention utilize the occupancy detection systems of FIGS. 25-29 for determining occupancy of an automated bedding system, and for triggering and/or activating one or more controls and/or features associated with the automated bedding system. For example, one or more Mylar® detection pads may be used to determine when an occupant exits a bed, which may trigger one or more commands associated with the bed, such as turning on a light on that occupant's side of the bed. As such, the underbed lighting on a first user's side of a bed may be illuminated based on detection of that first user exiting the bed.

The features triggered by changes in occupancy detection may be dependent on the time of day during of the occupancy determination. For example, upon determining a change in occupancy at a particular time of night (i.e. a determination that a user has exited a bed in the middle of the night) may trigger the turning on of lights associated with a bathroom, such as a light in the bathroom and/or a series of lights along a path to the bathroom. In further embodiments, a change in occupancy detection may trigger one or more features associated with a remote controller of an automated bed. For example, an occupancy change may trigger an alarm to chime, which could turn on one or more lights in response to triggering the remote. In further embodiments, features that are activated/triggered by a change in occupancy detection (such as a detection panel sensing the absence of a person) could be deactivated and/or timed out after a particular amount of time. In another embodiment, a snooze feature may be incorporated into the detection system such that an occupancy detection that triggers a particular feature of the automated bedding system may be postponed and/or delayed.

In one embodiment of the invention, the occupancy detection system may be provided for use with a non-adjustable bed, such as a child's bed. As such, a detection pad, detection grid, and/or detection strip feature discussed in FIGS. 25-29 may be incorporated into a non-adjustable bed. In one embodiment, the occupancy detection system may be provided as a kit for incorporating into an existing, non-adjustable bed. The system may be used to detect occupancy with respect to the non-adjustable bed, such as alarming if a child gets out of bed, by chiming a bed remote and/or causing a light to come on in a room. In one embodiment of the invention, depending on a time of night when the change in occupancy detection is sensed, one or more features of the bed system may be triggered, such as turning on lights to a child's bathroom, etc.

In embodiments of the invention, occupancy detection triggers both activation and deactivation of features associated with a bed. For example, an occupancy detection system may determine that a person has entered a bed, which may trigger the system to turn off the lights in the room. Accordingly, in one embodiment, a first change in occupancy determination (a user exiting a bed) may trigger lights to be turned on in a room, while a second change in occupancy determination (a user returning to bed) may trigger the lights to turn back off. In some embodiments, lights may be dimmed upon sensing a user getting into bed, timed to turn off after a particular amount of time passes after occupancy is detected, and/or dimmed to dark upon occupancy detection. For example, lights may be dimmed to dark upon detection of an occupant returning to bed.

Further embodiments of the invention include coordinating of additional features associated with the occupancy detection system, such as a home alarm system that may be set and/or turned on based on detecting that a person has gotten into bed. In further embodiments, the home alarm system may be deactivated upon the person exiting the bed. In yet another example, exterior lights of a house may be turned on based on detecting a user exiting the bed, such as a front porch light turning on when a user exits the bed in the middle of the night.

In one embodiment, the occupancy detection system may be used in a home care situation for an elderly or disabled individual. Accordingly, the system may be programmed to trigger certain alarms when the elderly or disabled person gets out of bed, such as by chiming a remote and/or alarm feature of the occupancy detection system. In another embodiment, various features of a user's home may be coordinated to operate in response to determinations by the occupancy detection system. For example, if the occupancy detection system determines that a user is in bed, the home environment system (i.e. the Heating, Ventilation and Air Conditioning (HVAC) system) may be adjusted to a user-specified night setting. Similarly, if the occupancy detection system determines that a user has exited a bed, such as determining that a detection pad no longer senses the presence of the occupant, then the HVAC system may be triggered to change to daytime settings.

In some embodiments of the invention, the occupancy detection system may be incorporated into a variety of other household devices, other than a bed or bedding system. For example, an occupancy detection system may be incorporated into a door mat, an area rug, and/or a stairway of a home for indication of occupancy presence. For example, in one embodiment, the occupancy detection system may be incorporated into a runner on a basement stairway. Based on a determination of occupancy, the system may trigger an audible alarm to alert that presence is detected, such as alerting a warning signal when a child's presence is detected near basement stairs.

Figure 30:
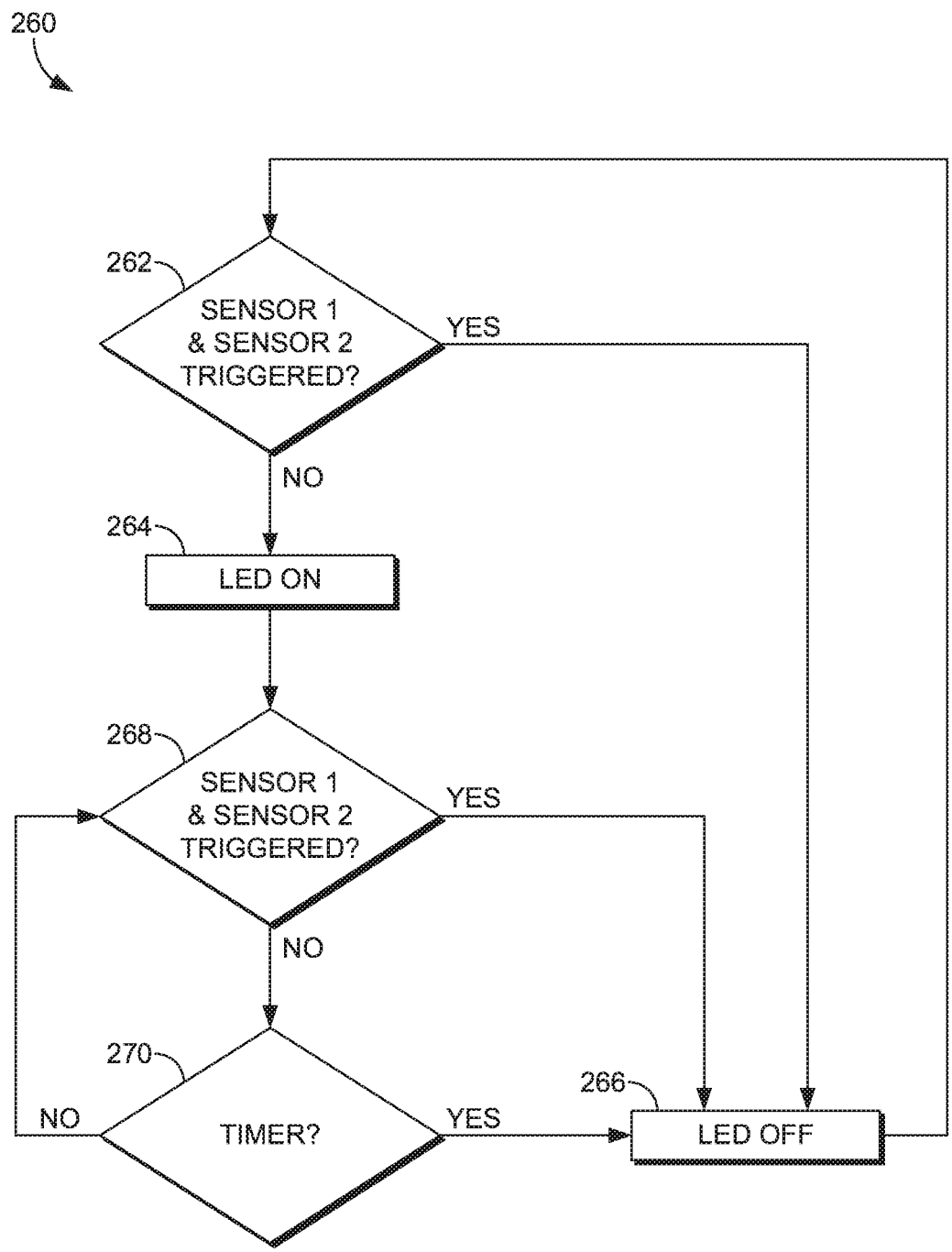
FIG. 30 is a flow diagram of an exemplary method of detecting occupancy with respect to a bed, in accordance with embodiments of the invention.

Having described various embodiments of detection using the occupancy detection system, exemplary methods for implementing the occupancy detection system are discussed with reference to FIGS. 30-32. In particular, FIG. 30 is flow diagram 260 of an exemplary dual-sensor method of detecting dual occupancy with respect to an adjustable bed. At block 262, a determination is made whether a first sensor and a second sensor have been triggered. For example, software executed by the system may determine whether both occupants of a bed are present, having a sensor associated with a potential position of each occupant. If both of the sensors have not been triggered, at block 264, an LED may remain on. For example, if both occupants have not gotten into bed yet, LED under-bed lighting may remain lit. Alternatively, if sensor 1 and sensor 2 have been triggered, at block 266, an LED may be turned off. For example, in FIG. 25, if detection pads 218 and 220 are both triggered to indicate presence of two individuals in the automated bedding system 210, then a determination may be made to turn off the lights in a room, such as an under-bed lighting feature of a bed.

At block 268, the occupancy detection system continues to check whether the first and second sensors have been triggered. If the sensors have not been triggered, at block 270, a timer may be initiated to turn off the light at block 266 after a specified interval of time has passed. In other words, the system will not wait all night for both occupants to get into bed before turning off the lights. Alternatively, if a timer is not initiated, the method returns to block 268 where the system continues to check for a triggering of the first and second sensors before turning off the LED. In one embodiment, a user may indicate bed system that only one occupant is present, which may permit the system to only require detection from a single sensor before turning off the lights.

Figure 31:
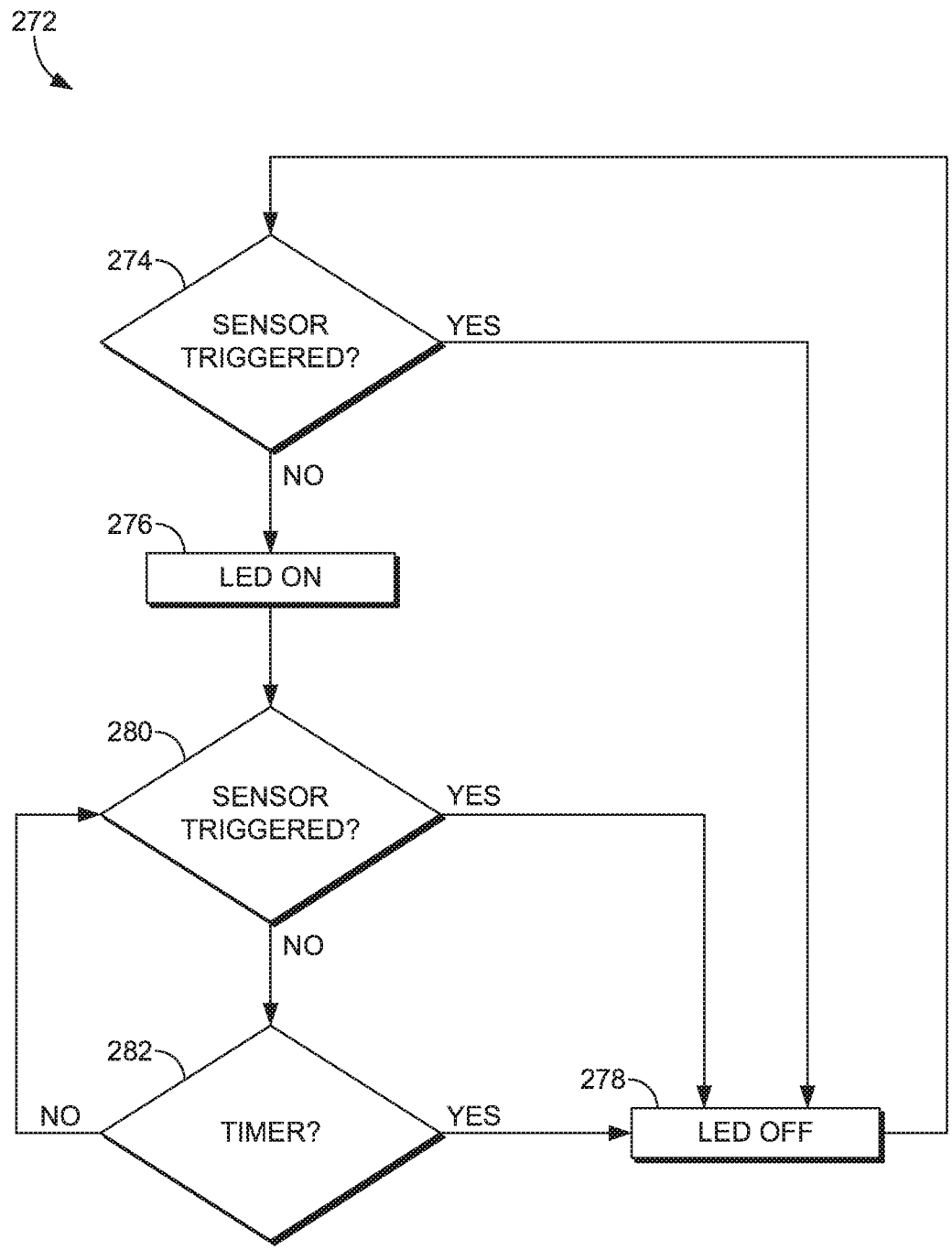
FIG. 31 is a flow diagram of an exemplary method of detecting occupancy with respect to a bed, in accordance with embodiments of the invention.

Turning now to FIG. 31, a flow diagram 272 of an exemplary single-sensor method of detecting occupancy with respect to a bed is provided. At block 274, a determination is made whether a sensor has been triggered. At block, 276, if the sensor has not been triggered, the LED remains on. For example, if a sensor of an automated bed has not determined that an occupant has entered the bed, then underbed, LED lighting may remain on to illuminate a path to the bed. However, if the sensor is triggered at block 274, then the LED is turned off at block 278 (e.g., the occupant gets into bed and triggers the sensor). Having left the LED on at block 276, a determination is made at block 280 as to whether the sensor is subsequently triggered. If the sensor has been triggered, the LED is turned off at block 278. If the sensor has not been triggered, at block 282, a timer may be initiated to determine when a threshold amount of time has passed. After an amount of time has passed, the timer may trigger the LED to turn off at block 278. Alternatively, upon not satisfying the threshold of time by the timer at block 282, the method may return to block 280 to make a determination of whether the sensor has been triggered.

Figure 32:
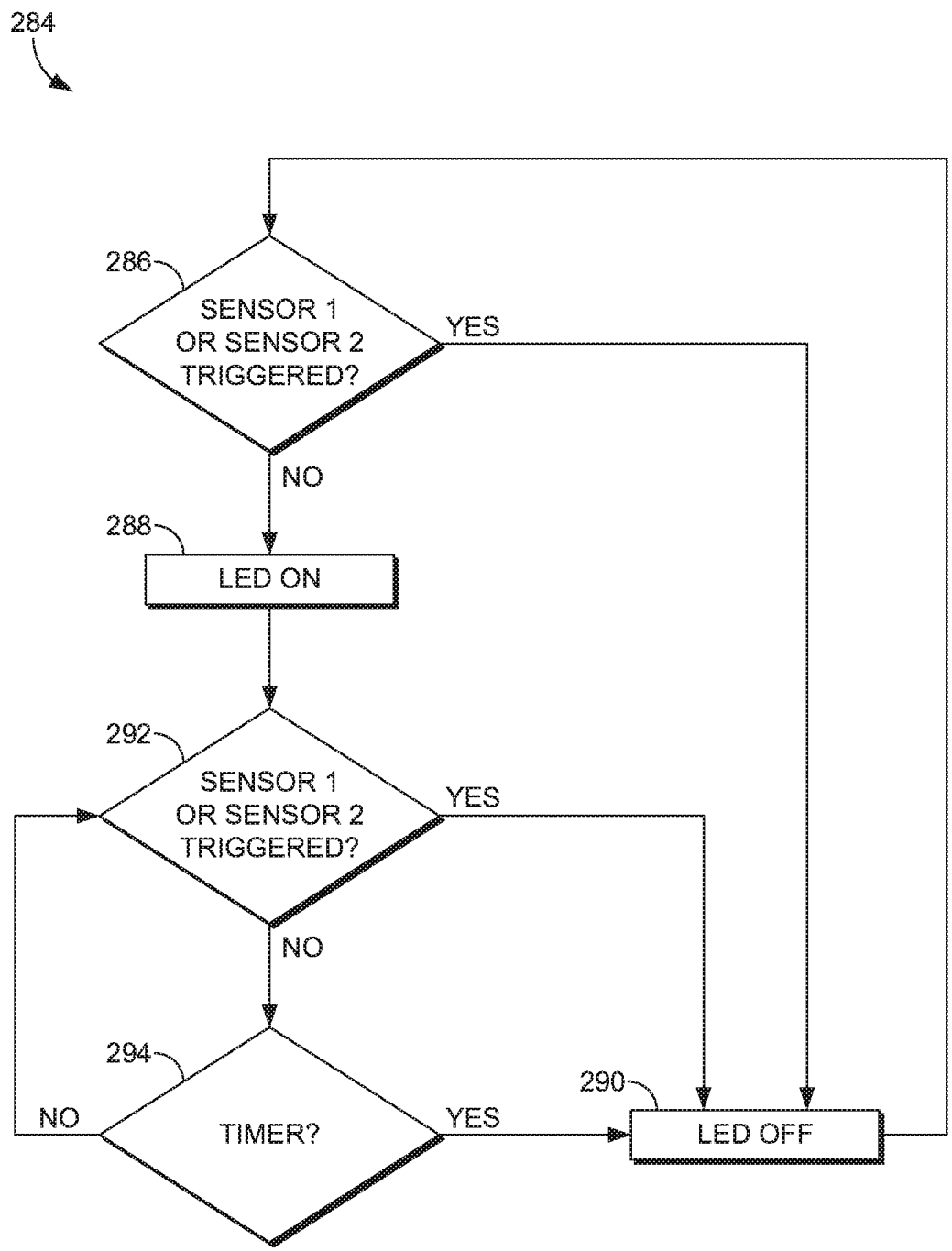
FIG. 32 is a flow diagram of an exemplary method of detecting occupancy with respect to a bed, in accordance with embodiments of the invention.

With reference finally to FIG. 32, a flow diagram 284 of an exemplary dual-sensor method of detecting single occupancy with respect to a bed is provided. At block 286, a determination is made whether a first sensor or a second sensor has been triggered. For example, a bed may have two (or more) sensors that define at least two distinct areas of the bed for detection. If neither of the sensors has been triggered, at block 288, an LED may remain on. Alternatively, if sensor 1 or sensor 2 has been triggered, at block 290, an LED may be turned off. For example, if one of two sensors is triggered, underbed LED lights may be turned off. In another example, as depicted in FIG. 25, if detection pad 218 or detection pad 220 is triggered to indicate presence of a body in the automated bedding system 210, then a determination may be made to turn off the lights in a room.

At block 292, the occupancy detection system continues to check whether the first or second sensor has been triggered. If neither sensor has been triggered, at block 294, a timer may be initiated to turn off the light at block 290 after a specified interval of time has passed. Alternatively, if a timer is not initiated, the method returns to block 292 where the system continues to check for a triggering of the first and second sensors before turning off the LED.

As will be understood, although the examples of FIGS. 30-32 refer to triggering of sensors corresponding to turning an LED light on and off, various embodiments of the invention may trigger additional and/or alternative features associated with an automated bedding system. In other words, although examples of triggering lighting are discussed (in particular, under-bed mounted LED lighting), other features such as a bathroom light, a bedroom fan, house lights, etc., may be triggered by an occupancy determination with respect to a bed. Additionally, the software associated with embodiments of the system may be customized to a particular system in that both single-occupant and dual-occupant features may be adjusted to respond differently to various triggering events.

Accordingly, in a single-occupant embodiment, undermount LED lighting on an adjustable bed may remain on if the user/occupant is not present, and may be turned off once the occupant is detected. In one embodiment of a dual-occupant detection system, the software associated with the sensors may be programmed such that the presence of both users is required before a feature is activated/altered (e.g., both occupants must be present in the bed before the lights will turn off). In another embodiment of a dual-occupant detection system, the system may require that at least one user is present before the lights can be turned off. Further, once the first occupant is present, the system may automatically trigger a timer for turning off the lights without requiring the second occupant to be present in the bed (i.e. a first occupant need not sleep with the lights on all night). However, if the second occupant enters the bed before the timer is complete, the triggering of the second sensor may initiate turning off the lights (without requiring the system to fulfill the entire timer waiting period).

In one embodiment of the invention, a single-occupant system may utilize two sensors for detecting occupancy in an automated bed. The first sensor may make a determination of presence of an occupant in the bed, thereby triggering the turning off of bed lighting (or other associated bed features) without requiring the second sensor to be triggered. As the occupant sleeps, the occupant may shift away from an area of capacitance associated with the first sensor, no longer triggering the first sensor. For example, the occupant may roll from one side of the bed to another. In embodiments, the software of the system may be programmed to allow an amount of delay (i.e. to wait a threshold amount of time) after the first sensor no longer senses an occupant, before triggering an associated feature (e.g. before turning on lights because an occupant has left one side of the bed). If the second sensor detects the occupant within the delay period of time (i.e. before the threshold amount of time expires), then the bed may continue to function as if an occupant's presence has been maintained. In other words, if the first sensor no longer senses the occupant, but the second sensor detects the occupant within a specified amount of time, the lights need not be turned on because the occupant has just moved from one side of the bed to the other.

In one embodiment, a dual-occupant system may be programmed to permit certain features to be triggered that would otherwise inactive with a single-sensory system. For example, in an automated bed system with two sensors, a first occupant may trigger a first sensor and a second occupant may trigger a second sensor. With both sensors triggered, the system may be programmed to turn off the lights associated with the bed (e.g. the underbed LED lighting). If the first occupant exits the bed, underbed lighting may be activated. For example, one occupant may exit the bed to use the restroom in the middle of the night, and lighting may be illuminated even though the second occupant is still present in the bed. In some embodiments, features such as underbed lighting may be occupant-specific, such as underbed lighting only illuminating on the side of the bed associated with the first occupant and/or first sensor.

In some embodiments, underbed lighting features associated with an automated bedding system may include photocell light technology. Accordingly, the underbed lighting may not illuminate until night. As such, in some embodiments, the lights will remain on as long as the room is dark (i.e., it is night) and no occupant is present in the bed (i.e., occupant detection is not sensed according to embodiments of the invention).

In embodiments of the invention, the detection material of the detection pads, wire grid, and/or detection strips and the metalized areas of the mattress topper material are adapted to have a voltage based on proximity of an object to the detection material or metalized area. Such voltage information is collected via the detection material and received by a processor, which determines when a change in voltage satisfies a threshold. Once a particular change in capacitance satisfies a threshold, a corresponding function associated with the automated bed may be initiated. In embodiments, a threshold for initiating a corresponding function includes a particular amount of change in voltage within a particular amount of time. For example, when using capacitance information to turn lights on/off, a particular amount of change in voltage may be required during a particular amount of time before satisfying the threshold indicating that a person has exited the bed (and before the lights may be turned on). Similarly, a particular threshold value of voltage change may be required by the processor, over a particular amount of time, before making a determination that a person has re-entered the bed (and before the lights can be turned off again). In embodiments, a processor continuously receives capacitance monitoring information, and monitors how quickly a change in capacitance occurs (how quickly the delta changes) to determine if a big enough change has occurred in a certain amount of time to satisfy a threshold, and trigger the corresponding function. Accordingly, based on satisfying a particular threshold, various features associated with the automated bedding system 210 may be activated and/or enabled.

Figure 33:
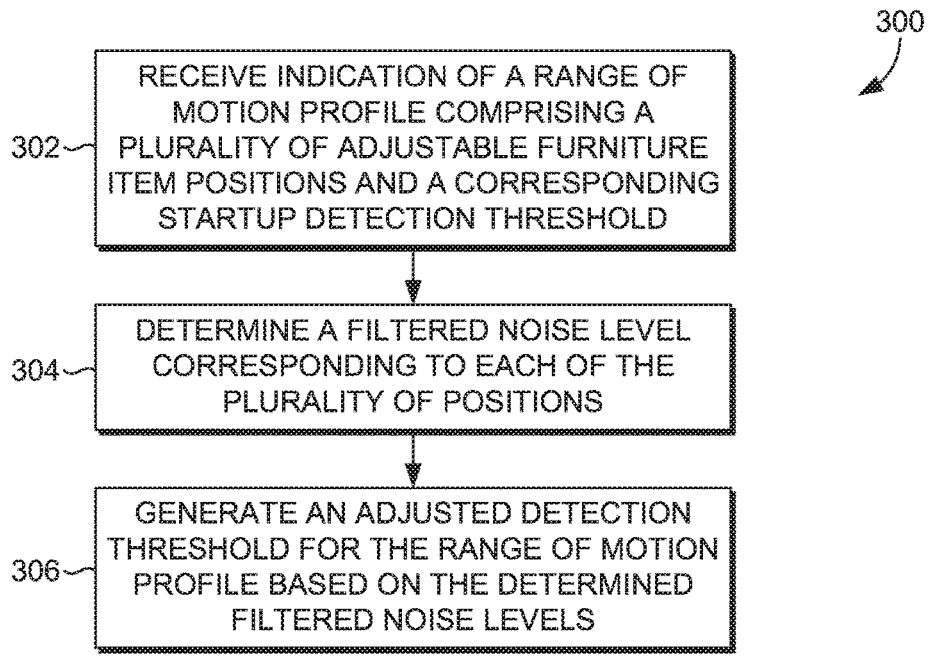
FIG. 33 is a flow diagram of an exemplary method for characterizing an occupancy detection system, in accordance with embodiments of the invention.

With reference now to FIG. 33, a flow diagram 300 of an exemplary method for characterizing an occupancy detection system is provided in accordance with embodiments of the invention. At block 302, an indication of a range of motion profile is received. The range of motion profile may include a plurality of adjustable furniture item positions, such as positions of an automated furniture item as manipulated by a user and/or positions associated with occupancy detection as part of an occupancy detection system. Additionally, the range of motion profile includes corresponding startup detection thresholds for each of the plurality of adjustable furniture item positions. Such startup detection thresholds may include, in some embodiments, a capacitive detection threshold for determining a change in occupancy with respect to a particular position of the furniture item. As such, the received indication of a range of motion profile for a particular automated furniture item may include a plurality of positions that a user may experience while manipulating the automated furniture item, as well as a plurality of startup detection thresholds that establish a baseline expected change in capacitance for triggering an occupancy indication.

At block 304, a filtered noise level is determined, which corresponds to each of the plurality of positions. In one embodiment, the noise level associated with each of the positions of the range of motion profile are received sequentially by running the automated furniture item through a complete cycle and/or range of motion. In one aspect, the noise level associated with each position throughout the range of motion of the automated furniture item is determined and compared to the corresponding startup detection threshold. As such, at block 306, and adjusted detection threshold is generated for the range of motion profile based on the determined filtered noise levels. In some aspects, a first position of the automated furniture item may cause little to no interference with the occupancy detection capabilities of a detection system. As such, the startup detection threshold corresponding to that first position may maintain its original detection threshold as its adjusted detection threshold. In other words, the amount of change in capacitance may remain the same as the detection threshold and baseline level of detection remain consistent with the startup values. By contrast, in another example, a second position of an automated furniture item and/or series of positions of the automated furniture item (while approaching or returning from a particular position) may generate additional noise that results in the determination of an amount of noise to be filtered for that second position, and the determination of an adjusted detection threshold for determining occupancy during articulation to and/or through that position in the range of motion.

Figure 34:
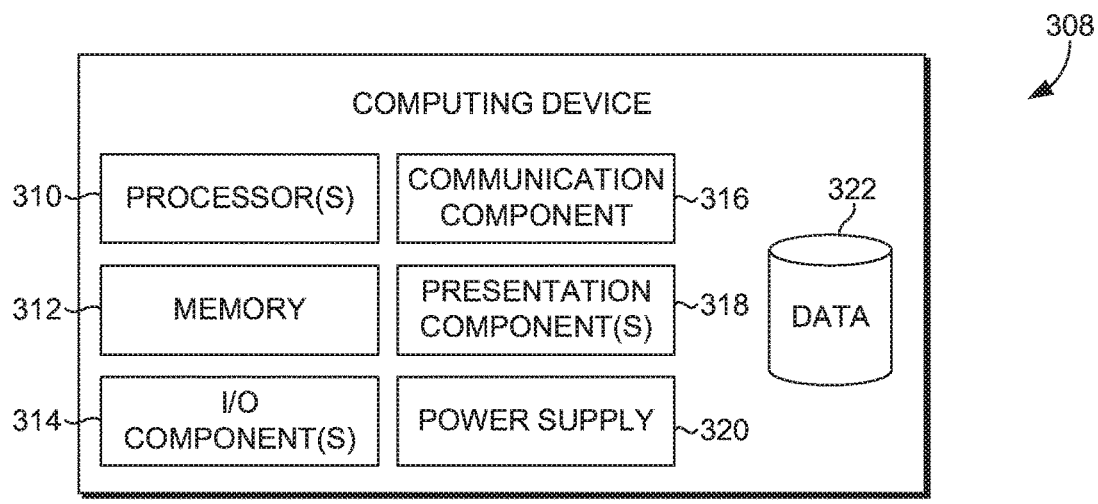
FIG. 34 is an exemplary computing device for use with embodiments of the invention.

In FIG. 34, an exemplary computing device 308 for use with embodiments of the invention includes a processor 310, a memory 312, input/output components 314, a communication component 316, presentation components 318, a power supply 320, and a database 322. Various components, in addition to or in alternative to those depicted in association with the exemplary computing device 308 may be utilized during characterization and/or calibration for occupancy detection, according to embodiments of the invention.

The perspective view of the position profile characterization 324 in FIG. 35 includes an exemplary mattress 28 in a first position 326, as controllable by an adjustable bed frame 114 supporting the mattress 28, having a first end 14 opposite a second end 16. In embodiments, the first position 326 represents a single position in the range of motion profile for a particular automated furniture item, such as a bed. The graphical depiction of first position characterization 328 includes a baseline 330, a noise level 332, and a startup detection threshold 334. Based on a minimum noise level 332, the detection threshold 334 remains the same for the first position 326, in one embodiment.

In FIG. 36, the position profile characterization 336 includes the mattress 28 in a second position 340 having a raised head 338, as controllable by the adjustable bed frame 114 supporting the mattress 28. In embodiments, the second position 340 represents a single position in the range of motion profile for a particular automated furniture item, such as a bed. The graphical depiction of second position characterization 342 includes a baseline 330, a noise level 344, a startup detection threshold 334, an adjusted baseline 346, and an adjusted threshold 348. In this example, the detected noise level 344 resulted in a determination that the baseline for detection during and/or near the second position 340 is actually above the original baseline 330, and instead is moved to the adjusted baseline 346. As such, an indication of no change in capacitance, and therefore no change in occupancy with respect to the mattress 28 when in the second position 340, is calibrated to correspond to an amount of noise 344 generated by the raised head 338. Additionally, to trigger a change in capacitance that indicates a change in occupancy, the change in capacitance must now exceed the adjusted threshold 348 before triggering an occupancy indication with respect to the adjusted baseline 346.

In FIG. 37, the position profile characterization 350 includes the mattress 28 in a third position 354 having a raised foot 352, as controllable by the adjustable bed frame 114 supporting the mattress 28. In embodiments, the third position 354 represents a single position in the range of motion profile for the particular automated furniture item. The graphical depiction of the third position characterization 356 includes a baseline 330, a noise level 358, a startup detection threshold 334, an adjusted baseline 360, and an adjusted threshold 362. In this example, the detected noise level 358 resulted in a determination that the baseline for detection during and/o near the third position 354 is actually above the original baseline 330, and instead is moved to the adjusted baseline 360. As such, an indication of no change in capacitance, and therefore no change in occupancy with respect to the mattress 28 when in the third position 354, is calibrated to correspond to an amount of noise 358 generated by the raised foot 352. Additionally, to trigger a change in capacitance that indicates a change in occupancy, the change in capacitance must now exceed the adjusted threshold 362 before triggering an occupancy detection with respect to the adjusted baseline 360.

In FIG. 38, the position profile characterization 364 includes the mattress 28 in a fourth position 366 having a raised head 338 and a raised foot 352, as controllable by the adjustable bed frame 114 supporting the mattress 28. In embodiments, the fourth position 366 represents a single position in the range of motion profile for the particular automated furniture item. The graphical depiction of the third position characterization 367 includes a baseline 330, a noise level 369, a startup detection threshold 348, an adjusted baseline 368, and an adjusted threshold 370. In this example, the detected noise level 369 resulted in determination that the baseline for detection during and/or near the fourth position 366 is actually above the original baseline 330, and instead is moved to the adjusted baseline 368. As such, an indication of no change in capacitance, and therefore no change in occupancy with respect to the mattress 28 when in the fourth position 366, is calibrated to correspond to an amount of noise 369 generated by the raised head 338 and the raised foot 352. Additionally, to trigger a change in capacitance that indicates a change in occupancy, the change in capacitance must now exceed the adjusted threshold 370 before triggering an occupancy detection with respect to the adjusted baseline 368.

Figure 39:
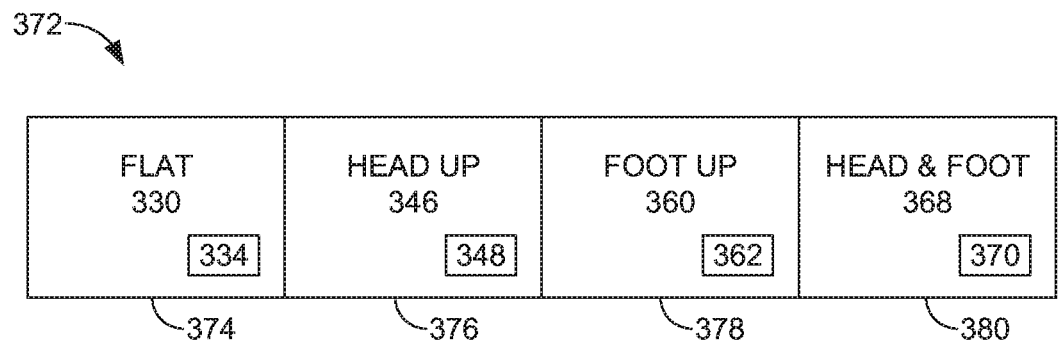
FIG. 39 is an exemplary system diagram for position profile characterization, in accordance with embodiments of the invention.

Turning next to FIG. 39, an exemplary system diagram for position profile characterization 372 is provided in accordance with embodiments of the invention. The position profile characterization 372 includes, in one embodiment, a range of motion characterized by a first profile phase 374, a second profile phase 376, a third profile phase 378, and a fourth profile phase 380. During each phase of the profile characterization 372, as discussed above, a particular position is associated with a detection threshold corresponding to the particular position within the range of motion. As such, each position of the automated furniture item is monitored during characterization to determine an accurate limit for occupancy detection. In one embodiment, profile characterization 372 includes a flat position 330 with a detection threshold 334, a head up position 346 with an adjusted detection threshold 348, a foot up position 360 with an adjusted detection threshold 362, and a head and foot up position 368 with an adjusted detection threshold 370. As will be understood, during calibration throughout an entire range of motion of an automated furniture item, varying numbers of positions may be included in the various profile phases. Additionally, individual positions may be characterized at different phases of travel, such as a characterization of a head approaching a head up position 346, and a characterization of a head returning back down from a head up position 346. Similarly, a full range of motion profile may be characterized to adjust detection thresholds for intermediate positions of an automated furniture item, such as transition positions between multiple specified positions of the automated furniture item. Such intermediate positions may also be characterized such that a baseline detection level and corresponding threshold for capacitance detection may be adjusted. In further aspects, based on determining an adjusted detection threshold 348 throughout a range of motion of an automated furniture item, the control component of the automated furniture item and/or occupancy detection system associated with the automated furniture item may automatically adjust one or more detection thresholds throughout a range of motion to prevent "false" readings of occupancy attributed to noise. Further, such "false" readings of occupancy may refer to false indications of a change in occupancy during articulation of the automated furniture item based on a level of noise interfering with the baseline and threshold comparison throughout the phases of motion.

Figure 40:
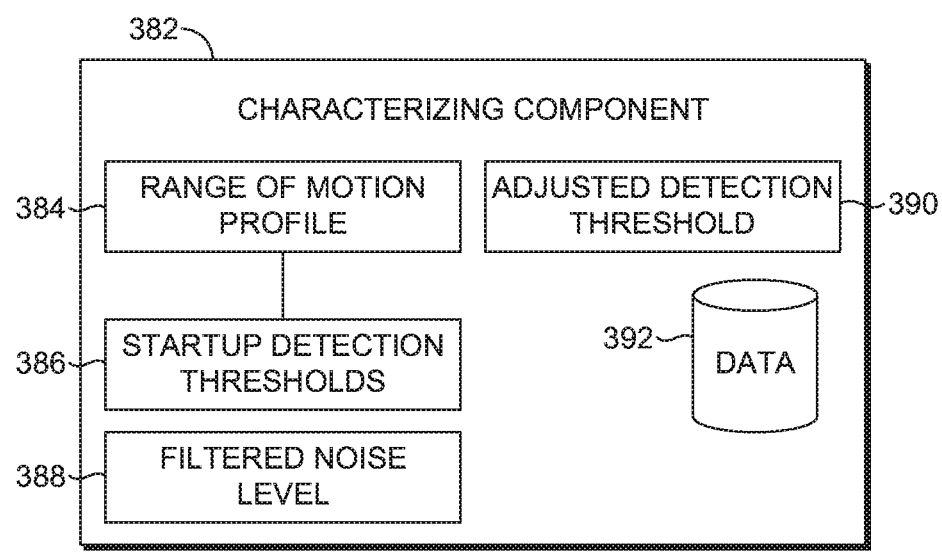
FIG. 40 is an exemplary system diagram of a characterizing component, in accordance with embodiments of the invention.

Accordingly, with reference finally to FIG. 40, an exemplary system diagram of a characterizing component 382 is provided in accordance with embodiments of the invention. The characterizing component 382 may be incorporated into one or more features of a control component of an automated furniture item, and need not be provided as a separate component. Instead, in some embodiments, the features of the characterizing component 382 may be automatically performed during a particular phase of use of an automated furniture item, such as an initial startup phase. In the example of FIG. 40, the characterizing component 382 includes a range of motion profile component 384, a startup detection thresholds component 386, a filtered noise level component 388, an adjusted detection threshold 390, and a database 392. In some embodiments, one or more features of the characterization component 382 may be utilized by a control component of an automated furniture item, and the results of such characterization may be stored for subsequent determinations of occupancy with respect to one or more adjusted detection thresholds and baselines, such as the database 392. In one aspect, a characterization profile may be processed with respect to an automated furniture item upon initial setup, or upon user prompt for a subsequent characterization. For example, upon relocating an automated furniture item from one location to another, a user may desire to run a characterization of the baseline and threshold detection levels throughout the range of motion, to account for any changes in the noise level affecting such baseline and threshold levels.

Figure 41:
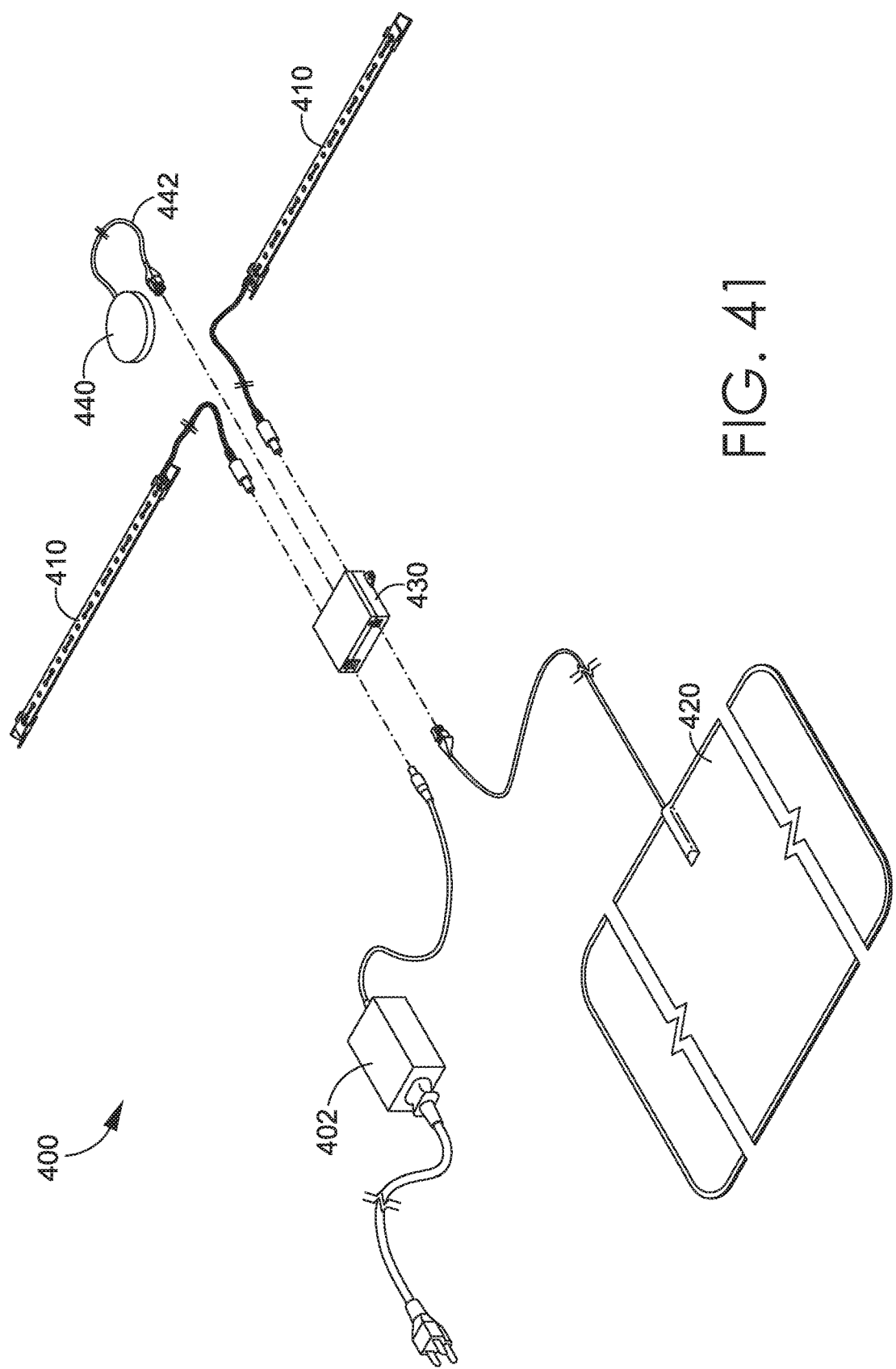
FIG. 41 is a perspective view of a standalone capacitance detection device, in accordance with embodiments of the invention.

Embodiments herein may relate to a standalone capacitance detection device 400 for integration with a furniture item. As shown in FIG. 41, the standalone capacitance detection device 400 may comprise: a capacitance detection sensor 420 for detecting and/or sensing an indication and/or measurement of a change in capacitance; and a control component 430 for generating and communicating various commands. The standalone capacitance detection device 400 may also include a power supply 402 for supplying power to the standalone capacitance detection device 400. As such, embodiments of the standalone capacitance detection device 400 may be configured to receive indications of capacitance detection in association with both automated and non-automated sources, such as automated and non-automated furniture items. While depicted in various examples as being associated with a capacitance detection in relation to an automated furniture item, in further aspects, the standalone capacitance detection device 400 may be coupled to any furniture item, with or without a control and/or power source associated with the furniture item, according to various embodiments. In further aspects, the standalone capacitance detection device 400 may additionally include one or more light sources 410 and a manual control device 440.

In one embodiment of the invention, manual control device 440 may be configured to receive one or more commands, and communicate the one or more commands, via a manual control device 440 wire assembly, to the standalone capacitance detection device 400. Commands may be communicated, for example, via the manual control device wire assembly 442. In some aspects, the manual control device 440 may be a touch sensing or other control device for receiving manual control indications from a user. As such, the standalone capacitance detection device is configured to carry out both automated functions (by virtue of the capacitance detection sensor 420 and/or control component 430), or by manual input (such as the received commands via the manual control device 440). In some aspects, the manual control device 440 is a single input component, such as a single button, which may receive a plurality of commands based on different input patterns, such as different touch input types and/or gestures. For example, calibration of the standalone capacitance detection device 400 may be initiated by a touch and hold gesture, for a predetermined period of time (e.g., a three-second contact that initiates calibration). Additionally, the manual control device 440 may be configured to receive inputs corresponding to manual changes in lighting settings. For example, the one or more light sources 410 may be dimmed or brightened based upon an input received at the manual control device 440.

Figure 42:
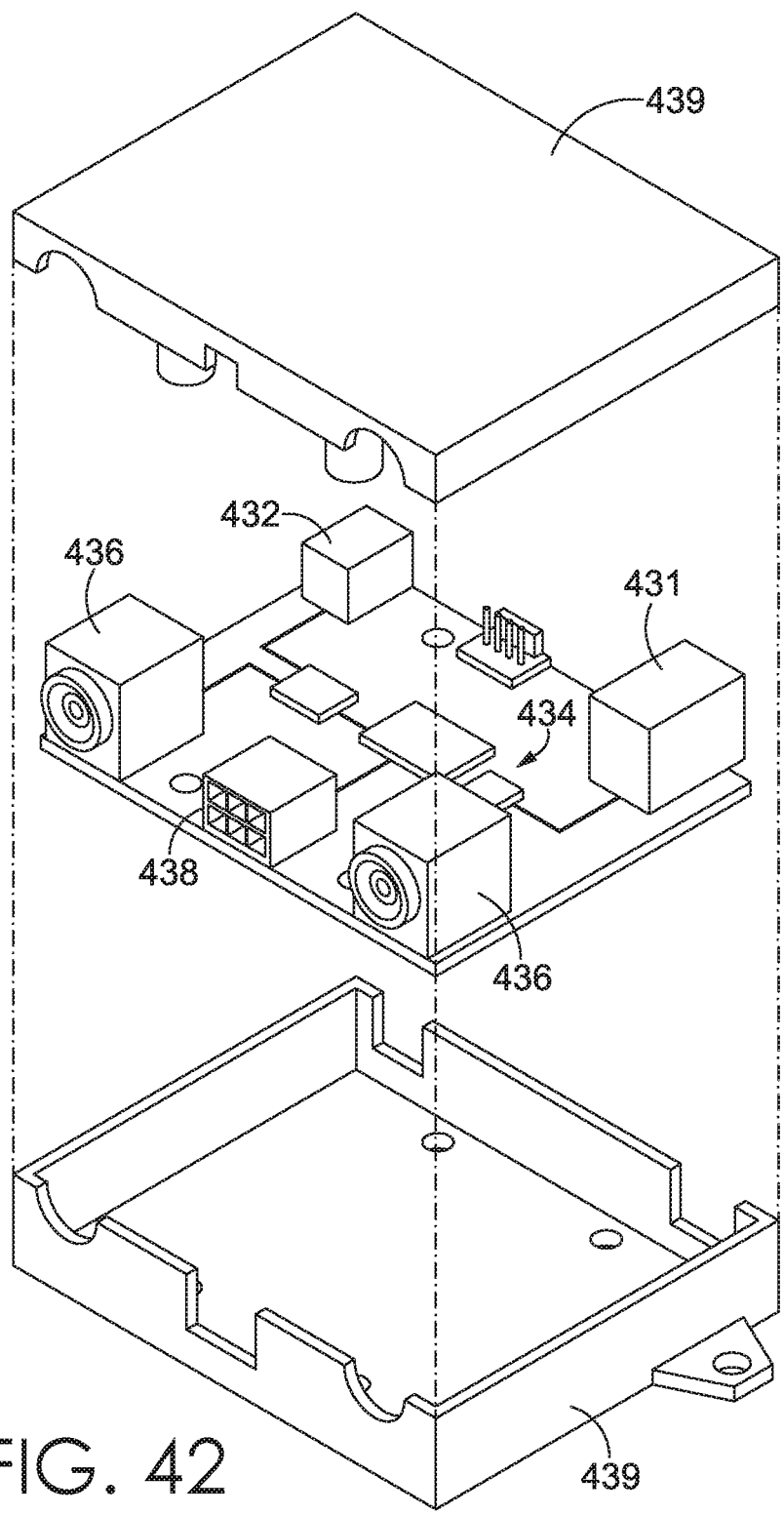
FIG. 42 is a perspective view of an exemplary control component of a standalone capacitance detection device, in accordance with embodiments of the invention.

Turning now to FIG. 42, a control component 430 and subcomponents thereof are depicted according to one embodiment of the invention. The control component 430 may include a power supply input 431 for receiving power. In some aspects, the control component 430 may be configured to receive a first capacitance indication from the capacitance detection sensor 420 via a capacitance detection sensor input 432. The control component 430 may also be configured to generate a first lighting command associated with the first capacitance indication, for example, by chipset 434 and communicate the first lighting command to the one or more light sources 410 via one or more light sources outputs 436. Further, the control component 430 may be configured to receive a second capacitance indication from the capacitance detection sensor 420 via the capacitance detection sensor input 432; generate a second lighting command associated with the second capacitance indication, by chipset 434; and communicate the second lighting command to the one or more light sources 410 via one or more light sources outputs 436. The control component 430 may also include a manual control device input 438 for receiving any number of commands for controlling the standalone capacitance detection device 400 and its various subcomponents. Additionally, the control component 430 and the subcomponents thereof may be at least partially contained in, for example, one or more housings 439.

In some aspects, the control component 430 may be configured to control one or more light sources 410 using a variety of control and/or activation features, such as a pulse-width modulation (PWM) technique, that intermittently provides power to the one or more light sources 410 at a plurality of on intervals. Further, in some embodiments, the control component 430 may be configured to control one or more features of the capacitance detection sensor 420 such that capacitance may be measured between the plurality of on intervals, or during a light-off phase, at the one or more light sources 410. As such, a change in capacitance may be monitored/detected when the one or more light sources 410 are turned off, thereby eliminating disruptions in the electrical field caused by supplying power to the one or more light sources 410. This can be accomplished, for example, using specialized chipset 434 in the control component 430.

By way of example only, the PWM technique may provide power to the one or more light sources 410 at particular number of intervals per second, such as a light pulsing between 350 and 550 intervals per second. In another aspect, the one or more light sources 410 may be pulsed at a rate between 400 and 500 intervals per second, while in further aspects, the light sources 410 may be pulsed at about 450 intervals per section. As can be appreciated, PWM operates to generate light pulses at intervals such that the one or more light sources 410 appear to be in a constant on-state to a user. That is, the intervals are set such that the off intervals cannot be perceived by a user.

In some embodiments, based on providing power to the one or more light sources 410 at particular intervals per second, one or more features of the control component 430 may be utilized to coordinate both 1) identifying a light-off phase, and 2) sample at least one measurement of the change in capacitance during the identified light-off phase (i.e., between the light-on intervals, such as the exemplary 450 intervals per second). Continuing with this example, the control component 430 may be configured to communicate commands to the capacitance detection sensor 420 at a plurality of times corresponding to times between each of the intervals per second, such as a command to the capacitance detection sensor 420 that indicates a capacitance detection sample is to be taken during the light-off phase of the PWM activation.

In aspects herein, the first capacitance indication corresponds to a capacitance measurement that indicates that occupancy has been detected, and the second capacitance indication corresponds to a measurement that indicates that occupancy has not been detected. Said another way, the first capacitance indication may correspond to a person sitting or lying on a furniture item, and the second capacitance indication may correspond to a person leaving the furniture item. In further aspects, a first instance of capacitance detection may correspond to a change in capacitance from a first capacitance detection to a second capacitance detection (e.g., changing from a user not in the chair, to a seated user's detected presence), while a second instance of capacitance detection may correspond to a change in capacitance from the second capacitance detection to a third capacitance detection (e.g., changing from the seated user's detected presence, to the user exiting the chair).

In some aspects, the control component 430 may be configured to automatically calibrate one or more measurements associated with the standalone capacitance detection device 400. As such, in some embodiments, a control component 430 may be configured to automatically calibrate by measuring a baseline electric field associated with the furniture item and setting an occupancy threshold for associating with the particular furniture item. Calibration may be automatically initiated, for example, upon powering on the standalone capacitance detection device 400. In further embodiments, calibration may be accomplished by measuring a baseline electric field (and/or baseline level of noise) for the furniture item in which the standalone capacitance detection device 400 is integrated. Further, calibration may include setting a presence threshold and/or minimum change in capacitance based on the baseline electric field. In one embodiment of the invention, the presence threshold may correspond to a particular detected change ("delta" or minimum change) in capacitance that represents a change in capacitance associated with a human occupant. As such, a baseline level of detected capacitance may be determined, from which any additional amount of capacitance detected may, once surpassing the presence threshold, generate one or more responses by the standalone capacitance detection device 400.

Additionally, when an occupant or occupants are detected, the presence threshold may be recalibrated. In one embodiment, a presence threshold may be determined at a first timepoint upon a first calibration of the standalone capacitance detection device 400, with no occupant in/on the furniture item. At a second timepoint, a second calibration of the standalone capacitance detection device 400 may be carried out to determine a recalibrated baseline for detection with an occupant in/on the furniture item. As such, the recalibrated standalone capacitance detection device 400 may now monitor for changes in capacitance with reference to the recalibrated baseline and identify additional changes in capacitance, such as the occupant exiting the furniture item, or additional occupants entering the furniture item.

In one embodiment of the invention, when multiple occupants are detected, the presence threshold may be automatically recalibrated to correspond to a minimum change in capacitance for a particular occupant, such as the smallest occupant. Accordingly, automatic calibration may allow the standalone capacitance detection device 400 to be incorporated in any number of different types of furniture items by automatically calibrating the baseline electric field and presence threshold for a given furniture item. In one embodiment, the standalone capacitance detection device 400 may be incorporated into a number of different types of furniture items and remain responsive to changes in occupancy at various timepoints with various numbers of occupants.

Figure 43:
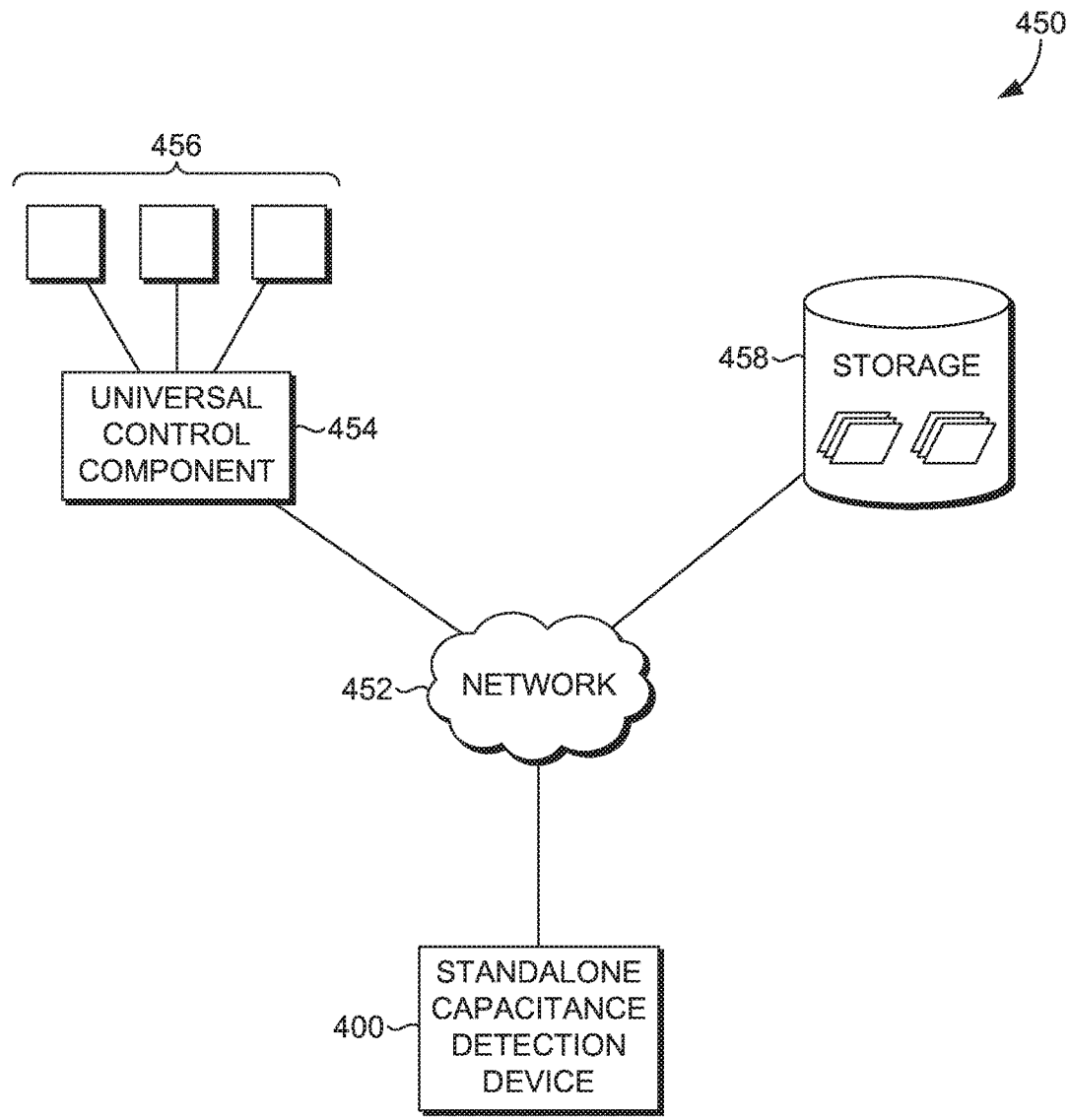
FIG. 43 is an exemplary system diagram of a distributed computing environment in which the standalone capacitance detection device may be implemented, in accordance with embodiments of the invention.

Turning now to FIG. 43, the standalone capacitance detection device 400 may be implemented as part of a distributed computing environment 450. In some aspects, the standalone capacitance detection device 400 may detect capacitance measurements that are associated with a capacitance signature of one or more users. In one embodiment, a capacitance signature associated with a particular capacitance measurement may refer to a threshold amount of change in capacitance that is generated by presence or absence of a particular user having a particular electric field associated with their body. Additionally, the standalone capacitance detection device 400 may communicate one or more capacitance measurements to the universal control component 454, via network 452. In one embodiment, the universal control component 454 may use the communicated one or more capacitance measurements to identify a capacitance signature corresponding to a particular person. The standalone capacitance detection device 400 may therefore be used to identify detection of presence or absence of particular users with respect to various furniture items where the standalone capacitance detection device 400 is being utilized.

Further, universal control component 454 may operate to adjust settings on any number of associated devices 456 associated with the particular person based an identified presence and/or absence. In one aspect, associated devices 456 may be associated with the particular system and/or entity, for example, via LPConnect® and/or LPSense® technology (produced by Leggett & Platt, Inc., of Carthage, Mo.), and stored in, for example, storage 458. Additionally, the universal control component 454 may identify and communicate settings associated with the standalone capacitance detection device 400. For example, if an identified user has a desired setting with respect to light brightness, the setting may be communicated to the standalone capacitance detection device 400, which may implement the desired setting on one or more light sources 410.

Figure 44:
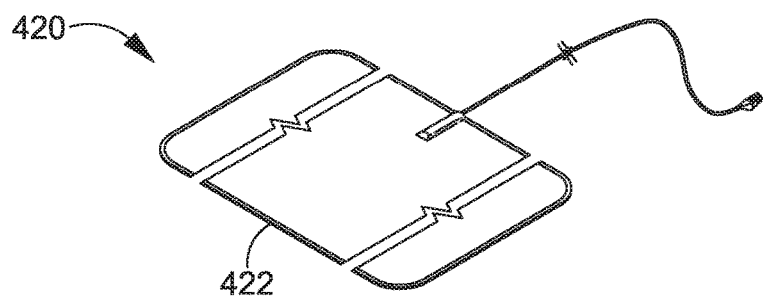
FIG. 44 is a perspective view of a capacitance detection pad, in accordance with embodiments of the invention.
Figure 45:
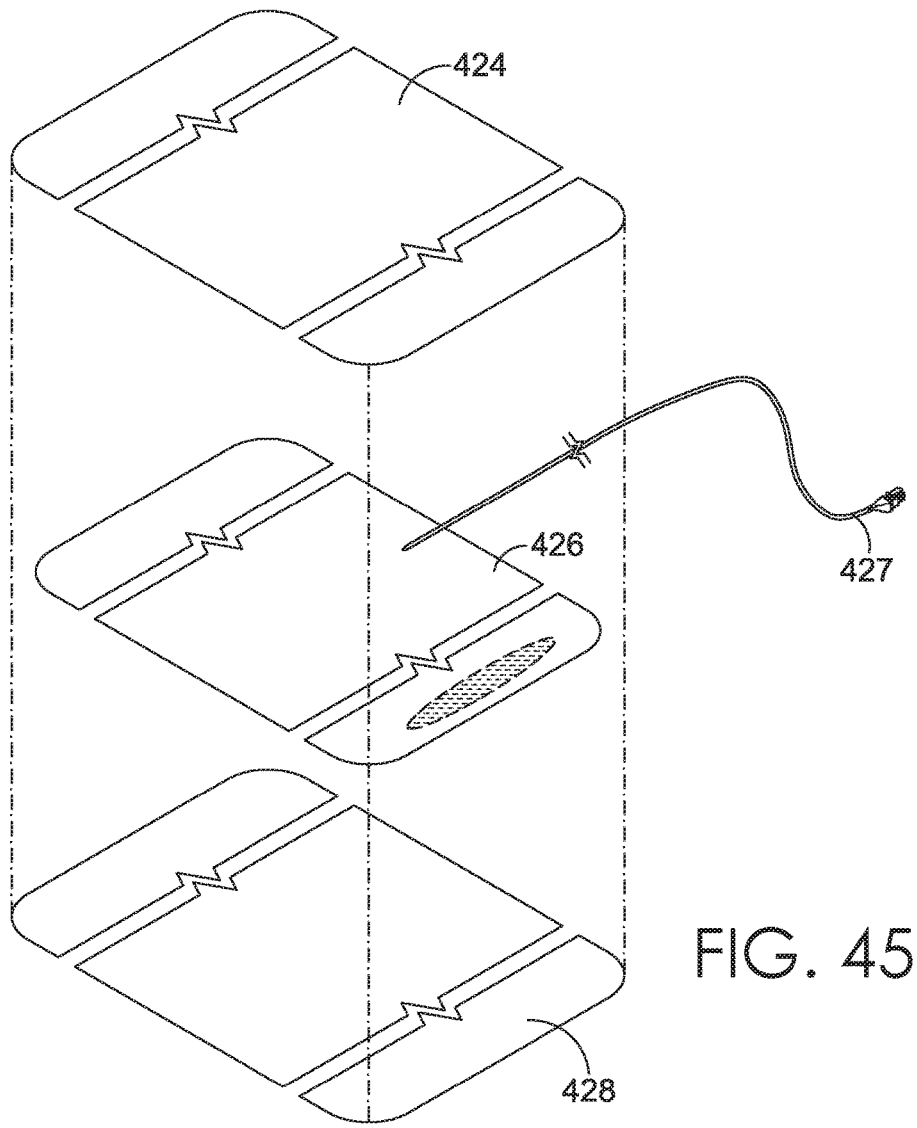
FIG. 45 is an exploded, isometric view of the capacitance detection pad of FIG. 44, in accordance with embodiments of the invention.

As shown in FIG. 44, in some embodiments, the capacitance detection sensor 420 comprises a capacitance detection pad 422 having suitable dimensions for integration with a plurality of types of furniture items, such as a particular size and/or shape. In further aspects, the capacitance detection sensor 420 includes additional or alternative detection sensor components, such as a capacitive wire, tape, and the like. In one embodiment, the capacitance detection pad 422 may be integrated into a stationary furniture item, while in other embodiments, the capacitance detection pad may be integrated into an automated furniture item. Further, as shown in FIG. 45, the capacitance detection pad 422 may include a top capacitance detection pad overlay 424, a capacitance detection pad sensor assembly 426, a pad sensor wire assembly 427, and a bottom capacitance detection pad overlay 428. The top capacitance detection pad overlay 424 and the bottom capacitance detection pad overlay 428 may be affixed to the capacitance detection pad sensor assembly 426 to form the capacitance detection pad 422. The portions of the capacitance detection pad 422 may be affixed to one another using any suitable means. In one aspect, an epoxy adhesive may be used to bond the portions of the capacitance detection pad 422 to one another. Additionally, the portions of the capacitance detection pad 422 may be dielectrically welded to one another.

Figure 46:
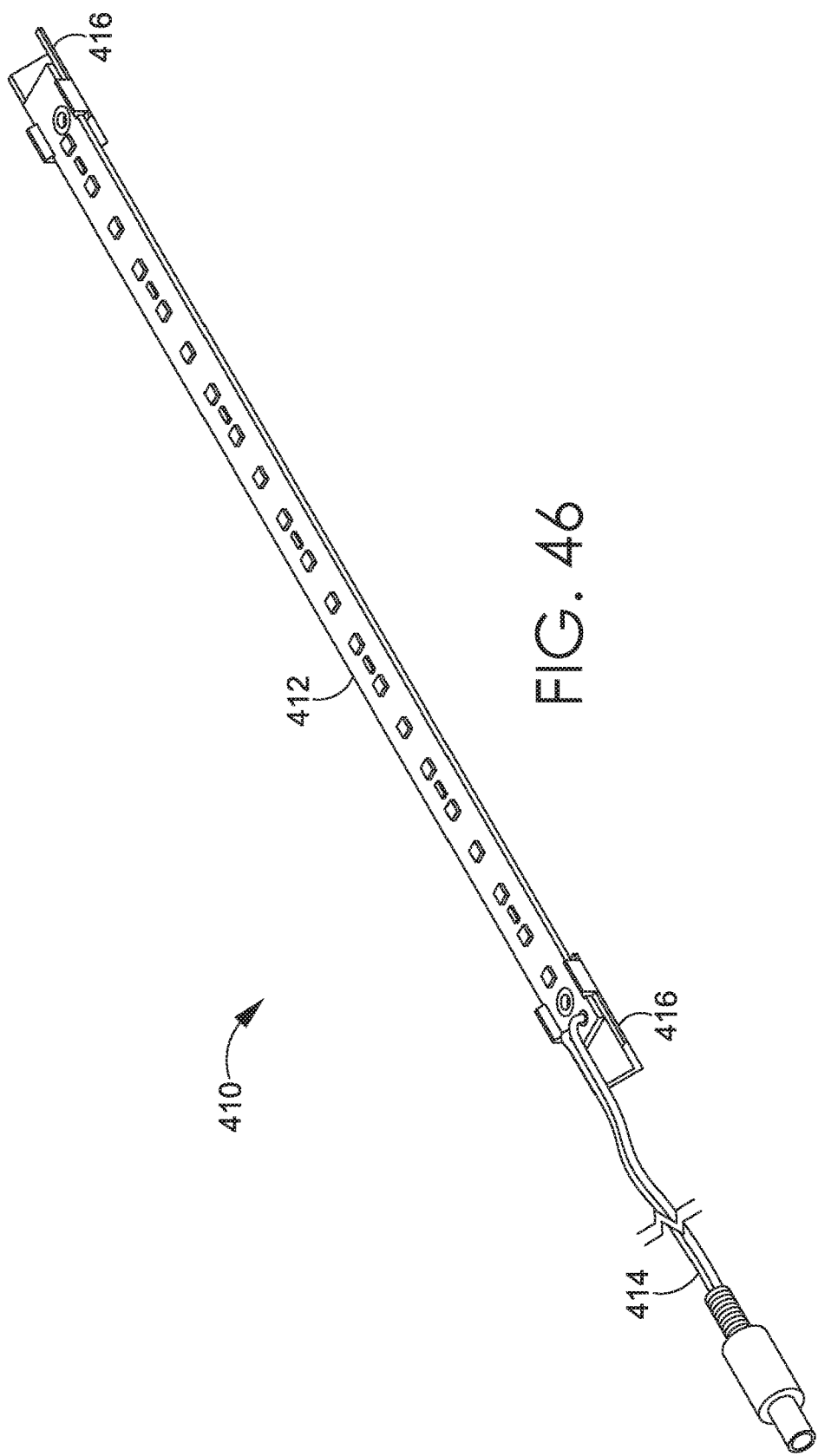
FIG. 46 is a perspective view of a Light-emitting Diode (LED) lighting strip, in accordance with embodiments of the invention.

As shown in FIG. 46, the one or more light sources 410 may comprise one or more LED lighting strips 412 having one or more mounting clips 416 and an LED wire assembly 414. While discussed here as including LED lighting features, in further embodiments of the invention, non-LED or a combination of both LED and non-LED lighting may be included in the lighting strips 412 while utilizing similar features as those discussed here. In one embodiment, the LED wire assembly 414 is generally responsible for connecting one or more components, such as coupling one or more components for receiving power from a power source and/or communicating commands from the control component 430. In one embodiment, the LED lighting strips 412 may be mountable, such that they may be mounted beneath a bed or other furniture item. In another embodiment, the one or more mounting clips 416 may be coupled to the one or more LED lighting strips 412 for securing the lighting strips 412 at a particular position with respect to a furniture item.

Figure 47:
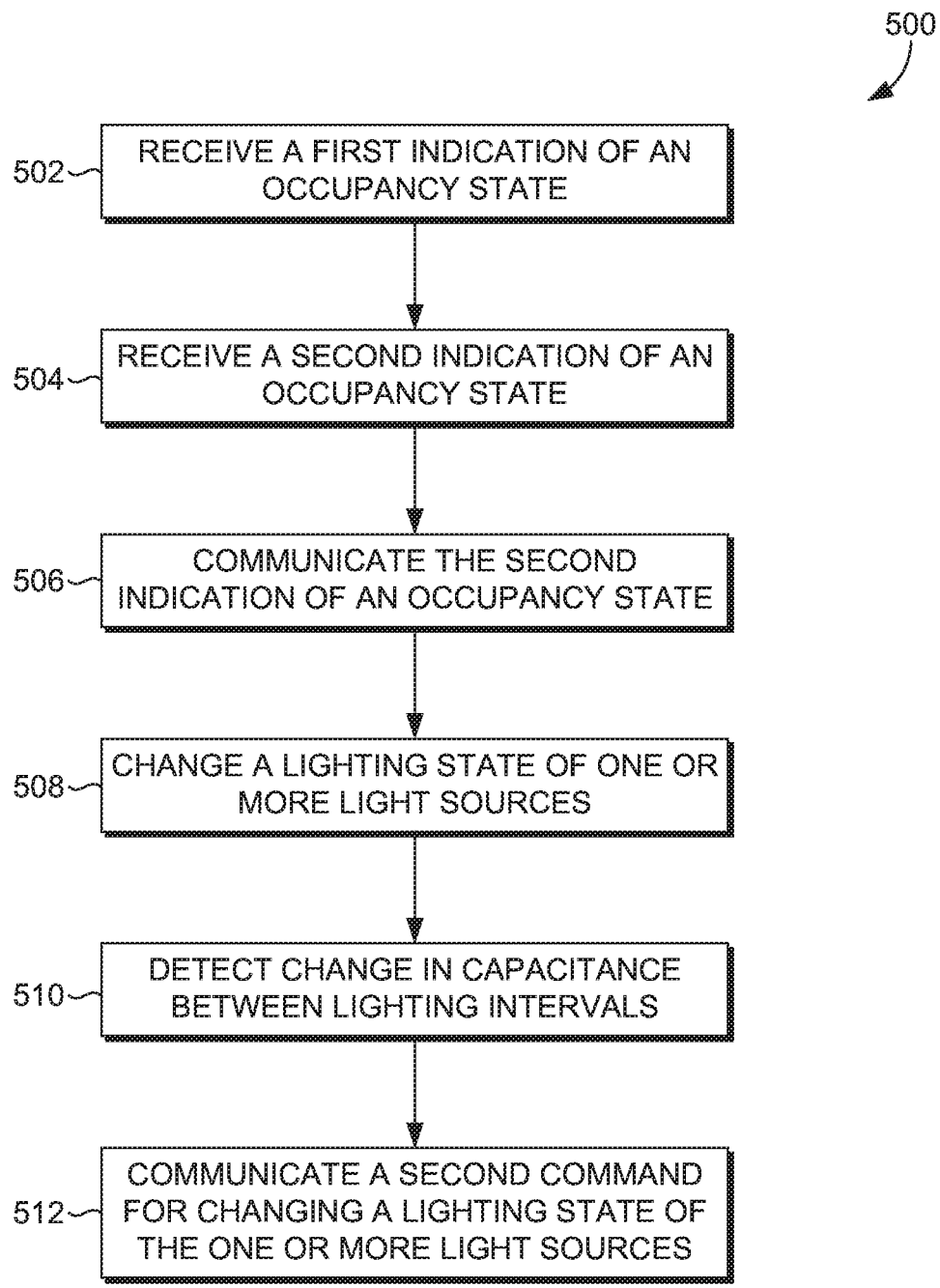
FIG. 47 is a flow diagram of an exemplary method for determining occupancy of a furniture item based on capacitive detection, in accordance with embodiments of the invention.

Turning now to the embodiment of FIG. 47, a method for determining occupancy of a furniture item based on capacitive detection 500 is illustrated. As shown at block 502, the method may include receiving, by a standalone capacitance detection device, a first indication of an occupancy state, wherein the first indication of an occupancy state corresponds to a first change in capacitance detected by the standalone capacitance detection device. The method may also comprise, as shown at block 504, receiving, by the standalone capacitance detection device, a second indication of an occupancy state, wherein the second indication of an occupancy state corresponds to a second change in capacitance detected by the standalone capacitance detection device. Further, the method may include communicating, by the standalone capacitance detection device, the second indication of an occupancy state, as shown at block 506.

In aspects herein, the first occupancy state may correspond to an occupant initially sitting or lying on a furniture item. Accordingly, the second occupancy state may correspond to an occupant getting up from the furniture item. In some aspects, the detected changes in capacitance and/or occupancy states may be communicated via a network to, for example, a universal control component (described hereinabove with reference to FIG. 43) and/or an occupancy monitoring system (described in more detail below in connection with FIG. 48). The communication may be facilitated, for example, by a control component associated with the standalone capacitance detection device. The control component may also generate commands for controlling devices (for example, one or more light sources) associated with the standalone capacitance detection device.

Accordingly, in one aspect, the method may include changing a lighting state of one or more light sources communicatively coupled with the standalone capacitance detection device from a first state to a second state based on the received second indication of an occupancy state, as shown at block 508. In a first lighting state, the standalone capacitance detection device may be in a "ready" state, continually monitoring for a detectable change in capacitance. Additionally, the second lighting state may correspond to at least one light source of the one or more light sources being on. In some aspects, the one or more light sources may be powered by PWM, such that power is intermittently provided to the one or more light sources at a plurality of on intervals (described in further detail above with reference to FIG. 42). As such, during the second lighting state, the standalone capacitance device may be in an intermittent testing state, selectively sampling for a detectable change in capacitance during the light-off phases of the PWM-powered lights.

Further, as shown at block 510 when the standalone capacitance detection device is in the second state, the method may include receiving a third indication of an occupancy state, wherein the third indication of occupancy corresponds to a third change in capacitance detected by the standalone capacitance detection device. The third occupancy state may correspond to an occupant returning from having exited a furniture item to a sitting or lying position on the furniture item. In some aspects, the third occupancy state may also correspond to an occupant returning to a lying position from a sitting position. The third change in capacitance may be measured between the plurality of on intervals at the one or more light sources, based on commands received from a control component, based on PWM features.

As can be appreciated, the first occupancy state may indicate that the furniture item is occupied. Further, the second occupancy state may indicate that an occupant is no longer occupying the furniture item. Resultantly, the one or more light sources may be triggered, or turned on, based on detection of the second occupancy state, thereby providing lighting which allows the occupant to navigate the space surrounding the furniture item. While the user is navigating the space surrounding the furniture item and the lighting features are turned on, the system may continuously monitor for a subsequent change in capacitance to indicate that the user has returned. As discussed above, such monitoring may take place between pulses of lighting, as detected during light-off phases of the PWM-cycled lighting feature. Accordingly, the third occupancy state may indicate that an occupant has returned to the furniture item and no longer needs light to navigate. Consequently, the third occupancy state may trigger a command to turn off the one or more light sources. Accordingly, the method may further include communicating a second command for changing a lighting state of the one or more light sources, as illustrated at block 512.

Figure 48:
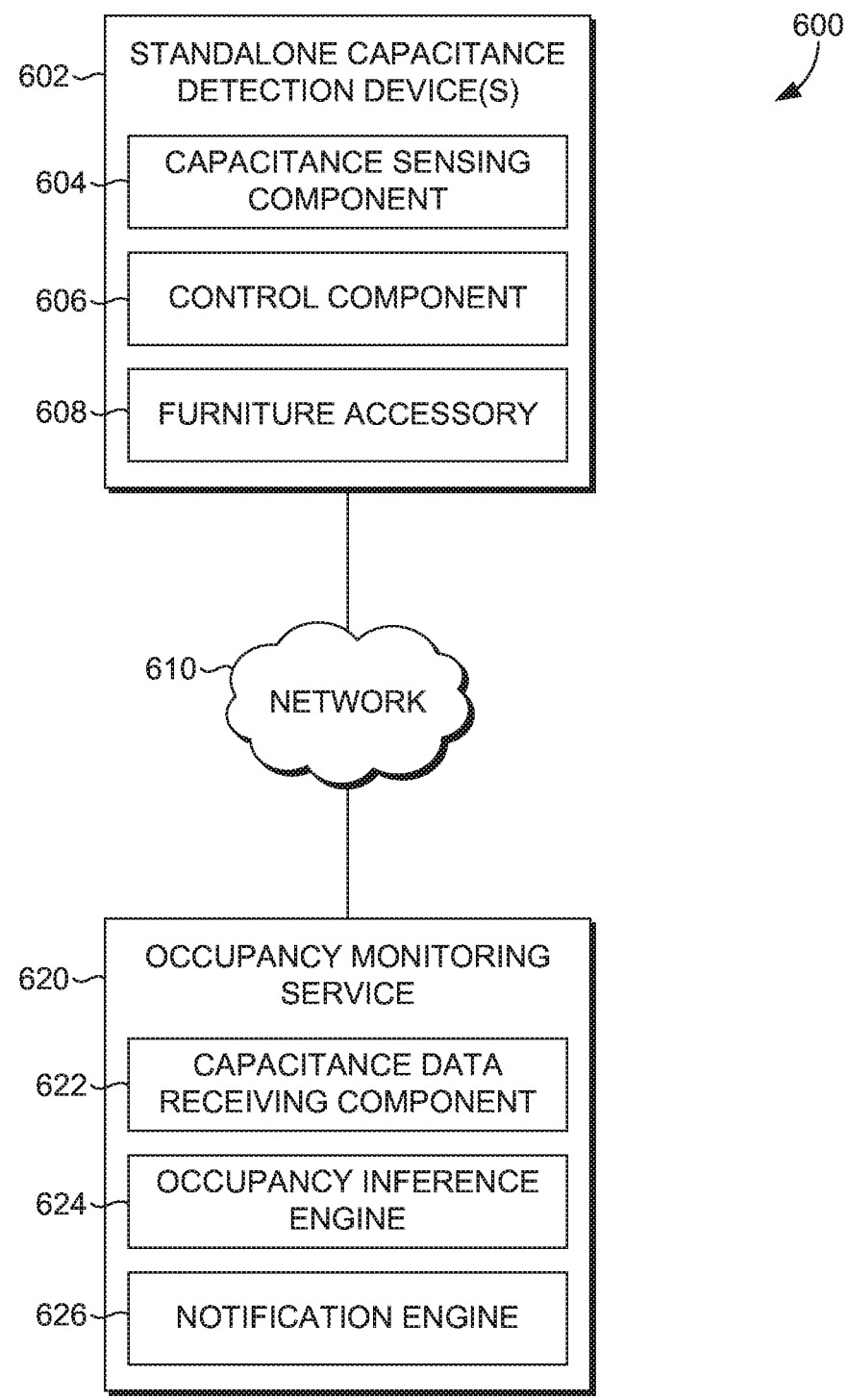
FIG. 48 is an exemplary system diagram for an occupancy monitoring system, in accordance with embodiments of the invention.

Another embodiment herein relates to an occupancy monitoring system 600 for monitoring use and/or occupancy of furniture items based on capacitance detection, as shown in FIG. 48. The system may comprise, for example, at least one standalone capacitance detection device 602 coupled to at least one furniture item, and an occupancy monitoring service 620. The system 600 may generally operate to detect frequency and/or duration of use of a furniture item in any number of settings. For example, the system 600 may be implemented by a hotel, a hospital, or an individual consumer to monitor how and when various furniture items are used.

In one aspect, the at least one standalone capacitance detection device 602 may comprise a capacitance sensing component 604 for sensing capacitance data, and a control component 606 configured to receive and communicate the capacitance data. The capacitance sensing component 604 may comprise a capacitance detection pad having a size and/or a shape suitable for integration with a plurality of types of furniture items. In some aspects, the control component 606 may be configured to receive and communicate the capacitance data wirelessly (for example, via Wi-Fi, ZigBee, Bluetooth, or any other wireless technology). Additionally, the capacitance data may be communicated via network 610 to other components and/or subcomponents of the occupancy monitoring service 620.

The occupancy monitoring service 620 may include a capacitance data receiving component 622 for receiving the capacitance data; and an occupancy inference engine 624 for determining occupancy data associated with the at least one furniture item based on the capacitance data. The occupancy data associated with the at least one furniture item may comprise, for example, a frequency of use and a duration of use. The occupancy monitoring service 620 may be configured to receive capacitance data from a plurality of standalone capacitance detection devices 602. As a result, the occupancy monitoring service 620 may monitor occupancy for any number of furniture items. For example, a hotel chain may wish to track occupancy of rooms and/or specific furniture items within the rooms across all of their hotels, or for a given hotel. Accordingly, each standalone capacitance detection device 602 may be electronically associated with a given room and or furniture item, such that data specific to the rooms and/or furniture items may be monitored. In some aspects, the standalone capacitance detection devices 602 may each include one or more lighting features that may be turned on or off in response to various detected changes in capacitance throughout the system. For example, if an occupant in a first chair exits a row of chairs, the standalone capacitance detection devices associated with the entire row of chairs may be triggered and the lighting strips associated with each device may illuminate.

In some aspects, the standalone capacitance detection device 602 may be communicatively coupled to one or more furniture accessories 608. As can be appreciated, the one or more furniture accessories 608 may be any number of types of furniture accessories. In a nonlimiting example, a furniture accessory may be a massage motor, a heating element, or an alarm. The massage motor may be configured to activate and deactivate based on detected changes in capacitance. Similarly, the heating element (or cooling element) may be configured to warm a furniture item based on detecting changes in capacitance. Additionally, the alarm may generate an alert, as an audible or communicable indication that an unexpected change in capacitance has been detected, such as when an occupant has fallen out of bed.

In another aspect, a series of coupled standalone capacitance detection devices may illuminate in response to a threshold change in capacitance detection from a single or multiple devices in the series. Additionally, an order of light-off and/or resetting commands may be time-dependent in association with each device in the series, as a result of the initial response to the threshold capacitance change. For example, in a row of coupled chairs, a user may exit one chair, thereby triggering each chair's associated lighting features to illuminate. While the exited user is not detected in their chair, based on a presence indication in the remaining chairs in the series, the lighting features associated with the neighboring chairs in the series may be turned off at a particular timepoint, such as turned off at 5 minutes after the user has exited the chair. As such, the lighting features of the standalone capacitance detection device on the chair with no user may remain illuminated while the lighting features of the occupied chairs in the series are subsequently turned off and returned to a monitoring state. Once the user returns to their chair, the additional change in capacitance may indicate to the currently lit chair that it can return to a ready and light-off status in unison with the series of surrounding chairs.

In some aspects, the system may also include a notification engine 626 configured to generate and communicate one or more notifications. The one or more notifications may be associated with a furniture item and may be generated based on a predetermined threshold change in capacitance being detected. The predetermined threshold change may correspond to a frequency of use and/or a duration of use associated with a furniture item. For example, the at least one furniture item may be a bed having a mattress. Continuing with this example, the one or more notifications may be a notification that the mattress should be flipped. Further, the notification engine 626 may be configured to generate notifications relating to room occupancy. For example, the capacitance data may indicate that a given room is occupied, when the room is supposed to be vacant, and generate a notification indicating that the room is occupied.

From the foregoing, it will be seen that this invention is one well adapted to attain all the ends and objects hereinabove set forth together with other advantages, which are obvious and which are inherent to the structure. It will be understood that certain features and subcombinations are of utility and may be employed without reference to other features and subcombinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

What is claimed:

1. A standalone capacitance detection system for integration with a furniture item, the system comprising:
   one or more light sources;
   a capacitance detection sensor; and
   a control component configured for communicative coupling to the one or more light sources and the capacitance detection sensor, wherein the control component:
      receives a first capacitance indication from the capacitance detection sensor;
      generates a first lighting command based on the first capacitance indication, wherein the first lighting command initiates a light-on state for the one or more light sources;
      controls a power supplied to the one or more light sources based on the first lighting command, wherein the power is supplied in a plurality of on intervals during the light-on state;
      coordinates with the capacitance detection sensor to detect a second capacitance indication during the light-on state, wherein the capacitance detection sensor detects capacitance between the plurality of on intervals of the supplied power;
      generates a second lighting command based on the second capacitance indication, wherein the second lighting command initiates a light-off state; and
      controls the stopping of the power supplied to the one or more light sources based on the second lighting command.

2. The system of claim 1, further comprising a manual control device for receiving a plurality of commands for controlling the one or more light sources.

3. The system of claim 1, wherein the capacitance detection sensor comprises a capacitance detection pad having a size and a shape suitable for integration with a plurality of types of furniture items.

4. The system of claim 1, wherein the control component is configured to automatically calibrate by measuring a baseline electric field and setting an occupancy threshold.

5. The system of claim 1, wherein the first capacitance indication corresponds to a capacitance measurement that indicates that occupancy has been detected and the second capacitance indication corresponds to a measurement that indicates that occupancy has not been detected.

6. The system of claim 1, further comprising a power source that provides power to the one or more light sources.

7. A method of controlling a standalone capacitance detection system associated with a furniture item, the method comprising:
   controlling power to one or more light sources communicatively coupled to a control component;
   receiving one or more capacitance indications from a capacitance detection sensor communicatively coupled to the control component;
   receiving, at a control component, a first capacitance indication from the capacitance detection sensor;
   generating, by a control component, a first lighting command based on the first capacitance indication, wherein the first lighting command initiates a light-on state;
   controlling, by a control component, the power supplied to the one or more light sources, wherein the power is supplied in a plurality of on intervals during the light-on state;

coordinating, by a control component, with the capacitance detection sensor to detect a second capacitance indication during the light-on state, wherein the capacitance detection sensor detects capacitance between the plurality of on intervals of supplied power;

generating, by a control component, a second lighting command based on the second capacitance indication, wherein the second lighting command initiates a light-off state; and controlling, by a control component, the stopping of the power supplied to the one or more light sources based on the second lighting command.

8. The method of claim 7, further comprising receiving, from a manual control device, a plurality of commands for controlling the one or more light sources.

9. The method of claim 7, wherein the capacitance detection sensor comprises a capacitance detection pad having a size and a shape suitable for integration with a plurality of types of furniture items.

10. The method of claim 7, further comprising automatically calibrating an occupancy threshold by measuring a baseline electric field.

11. The method of claim 7, wherein the first capacitance indication corresponds to a capacitance measurement that indicates that occupancy has been detected and the second capacitance indication corresponds to a measurement that indicates that occupancy has not been detected.

12. A method of manufacturing a standalone capacitance detection system, the method comprising:

communicatively coupling one or more light sources to a control component;

communicatively coupling a capacitance detection sensor to the control component;

wherein the control component communicatively coupled to the one or more light sources and the standalone capacitance detection device is configured to:

receive a first capacitance indication from the capacitance detection sensor;

generate a first lighting command based on the first capacitance indication, wherein the first lighting command initiates a light-on state for the one or more light sources;

control a power supplied to the one or more light sources based on the first lighting command, wherein the power is supplied in a plurality of on intervals during the light-on state;

coordinate with the capacitance detection sensor to detect a second capacitance indication during the light-on state, wherein the capacitance detection sensor detects capacitance between the plurality of on intervals of the supplied power;

generate a second lighting command based on the second capacitance indication, wherein the second lighting command initiates a light-off state; and control the stopping of the power supplied to the one or more light sources based on the second lighting command.

13. The method of claim 12, further comprising configuring a manual control device to receive a plurality of commands for controlling the light source.

14. The method of claim 12, wherein the capacitance detection feature comprises a capacitance sensor that integrates with a plurality of types of furniture items.

15. The method of claim 12, wherein the control component is configured to automatically calibrate an occupancy threshold by measuring a baseline electric field.

16. The method of claim 12, wherein the first capacitance data corresponds to a capacitance measurement that indicates that occupancy has been detected and the second capacitance data corresponds to a measurement that indicates that occupancy has not been detected.

17. The method of claim 12, further comprising configuring a power source to provide power to the one or more light sources.

* * * * *